United States Patent
Cook et al.

(10) Patent No.: US 8,543,055 B1
(45) Date of Patent: Sep. 24, 2013

(54) PASSIVE FREQUENCY TRANSLATION WITH VOLTAGE CONVERSION GAIN

(75) Inventors: Benjamin W. Cook, San Francisco, CA (US); Axel D. Berny, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 317 days.

(21) Appl. No.: 13/102,784

(22) Filed: May 6, 2011

Related U.S. Application Data

(60) Provisional application No. 61/332,447, filed on May 7, 2010.

(51) Int. Cl.
*H04B 7/14* (2006.01)
(52) U.S. Cl.
USPC .............................. 455/20; 455/323
(58) Field of Classification Search
USPC ................... 455/308, 355, 341, 127.3, 194.2, 455/253.2, 293, 20; 330/135, 96, 98; 327/290, 327/292, 293, 323, 343.1
See application file for complete search history.

(56) References Cited

U.S. PATENT DOCUMENTS

| | | | |
|---|---|---|---|
| 6,946,910 B2 * | 9/2005 | Chi ................................ | 330/254 |
| 7,283,840 B2 * | 10/2007 | Cho ............................ | 455/552.1 |
| 7,668,527 B2 | 2/2010 | Vaisanen | |
| 7,844,233 B2 | 11/2010 | Vaisanen | |
| 8,055,233 B2 * | 11/2011 | Hsieh et al. .................... | 455/293 |
| 8,112,059 B2 * | 2/2012 | Beffa .............................. | 455/326 |
| 2006/0128342 A1 | 6/2006 | Marholev | |
| 2008/0032646 A1 * | 2/2008 | Huang et al. ................... | 455/131 |
| 2010/0093302 A1 | 4/2010 | Abe et al. | |
| 2011/0092180 A1 | 4/2011 | Chen et al. | |

* cited by examiner

*Primary Examiner* — Sujatha Sharma

(57) ABSTRACT

A passive frequency translator with positive conversion voltage gain including at least one input node for receiving an input signal, at least one output node for providing an output signal, and a network which includes capacitors and switches operatively coupled the capacitors and the one or more input and output nodes. The switches are controlled by corresponding clock signals to capture charge of the input signal onto the capacitors and to develop the output signal by performing frequency translation of the input signal by a mixing frequency. The output signal has a net voltage gain relative to the input signal in which energy of the output signal is predominantly derived from energy of the input signal. Furthermore, each of at least three capacitors are configured to capture charge from the input signal and to add constructively to deliver charge to at least one other capacitor coupled to the output node.

29 Claims, 37 Drawing Sheets

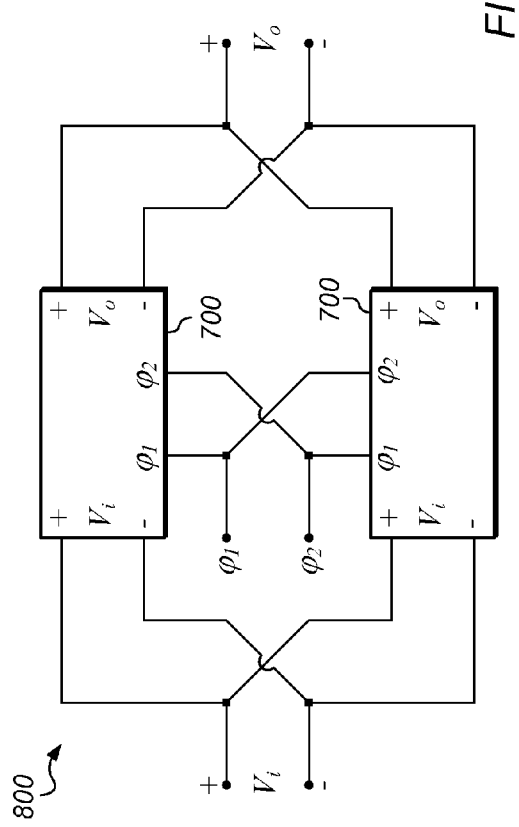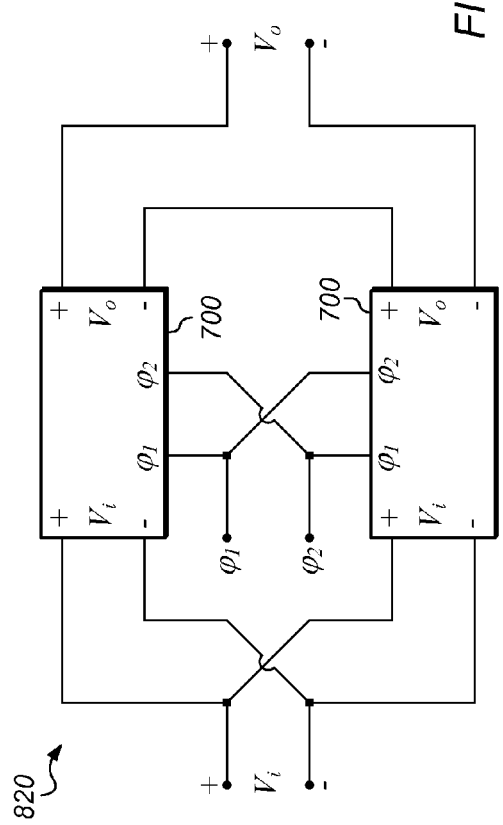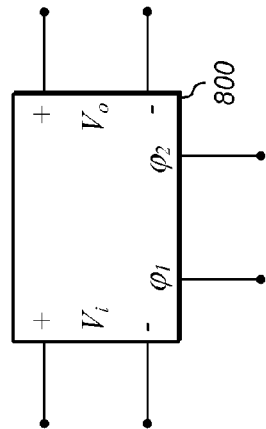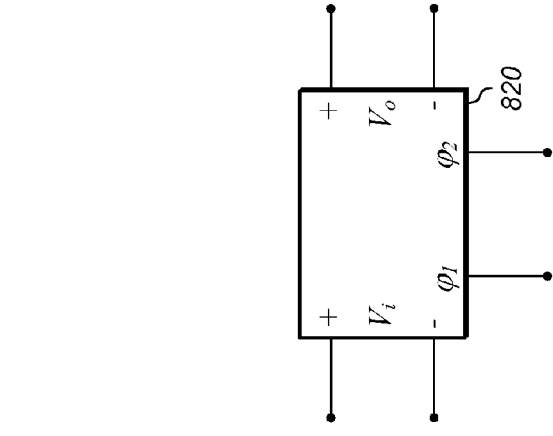
FIG. 13
FIG. 14

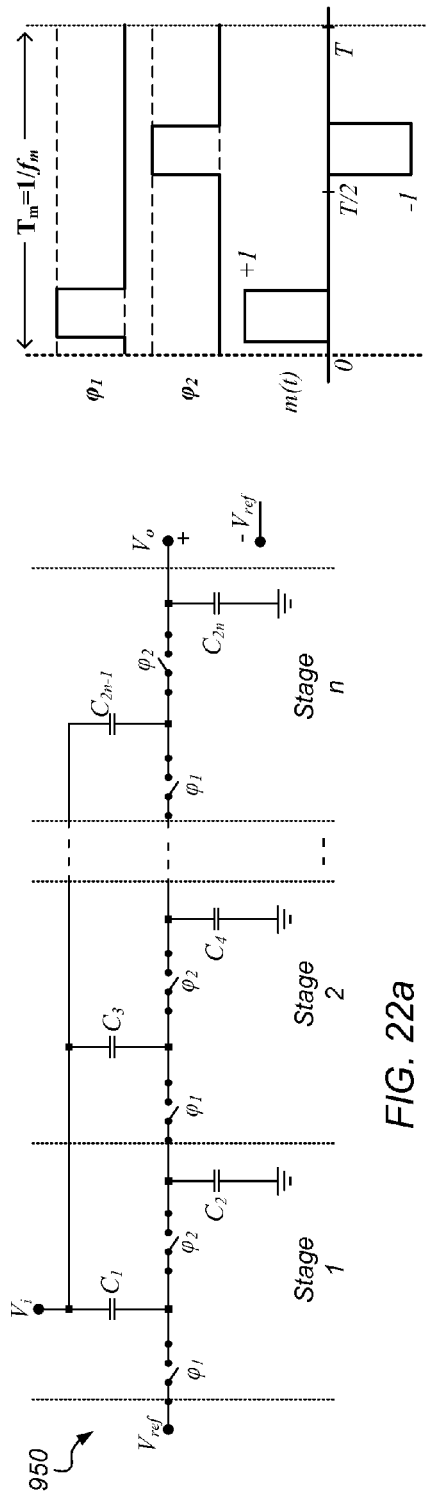
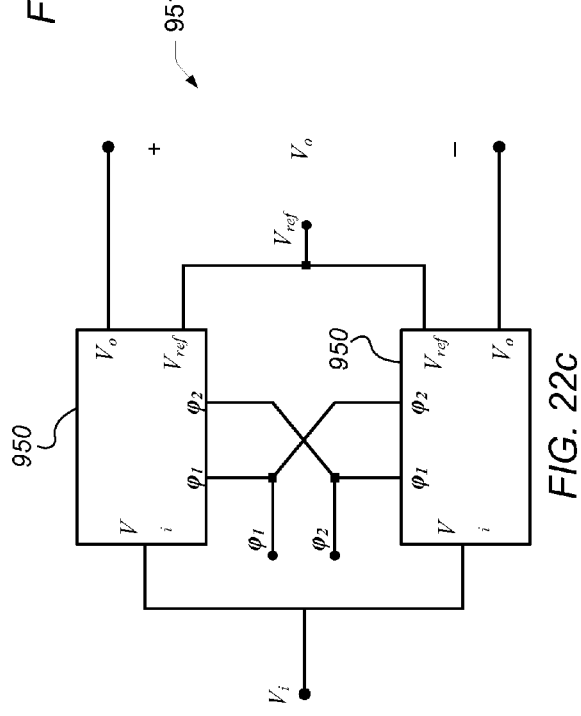
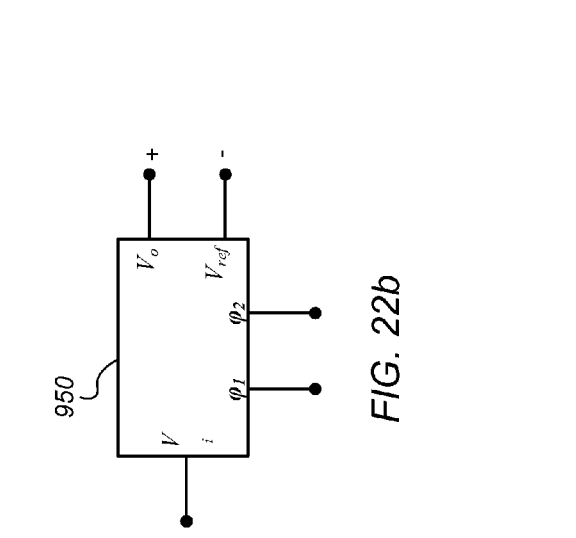
FIG. 22d
FIG. 22c
FIG. 22a
FIG. 22b

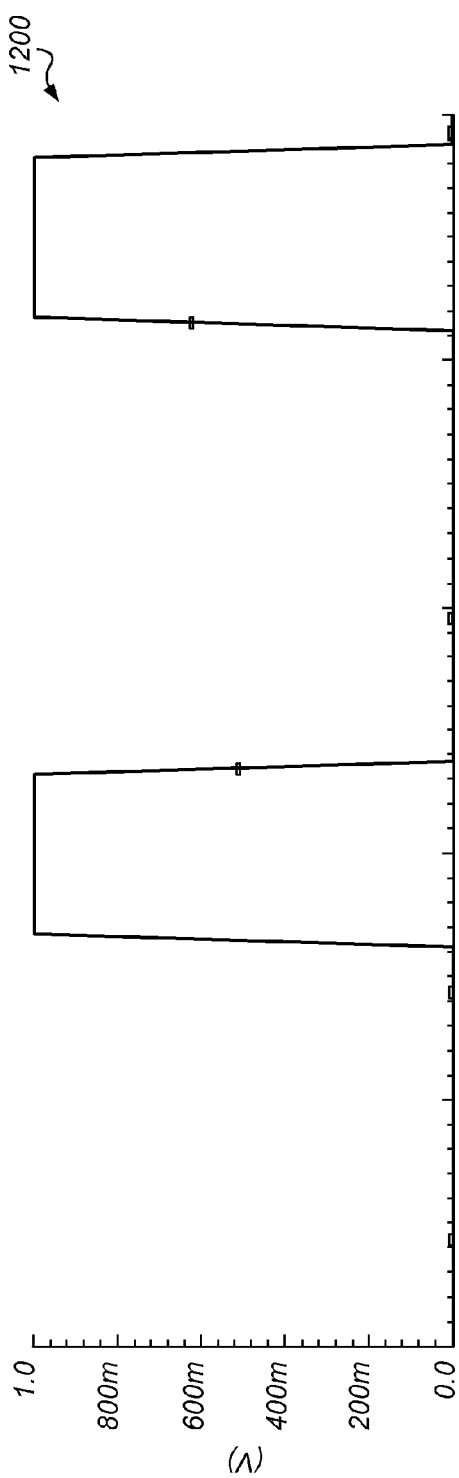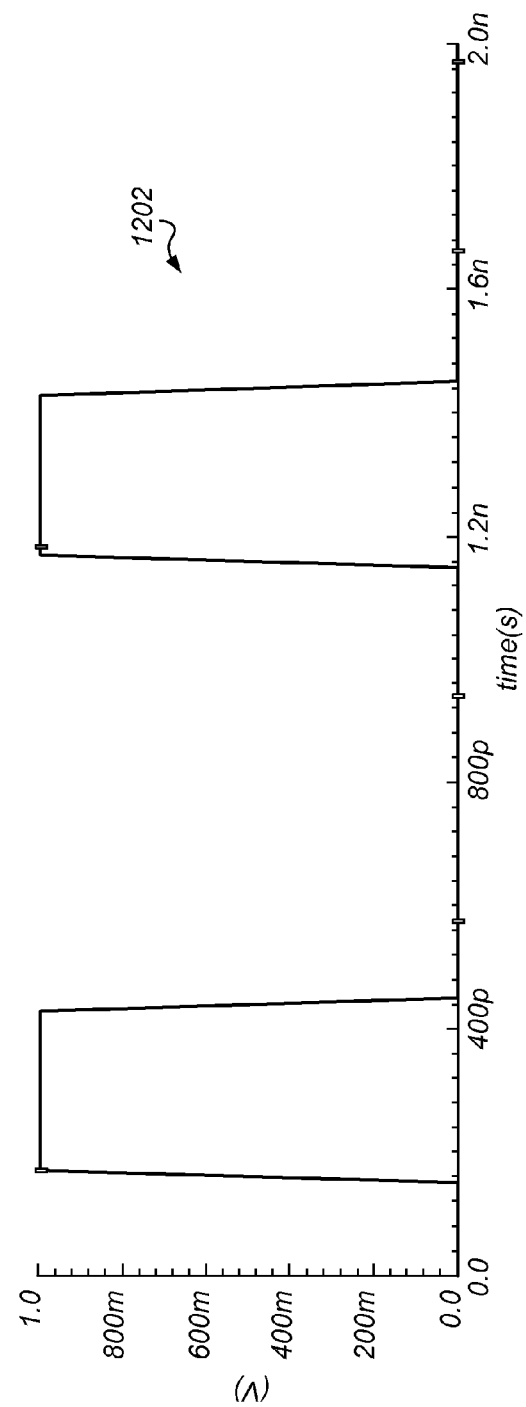
FIG. 34

PASSIVE FREQUENCY TRANSLATION WITH VOLTAGE CONVERSION GAIN

CROSS-REFERENCE TO RELATED APPLICATIONS

This application claims the benefit of U.S. Provisional Application Ser. No. 61/332,447, filed on May 7, 2010 which is hereby incorporated by reference in it entirety for all intents and purposes.

BACKGROUND OF THE INVENTION

1. Field of the Invention

The present invention relates generally to circuit design, and, more particularly, to the design of passive mixer circuits having a positive voltage gain in a multistage configuration in which each of at least three capacitors are configured to capture charge from and input signal and to add constructively to deliver charge to at least one other capacitor coupled to an output node.

2. Description of the Related Art

Typical radio frequency (RF) communications systems utilize mixers to shift, or translate, the frequency of an input signal ($f_{IN}$) by mixing it with a Local Oscillator (LO) signal of a known frequency ($f_m$). The frequency of the resulting output signal ($f_{OUT}$) is either the sum or difference of $f_{IN}$ and $f_m$ (e.g. $f_{OUT}=|f_{IN}+f_m|$ or $f_{OUT}=|f_{IN}-f_m|$), depending on whether the mixer is used for downconversion or upconversion. Mixers are typically used in both receivers and transmitters, oftentimes to perform downward frequency translation, which is commonly referred to as downconversion. Downconversion is useful in a receiver because it reduces the frequency of received signals, enabling any subsequent signal processing to be carried out at baseband or at an intermediate frequency (IF) where it is more tractable. Mixers are also used to perform upward frequency translation, commonly referred to as upconversion. Upconversion is useful in a transmitter because it enables shifting the modulated low-frequency data to higher frequencies where wireless transmission is more tractable.

Mixers can be passive and/or active mixer circuits, both types of mixer circuits being fairly common in current RF transceivers. Active type and passive type mixer circuits both come with their own advantages and disadvantages. Active mixer circuits consume DC bias current, while passive mixer circuits do not. One important advantage of active mixers, such as a Gilbert Cell, for example, is the relatively large conversion gain they typically provide, easing noise requirements and reducing the power consumption of subsequent stages. Active mixers, however, typically require substantial bias current and operating voltage headroom, and the active circuitry is also prone to generating (1/f) noise, which can be problematic in Low-IF and direct conversion receiver topologies. Furthermore, the downward scaling of voltage supplies and feature-sizes in the IC fabrication processes can exacerbate the voltage headroom and noise issues present in active mixers. Passive switching mixers, which typically use transistors configured to function as switches, can be used as an alternative to active mixers. Passive switching mixers offer inherently low power consumption because they do not consume DC bias current. Furthermore, they typically do not require voltage headroom to operate, generate significantly lower (1/f) noise than active mixers, and derive the output signal energy predominantly from the energy of the input signal. It should be noted, however, that in practice, energy from other undesired sources may also appear at the output, for example feed through from the LO signal and thermal noise. However, such undesired energy will affect most all implementations, including those featuring active mixers, thus the benefit of low power consumption when using passive mixers therefore remain substantial.

Overall, passive (switching) mixers can achieve linearity and noise performance levels comparable with those of active mixers, while consuming less power. Furthermore, the performance and power consumption of passive FET switching mixers can also improve with the scaling of field effect transistor (FET) technology (e.g. metal oxide semiconductor— MOS) fabrication processes (e.g., implemented with MOSFET devices). However, one notable disadvantage of passive mixers is their lack of conversion gain. As a matter of fact, an inherent property of passive frequency translation is actually signal power attenuation. Passive mixers can exhibit a conversion loss of 2 dB to 6 dB, which can offset the power consumption advantage of the passive mixer, as subsequent stages of a receiver (i.e. stages following the mixer) must achieve lower noise levels to maintain a given signal-to-noise ratio (SNR) with an attenuated signal level. Hence, subsequent stages typically need to consume more power to achieve a given system noise figure. It would therefore be advantageous to design mixers having the power saving advantages of passive mixers as well as the ability to achieve voltage conversion gain.

Other corresponding issues related to the prior art will become apparent to one skilled in the art after comparing such prior art with the present invention as described herein.

SUMMARY OF THE INVENTION

A passive frequency translator with positive conversion voltage gain according to one embodiment includes at least one input node for receiving an input signal, at least one output node for providing an output signal, and a network coupled to the at least one input node and to the at least one output node, in which the network includes capacitors and switches operatively coupled the capacitors. The switches are controlled by corresponding clock signals to capture charge of the input signal onto the capacitors and to develop the output signal by performing frequency translation of the input signal by a mixing frequency. The output signal has a net voltage gain relative to the input signal in which energy of the output signal is predominantly derived from energy of the input signal. Furthermore, each of at least three capacitors are configured to capture charge from the input signal and to add constructively to deliver charge to at least one other capacitor coupled to the output node.

A method of performing passive frequency translation according to one embodiment includes receiving an input signal, providing multiple switches operatively coupled to multiple capacitors, controlling the switches by corresponding clock signals to capture charge of the input signal onto the capacitors and to develop the output signal with a net voltage gain relative to the input signal including performing frequency translation of the input signal by a mixing frequency, and capturing charge from the input signal onto each of at least three of capacitors in which charge on each of the at least three capacitors add constructively to deliver charge to at least one other capacitor coupled to the output node.

A method of downconverting an input signal having a first frequency to an output signal having a lower second frequency according to one embodiment includes periodically charging multiple capacitors with respective charges derived from the input signal, periodically updating the respective charge held by each of the capacitors by combining with the respective charge held by at least one other one of the capacitors, periodically combining the updated charges held by one or more of the capacitors to provide an output signal having a net voltage gain relative to the input signal and having an energy which is derived predominantly from energy of the input signal, capturing charge from the input signal onto at each of least three of the capacitors in which charge on each of the at least three of the capacitors add constructively to deliver charge to at least one other capacitor coupled to the output node, and performing frequency translation of the input signal by a mixing frequency.

An electronic device according to one embodiment includes a radio system and a host system. The radio system includes an input circuit, an output circuit and a passive frequency translator with positive conversion voltage gain as described herein. The passive frequency translator performs frequency translation of an input signal by a mixing frequency in which each of at least three of the capacitors are configured to capture charge from the input signal and to add constructively to deliver charge to at least one other capacitor coupled to the output node.

BRIEF DESCRIPTION OF THE DRAWINGS

The foregoing, as well as other objects, features, and advantages of this invention may be more completely understood by reference to the following detailed description when read together with the accompanying drawings in which:

FIG. 8b shows examples of LO signal waveforms and an approximated version of the waveform of the effective resultant mixing function, associated with the embodiment shown in FIG. 8a;

FIG. 13 shows block diagrams of one embodiment of a fully symmetric n-stage PFTWG with DC balanced mixing function, constructed using the circuit shown in FIG. 10 and having a differential input/output configuration with parallel output connection;

FIG. 14 shows block diagrams of one embodiment of a fully symmetric n-stage PFTWG with DC balanced mixing function, constructed using the circuit shown in FIG. 10 and having a differential input/output configuration with series output connection;

FIG. 22a shows the circuit diagram of one embodiment of an n-stage zigzag PFTWG having a single-ended input;

FIG. 22b shows the block diagram of one embodiment using the circuit from FIG. 22a, with the output taken relative to a reference voltage;

FIG. 22c shows the block diagram of one embodiment using the circuit from FIG. 22a, with a differential output;

FIG. 22d shows examples of the sampling waveforms and an approximated version of the effective resultant mixing function associated with the circuits shown in FIGS. 22a-22c;

FIG. 26b shows examples of the sampling waveforms and simplified versions of the waveforms of the effective resultant mixing functions associated with the circuit from FIG. 26a;

FIG. 30b shows the sampling waveforms used for performing simulations on the circuit from FIG. 30a;

FIG. 34 shows transient periodic voltage waveforms of phase1 and phase2 clock signals used for operating one embodiment of the switching circuit shown in FIG. 14 configured using NMOS transistors for the switches;

Figure 1:
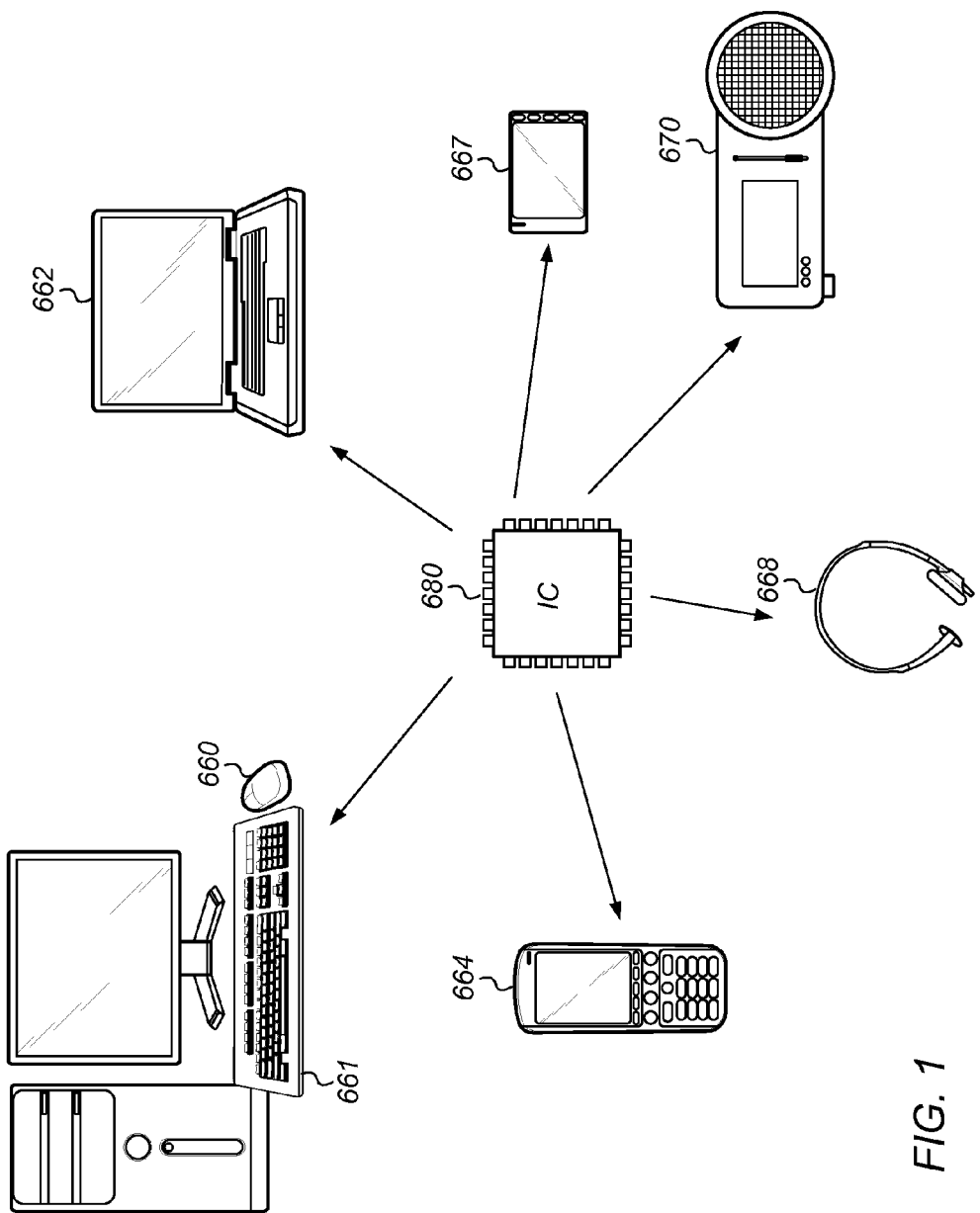
FIG. 1 shows exemplary devices that can incorporate a passive frequency translator with positive conversion voltage gain (PFTWG)

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected."

DETAILED DESCRIPTION

Various embodiments of passive frequency translation (PFT) circuits may present an improvement over basic voltage-mode passive mixer circuits by maintaining the advantages of basic voltage-mode passive mixers, while also effectively circumventing the conversion loss characteristic of basic passive mixers by providing substantial voltage conversion gain. Embodiments of such improved passive frequency translation circuits disclosed herein are referred to as Passive Frequency Translators with (positive conversion voltage) Gain, or PFTWGs for short. In various embodiments of PFTWGs, the voltage conversion gain may also be variable and/or programmable. Despite the negative power gain inherent in voltage-mode and current-mode passive frequency translation, voltage gain may actually be achieved by increasing the output impedance of the mixer circuit (e.g. through upward impedance transformation), which may not be problematic for low-IF (low intermediate frequency) or direct conversion receivers configured on integrated circuits (IC), where a relatively high mixer or frequency translator output impedance is typically acceptable. Further information of certain concepts and various equations listed herein are provided in US. Patent Application entitled "Passive Wireless Receiver", Publication No. 2010/0144305, filed Dec. 5, 2008, which is incorporated herein by reference in its entirety.

One major advantage of passive switching mixers is their capacity for achieving linearity and noise performance levels comparable with those of active mixers, while consuming less power than active mixers. Various embodiments disclosed herein incorporate a passive frequency translation technique that maintains the advantages of conventional passive switching mixers, while effectively alleviating the problem of conversion power loss by providing substantial passive voltage gain, which, in certain embodiments, may even be programmable. The voltage gain may result in increased output impedance. Thus, while power loss may be unavoidable when using passive switching mixers, due to energy conservation, voltage gain may indeed be achieved by means of upward impedance transformation. In some embodiments such as those integrated in semiconductor technologies, the effect of varying impedances along the signal path may be well controlled and may not adversely affect important system metrics of interest.

Various embodiments of the passive frequency translator circuits with positive conversion voltage gain (PFTWG) disclosed herein may be configured in the front-end RF receiver(s) of any system featuring a front-end RF receiver(s). For example, some embodiments may be integrated into RF transceivers (transmitter/receiver) and transceiver ICs for communications systems or receivers, and receiver ICs in devices such as global positioning system (GPS) devices. These and other embodiments may be integrated into wireless headsets, wireless headphones, wireless "smart cards", including credit, debit, membership and promotion cards, wireless sensors like motion detectors, security cameras, pressure gauges, light meters, and thermometers, and/or human interface devices such as video game controllers, computer mice or computer keyboards. They may also be integrated into cell-phones, either for wireless personal area networks (WPAN) and/or wireless local area networks (WLAN/WiFi), or as a primary voice and/or data transceivers using cellular voice and/or data networks and protocols like GPS, GPRS (general packet radio service), EDGE (enhanced data rates for GSM evolution, global system for mobile communications), 1xEV-DO (evolution-data optimized), WCDMA (wide-band code division multiple access), HSDPA (high-speed downlink passive access), HSUPA (high-speed uplink packet access), WiMAX/802.16e/802.16m (worldwide interoperability for microwave access), or 3GPP-LTE ($3^{rd}$ generation partnership project).

During operation, a PFTWG may receive an RF input signal having a first frequency (f1). The PFTWG may sample the voltage of the RF input signal at a sampling frequency (f0), which may be determined by a local oscillator (LO). In some embodiments, sampling performed by the PFTWG is facilitated by driving the PFTWG with multiple preferably non-overlapping switching signals (or clock signals) having a specific duty cycle and occurring at different times. The switching (clock) signals may be generated by a clock signal generator (CSG) circuit driven at a desired frequency by a local oscillator signal. The CSG-generated signals may periodically activate one or more switches within the PFTWG to couple the RF input signal to one or more capacitors, to periodically provide a portion of the RF input signal to each capacitor. The charge provided to each capacitor may be periodically held or combined with the respective charges held by one or more other capacitors, to effectively store voltage samples on the capacitors. The voltage samples stored on the capacitors may then be used to construct an output signal having a second frequency (f2) different than the local oscillator frequency and the RF input signal frequency. Various embodiments of PFTWGs disclosed herein may perform full rate sampling or sub sampling. For example, in some embodiments, the absolute value of the frequency of the generated output signal may be the absolute value of the difference between the frequency of the local oscillator and the frequency of the RF input signal. In other embodiments, the absolute value of the frequency of the generated output signal may be the absolute value of the difference between the frequency of the RF input signal and a multiple of the frequency of the local oscillator.

The output signal obtained by combining charge or transferring charge between the storage capacitors may exhibit a positive net voltage gain (in dB) relative to the RF input signal, while the energy of the output signal is derived primarily from the energy of the input signal. As used herein, a net positive voltage gain (in dB) produced in a system refers to the voltage amplitude of any single ended output signal—that is, the voltage amplitude of a signal at any one output terminal of the system—being greater than the voltage amplitude of any single ended input signal—that is, the voltage amplitude of a signal at any one of the system's input terminals. A bandpass filter may also be coupled to the input of the PFTWG to improve performance. Some embodiments may incorporate two PFTWGs, a first PFTWG operated as In-phase mixer, and a second PFTWG operated as Quadrature (I&Q) mixer, with both PFTWGs driven from a single RF input source.

In a first set of embodiments, a first type of dedicated frequency translator circuit is constructed from transistor/capacitor circuits that may be used in charge pumps. The component transistor/capacitor circuits may individually produce an output signal having the same frequency as the input signal. The first type of dedicated frequency translator receives an RF input signal and input clock signals. The fundamental mixing frequency $f_m$ of the first type frequency translator may be determined by the respective frequency of the input clock signals (mixing frequency). The output signal (which may be a baseband signal) produced by the first type translator circuit may have a frequency that is the difference of an integer multiple of the mixing frequency and the RF signal frequency, or it may have a frequency that is the difference of the mixing frequency and the RF signal frequency. The basic operation of the first type frequency translator circuit may include sampling the same input signal on two different phases of the input clock, with one sub-circuit having positive gain to the output, and the other sub-circuit having a negative gain to the output.

In a second set of embodiments, a second type of dedicated frequency translator circuit is constructed from switches and capacitors, and may be operated using multi-phase sequential switching. The input signal may undergo only a single sampling operation from input to output. The second type translation circuit is structured with a fixed stack of capacitors arranged to sum at the output the voltage samples collected on each individual capacitor, to produce the output signal. The RF input signal may be sampled onto just one of the capacitors on every one-half (½) cycle of the local oscillator (LO). The number of sampling phases delivered from the LO circuitry is equal to the total number of capacitors (n), and each sample may be stored and held on a capacitor for (n−1) ½ cycle of the LO before its voltage gets refreshed. The polarity of the RF input may be flipped every ½ cycle of the LO in order to implement a DC balanced mixing function. The second type translation circuit provides a voltage gain between output and input, based on the duty-cycle of the sampling clock signals and the number of capacitors.

In a third set of embodiments, a third type of dedicated frequency translator is constructed from switches and capacitors, and may be operated using multi-phase sequential switching and a reduced output refresh rate. The input voltage (of the input RF signal) may be captured at twice the rate of a local oscillator (LO) frequency (i.e. $2*f_m$), while the output voltage is refreshed at a frequency n times lower than twice the LO frequency (i.e. $2f_m/n$). The total number of capacitors in the circuit may be either 2n+2 for producing a serial output, or 2n+1 for a producing parallel output. The third type frequency translator circuit features 2n sampling phases and 2 evaluate phases, each having a fundamental frequency of $f_m/n$. The capacitors may include a group of sampling capacitors and a holding capacitor. At the end of the n-th switching phase, the sampling capacitors may be switchably coupled to the holding capacitor in an anti-series configuration (that is, when the sampling capacitors and the holding capacitor are polar capacitors, the respective terminals of like polarity of the sampling capacitors are switchably coupled to each other) to obtain the output voltage. As a result of the anti-series coupling, the frequency translation may be performed with a DC balanced mixing configuration. The output refresh rate may be reduced to $2f_m/n$ and $f_m/n$, respectively, by combining the last n or 2n captured input samples prior to refreshing the output voltage.

In a fourth set of embodiments, another type of dedicated frequency translator, referred to as a "zigzag" mixer, is constructed from switches and capacitors, implemented using n stages, having either a single-ended input or differential inputs. The circuit with a single-ended input may have either a single-ended output or differential outputs. The single-ended input/output circuit may include 2n switches and 2n capacitors, while the single-ended input/differential output circuit may include 4n switches and 4n capacitors. Both circuits may operate with a 2-phase input clock. The maximum voltage gain of the circuit is 2n for the single-ended input/output circuit and 4n for the single-ended input/differential output circuit. A DC bias reference may be provided as a reference potential for the output voltage signal $V_o$. One distinguishing feature of this circuit is the input voltage connecting into the mixer through the capacitors and not through the switches, resulting in the DC level of the input voltage (of the input RF signal) and the DC level of the generated output voltage remaining independent of each other, allowing for DC biasing flexibility. In addition, since each even numbered node carries a baseband signal with substantially zero RF content, the effective voltage gain can be varied. In one set of embodiments, the effective voltage gain may be varied by using an analog multiplexer to select the node with the appropriate signal amplitude. For example, a multi-bit digital control signal may be used to select the desired node within the mixer circuit.

The same circuit described above may also be configured with a differential input, which may achieve slightly different voltage gain for a given number of stages. The primary difference in circuit topology may be implemented in the output stage, where, in order to extract a baseband signal with substantially zero RF content, the output capacitor may be referenced to a non-RF node, such as ground, or driven differentially. This circuit may be referred to as fully differential zigzag mixer circuit. Each numbered stage may contribute a gain of up to 2 V/V, while the output stage may add a gain up to 1 V/V, resulting in a fully differential circuit that can achieve a maximum voltage gain of 2n+1. Versions of a fully differential zigzag circuit that implement an unbalanced mixing function may be modified to implement a balanced mixing function by balancing the circuit dynamically with respect to the switching phases, and making it asymmetric statically with respect to the input terminals. The parasitics associated with the switches and capacitors may cause the balanced fully differential zigzag circuit to present an unbalanced load to the RF input. The two balanced, fully differential zigzag circuits may be arranged to present a quasi-symmetric load to the input by driving the two balanced, fully differential zigzag circuits from a single RF input in order to generate both, in-phase and Quadrature (I&Q) baseband output signals. Such a circuit may be symmetric in a dynamic sense, providing a balanced mixing function, but it may still be slightly asymmetric statically. A truly symmetric implementation may be constructed using two fully differential zigzag circuits with complementary local oscillator (LO) drives. The two complementary-clocked instances of the fully differential zigzag circuits have their inputs connected in parallel, while the outputs may be connected in parallel or in series.

Programmable gain and a distributed LO drive may also be implemented in the various embodiments that use the fully differential zigzag circuits. In one embodiment of such a circuit, the switching signal may be gated (for example by using an AND gate) into the respective control terminal of the switching transistors to effect switching only in the desired switches to adjust the overall output gain. The actual gain achieved in each setting may depend upon the duty cycle of the switching signal waveforms, among other factors. A digital input may be used to select the desired gain setting, using logic gates to decode the gain setting input and enable the appropriate portions of the circuit. The output capacitor may be varied in accordance with the selected gain input value in order to equalize the bandwidth of the circuit with respect to gain settings.

In a fifth set of embodiments, a dedicated frequency translator circuit may be constructed from switches and capacitors using n stages and having differential inputs and outputs. The circuit may comprise 2n+2 switches and 2n+1 capacitors, and may achieve a maximum voltage gain approaching 2n+1 for small values of D (where D is the duty-cycle of the switching signal). The topology of each stage of the circuit may include a pair of switches. A respective capacitor may be cross-coupled between each respective pair of switches, more specifically between a respective input terminal of a first switch of the pair of switches and a respective output terminal of the second switch of the pair of switches. Some embodiments of this circuit may not be fully symmetric with respect to the two sampling phases. For a symmetric implementation, a compound circuit may be constructed using two instances of the circuit respectively driven with complementary LO drives, with the two complementary-clocked instances of the circuit having inputs connected in parallel, and outputs connected in parallel or in series. With a parallel output connection, the maximum conversion gain of this complementary-clocked circuit is equivalent to the gain of the asymmetric version of the circuit. However, with a series output connection, the gain of the complementary-clocked circuit may increase by a factor of two.

FIG. 1 shows a diagram illustrating various electronic devices that may incorporate embodiments of a PFTWG. In general, PFTWGs may be configured in mixers included in the front-end RF receiver(s) of any system or device that features a front-end RF receiver(s). For example, certain embodiments of PFTWGs may be integrated into a transceiver IC or receiver IC (illustrated as IC 680), which may then be incorporated into RF transceivers (transmitter/receiver) and/or receivers in devices such as global positioning system (GPS) 667, wireless headsets/headphones 668, and/or human interface devices such as a wireless computer mouse 660 and/or a wireless computer keyboard 661. They may also be integrated into a cell-phone 664, either as an auxiliary wireless connection for wide personal area networks (WPAN) and/or wide local area networks (WLAN), or as a cellular voice/data transceiver. IC 680 may also be incorporated into RF receivers that may be included in radios 670, and may further be incorporated into other types of RF transceivers (e.g. Bluetooth) in devices such as notebook computers 662. Furthermore, embodiments of PFTWGs may be directly incorporated into the devices shown in FIG. 1, that is, integrated and/or included on custom ICs and/or boards configured in the front-end RF receiver of any of those devices.

Figure 2A:
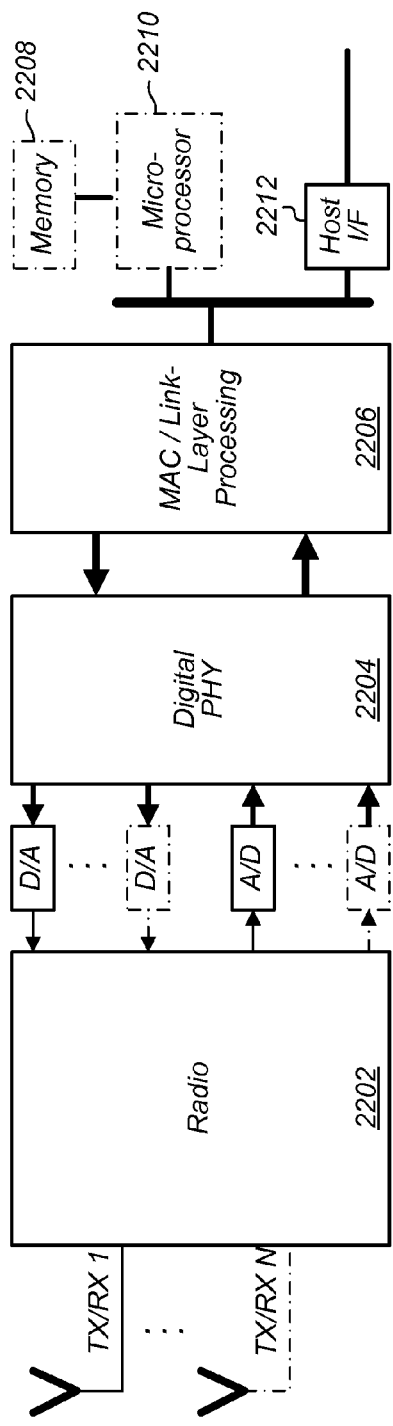
FIG. 2a shows the block diagram of an exemplary transceiver having shared transmit/receive ports, the transceiver also including a radio element that can incorporate a passive frequency translator with positive conversion voltage gain (PFTWG)
Figure 2B:
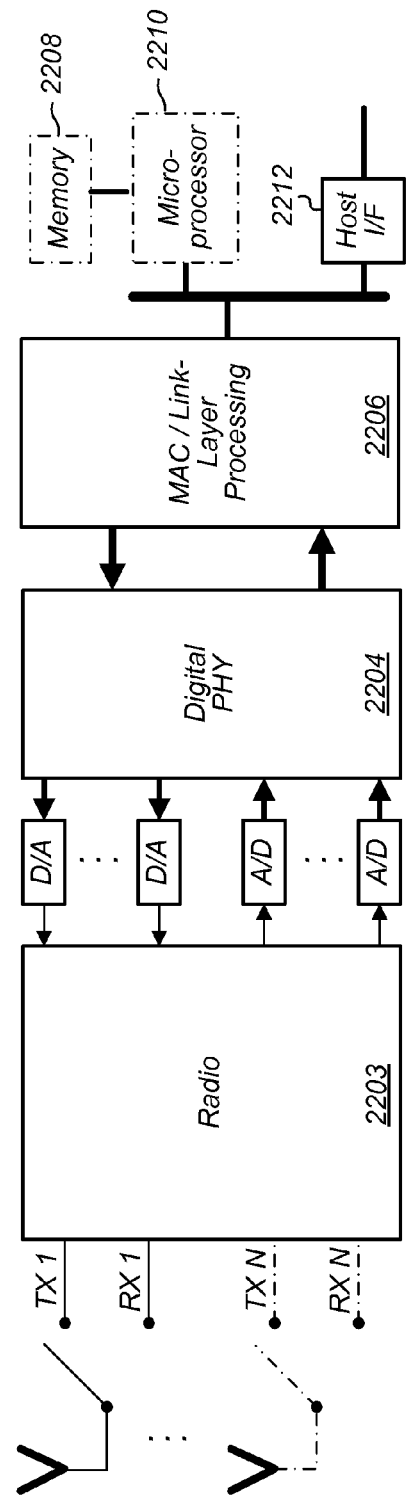
FIG. 2b shows the block diagram of an exemplary transceiver with separate transmit and receive ports, the transceiver also including a radio element that can incorporate a PFTWG.

FIG. 2a shows the block diagram of an exemplary transceiver, which may be incorporated into many of the devices discussed above with regards to FIG. 1. The transceiver shown in FIG. 2a has shared transmit/receive ports, and also includes a radio element that may incorporate a PFTWG. Radio element 2202 may be configured with any number of transmit/receive ports (TX/RX1 through TX/RX N), to transmit/receive RF signals. Analog-to-digital and digital-to-analog conversion may be performed to interface with the digital physical layer 2204, which may itself interface with the media access module and link layer processing block 2206. Data resulting from the MAC/link layer processing may be carried over a local bus or buses to a host system, including but not limited to a microprocessor 2210, memory 2208, and host interface 2212. FIG. 2b shows the block diagram of another embodiment of a transceiver that may be incorporated into many of the devices discussed above with regards to FIG. 1. The transceiver in FIG. 2b has separate transmit and receive ports, and also includes a radio element 2203 that may incorporate a PFTWG. Functionality of the transceiver of FIG. 2b may be very similar to the functionality of the transceiver presented in FIG. 2a, with essentially the same functional elements.

Figure 2C:
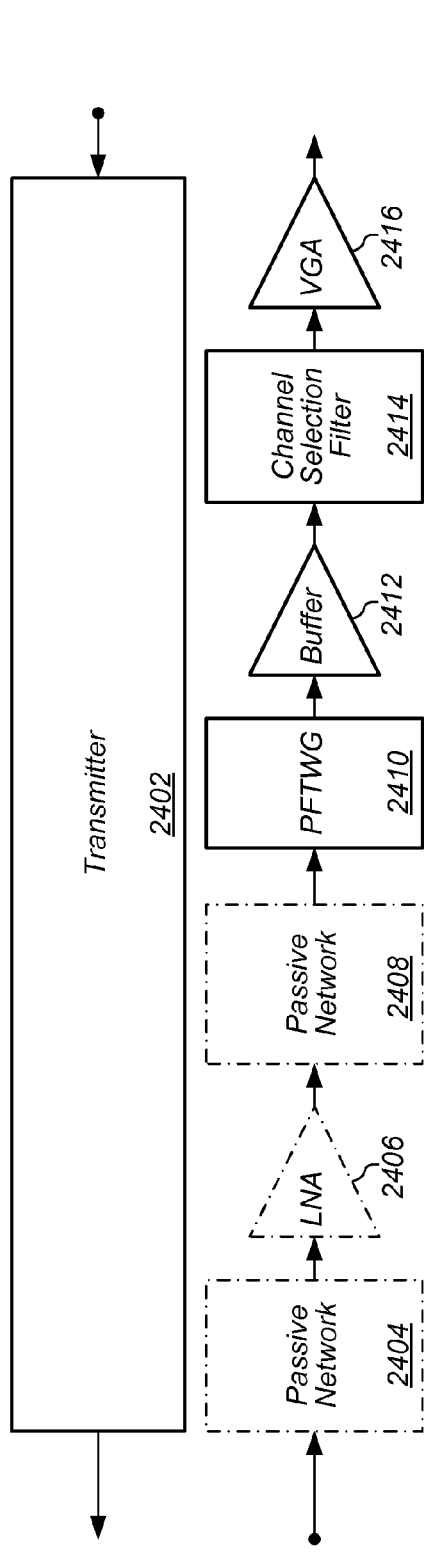
FIG. 2c shows the block diagram of an exemplary implementation of the radio element from FIGS. 2a and 2b, showing in more detail a receiver component incorporating a PFTWG.

FIG. 2c shows the block diagram of an exemplary implementation of the radio elements from FIGS. 2a and 2b. More specifically, FIG. 2c provides a more detailed block diagram of a receiver component incorporating a PFTWG 2410. As seen in FIG. 2c, transmitter path 2402 is not shown in detail, only the receive path in which PFTWG 2410 is configured. Signals arriving into the receiver go through a passive filter network 2404 before being amplified by low noise amplifier 2406. The amplified signal then passes through another passive filter network 2408, before being provided to PFTWG 2140, where the signals may be downconverted/mixed to obtain an LF signal (which may be a baseband signal in certain embodiments) provided to buffer 2412. The buffered signal then undergoes channel selection filtering in filter 2414, before being amplified by variable gain amplifier 2416. Note that 2404, 2406, and 2408 in FIG. 2c are shown with dotted outline because their inclusion in the exemplary implementation is optional.

Figure 2D:
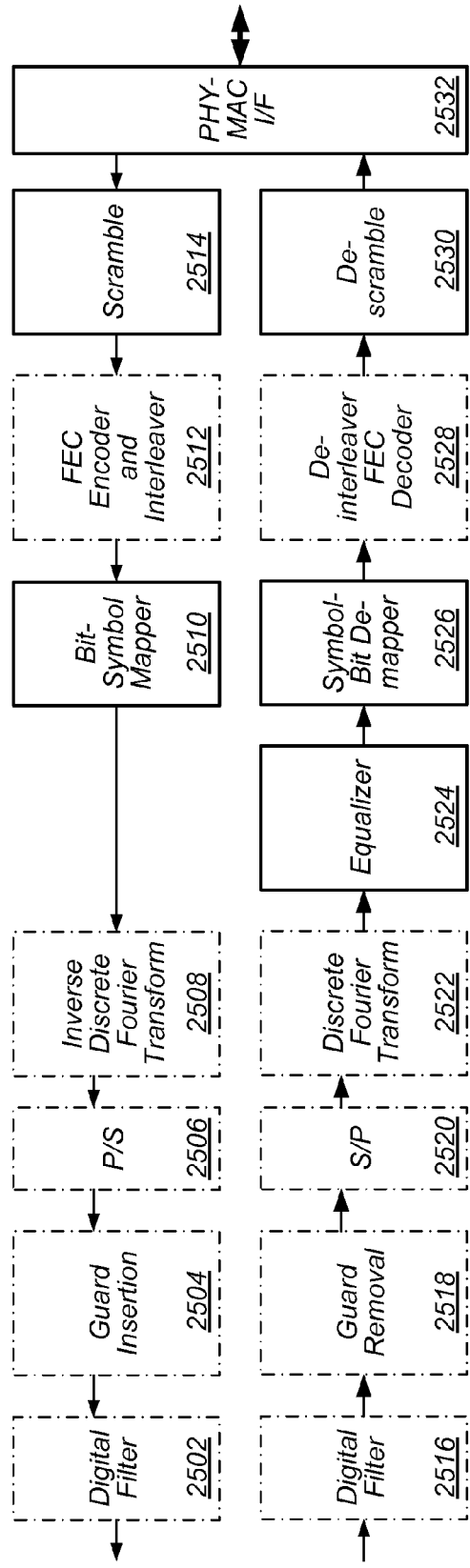
FIG. 2d shows a diagram illustrating the baseband transmitter/receiver data flow for the operation of a transceiver incorporating a PFTWG, according to one embodiment.

FIG. 2d shows a process flow diagram illustrating the baseband transmitter/receiver data flow for the operation of a transceiver incorporating a PFTWG, for example the transceiver path shown in FIG. 2c. The upper path illustrates the transmission flow, while the lower path illustrates the reception flow. Incoming data is filtered through a digital filter (2516), following which the guard intervals, which may be used to ensure that distinct transmissions do not interfere with one another, is removed from the signal (2518). This is followed by serial to parallel conversion (2520), and domain transformation via discrete Fourier transforms (2522). The results are equalized (2524), de-mapped (2526), de-interleaved and any forward error correction code that may be present is decoded (2528). The content is then descrambled (2530) and provided to a physical layer/media access control interface (2532). As seen in FIG. 2d, the transmit path may mirror the receive path, but in a reverse order. Content received through the physical layer/media access control interface (2532) is scrambled (2514), followed by forward error correction coding and interleaving (2512), bit-symbol mapping (2510), and transformed into time domain through inverse discrete Fourier transforms (2508). Following serialization (2506) and guard interval insertion (2504), the outgoing signal may go through digital filtering (2502). Other variations and embodiments as well as operations of transceivers are of course possible, and the embodiments in FIGS. 2a-2d are meant for illustrative purposes only, to highlight some of the applications in which use of PFTWGs may be advantageous.

Figure 3A:
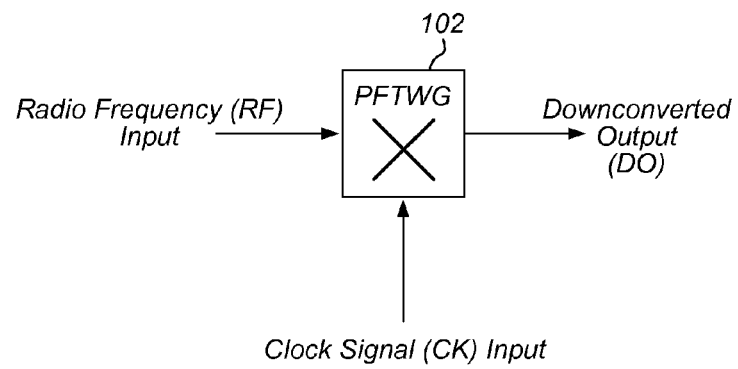
FIG. 3a shows input and output signals for a mixer that can be implemented with a PFTWG.

FIG. 3a depicts the high-level symbol of a mixer based on a PFTWG, with associated input and output signals. As shown in FIG. 3a, mixer 102 has an input terminal driven by a high-frequency incoming signal (RF Input), a clock signal (CK) terminal driven by a high-frequency switching signal (CK Input), with mixer 102 providing a downconverted signal output (DO) (more generally a lower frequency output) at a frequency set by the magnitude of the difference between the respective frequencies of the RF Input and CK Input signals, or a frequency set by the magnitude of the difference between the frequency of the RF Input and integer multiples of the frequency of the CK Input signals.

Figure 3B:
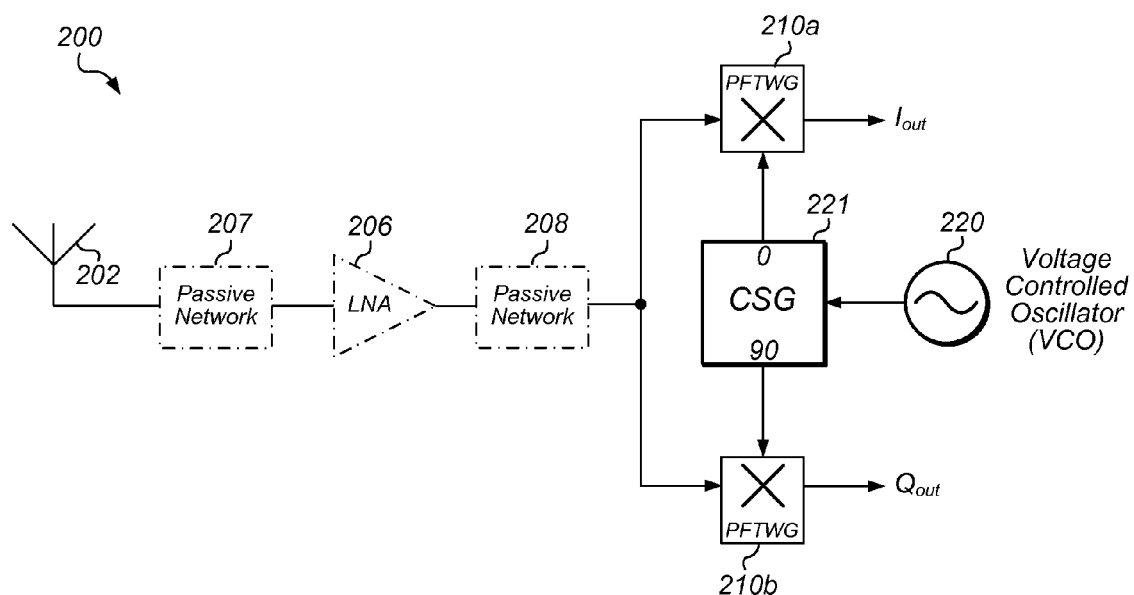
FIG. 3b shows the front end of an RF receiver, including mixers that can be implemented with PFTWGs.

FIG. 3b shows one embodiment of the front end of a direct conversion or low intermediate-frequency (Low-IF) RF receiver 200 with downconversion mixers 210a and 210b implemented with PFTWGs. Note that Passive Network 207, Low Noise Amplifier (LNA) 206, and Passive Network 208 are shown with dotted outline, as their inclusion in the embodiment is optional and, in some embodiments, one or more of them may be replaced with a wire connection. As shown in FIG. 3b, receiver 200 receives an RF signal at antenna 202, which is optionally passed through passive network 207, amplifier 206, which may be a low noise amplifier (LNA), and passive network 208, providing an amplified signal that may be downconverted to baseband using mixers 210a and 210b driven by quadrature clock signals (at 0 degrees and 90 degrees) generated from a Clock Signal Generator (CSG) 221, which generates said clock signals based upon the input from a voltage controlled oscillator (VCO) 220. The resulting output is a downconverted output signal comprising two quadrature components labeled $I_{out}$ and $Q_{out}$. Note that in some preferred embodiments, LNA 206 may be omitted from receiver 200, due to the voltage gain featured in various embodiments of the mixers 210a and 210b implemented with PFTWGs, and in such embodiments the energy in the resultant output signal of the PFTWGs is substantially derived from the input signal energy, as there is no active component present to provide additional energy to the signal.

Figure 4:
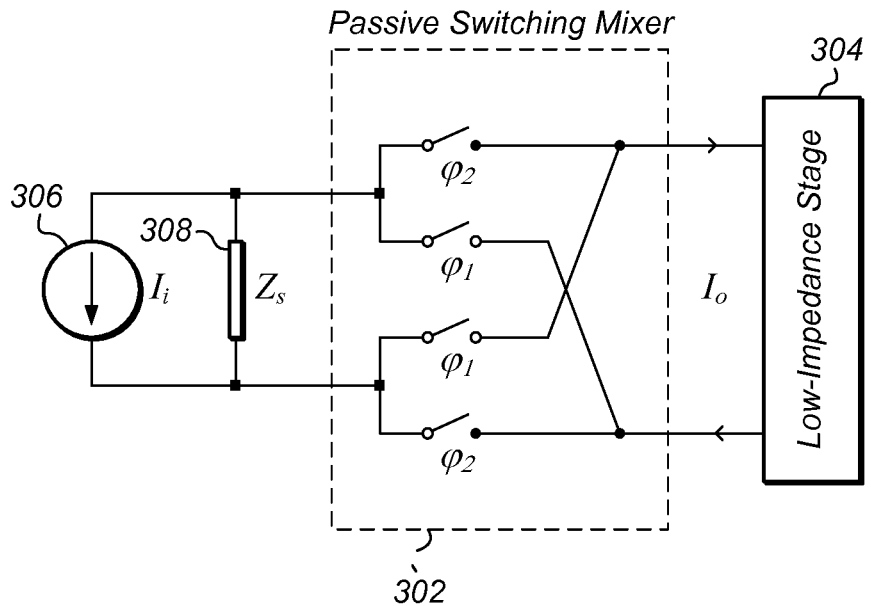
FIG. 4 shows a simplified diagram of a basic passive switching mixer operated in current-mode.
Figure 5:
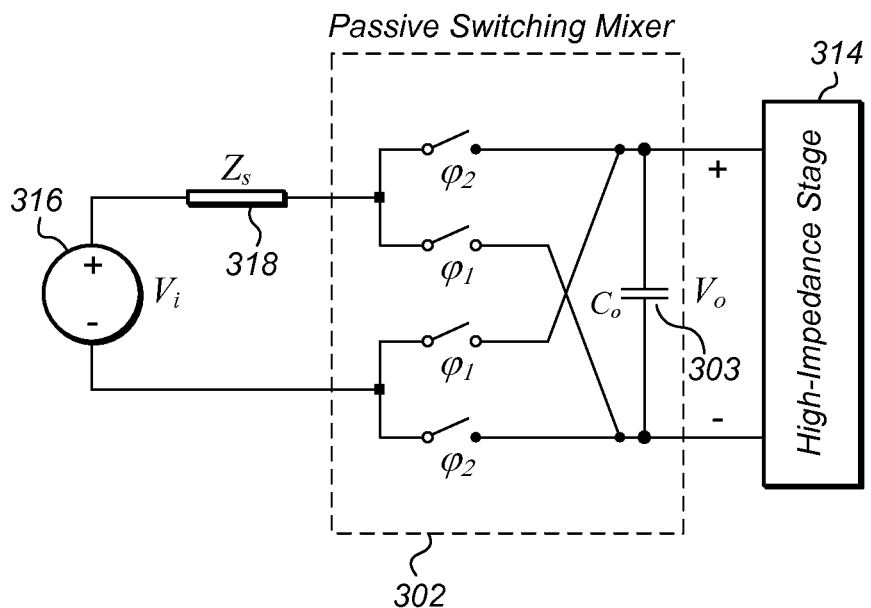
FIG. 5 shows a simplified diagram of a basic passive switching mixer operated in voltage-mode.

In order to better understand operation of PFTWGs, FIGS. 4 and 5 show examples of a basic passive switching mixer circuit (302). Mixer 302 may be operated in current-mode (as shown in FIG. 4) and voltage-mode (as shown in FIG. 5), with the local oscillator (LO) waveforms and associated mixing functions shown in FIG. 6 for a pulse based LO waveform, and FIG. 7 for a sinusoidal LO waveform. It should be noted here that in some cases the operating mode of the mixer may take on a behavior that may be characterized as a mode that is "in-between" a current mode and a voltage mode. A clear cut distinction may not always be manifested between the two modes, due in part to circuit imperfections, and/or various operating conditions. For example, a current-mode signal may also produce a voltage signal due to non-ideal impedances. Therefore, as used herein, the mode of operation references the intended operating mode, fully taking into account that residual effects indicative of the other operating mode may also be present.

Figure 6:
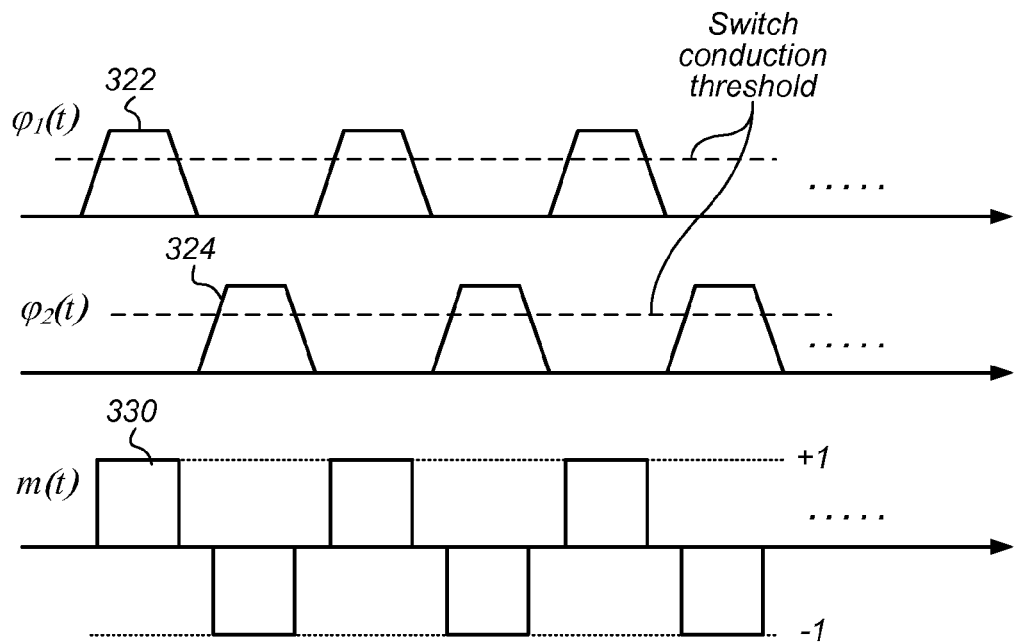
FIG. 6 shows voltage waveforms of typical pulse-based local oscillator (LO) signal(s) and an approximated version of the effective resultant mixing function, associated with the passive switching mixers shown in FIG. 4 and FIG. 5.
Figure 7:
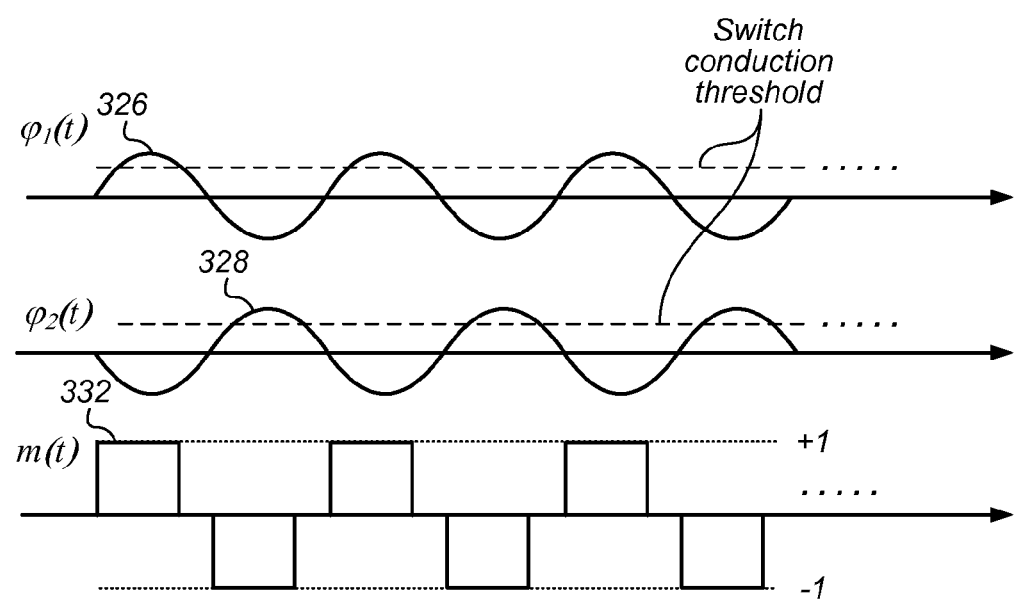
FIG. 7 shows voltage waveforms of typical sinusoidal LO waveforms and an approximated version of the effective resultant mixing function, associated with the passive switching mixers shown in FIG. 4 and FIG. 5.

As shown in FIG. 4, basic passive switching mixer 302 is operated in current-mode using current source 306 and impedance 308 coupled in parallel, providing the output signal to low-impedance stage 304. FIG. 5 shows basic passive switching mixer 302 operated in voltage-mode using voltage source 316 and impedance 318 coupled in series, providing the output signal to low-impedance stage 314. In FIGS. 6 and 7, mixing function, m(t) models the effective behavior of the mixing action for the given LO waveforms 322 and 324, and 326 and 328, respectively. Thus m(t) may take into account the physical characteristics of the switches in mixer 302, such as threshold voltage, as well as the shape and polarity of the LO waveforms. In such topologies, the switching duty-cycle (D) may be a fractional value between 0 and 1, which in practice is typically less than 0.5 to avoid overlap, representing the portion of time that a given switch stays asserted per cycle of the LO signal. In some embodiments, D may have a significant impact on performance.

When passive mixer 302 is operated in current-mode, mixer 302 receives a current signal as its input and produces a frequency translated output current ($I_O$), as shown in FIG. 4. The mixer switches in mixer 302 may be implemented with transistors, with the inputs of mixer 302 driven from a relatively high output impedance stage (e.g. impedance 308), such as a transconductor circuit, providing a current signal (i.e. a signal that is a current) to mixer 302. The switching of the mixer may commutate the high frequency input current, creating mixing products at multiple frequencies, one of which may be the desired low-frequency baseband output provided to low-impedance stage 304 in form of an output current $I_o$. Therefore, when operating mixer circuit 302 in current mode as shown in FIG. 4, the mixer 302 can be driven by a transconductor with the output produced by mixer 302 provided to an amplifier (which may be a transimpedance amplifier) presenting a low-impedance interface to mixer 302 and generating a voltage signal output $V_o$.

The output current $I_o$ of mixer 302 is the product of the equivalent mixing function m(t) (330, shown in FIG. 6 and produced from operating the transistors/switches using LO signals 322 and 324) and the input current $I_i$ 306. It should be noted that any waveforms presented herein are included to more effectively demonstrate the operating principles of various embodiments and circuit elements, and are therefore approximated (or simplified) versions of the actual waveforms that may be encountered in practice. A similar approach applies to some of the equations presented herein, which are meant to provide models with enough detail to sufficiently demonstrate various important operating characteristics of the discussed embodiments. Therefore, the approximated equations and waveforms still provide an accurate overview of the operating principles disclosed herein, and one of ordinary skill in the art will appreciate how these equations and waveforms ought to be interpreted. Referring again to mixer 302, output current $I_o$ will contain the desired downconverted signal as well as other frequency mixing products. As shown in FIG. 6, the mixing function 330 has a magnitude of one whenever either switching path to the output is enabled. The polarity of the mixing function may be toggled as the current path toggles between positive-to-positive on $\phi_1$, and positive-to-negative on $\phi_2$ from the mixer input to the mixer output. The output current drops to zero at any instant when neither switch ($\phi_1$ and $\phi_2$) is enabled.

For frequency offsets that are very small relative to the LO frequency, the conversion gain of the current-mode passive switching mixer and its dependence on duty cycle (D) may be approximated by averaging the output current that results from a sinusoidal input that is perfectly in-phase with m(t), over one complete cycle of the LO, yielding the relationship in the following equation (1):

$$G_c = \frac{1}{2\pi}\left[\int_{-\pi D}^{\pi D}\cos\theta \cdot d\theta - \int_{\pi-\pi D}^{\pi+\pi D}\cos\theta \cdot d\theta\right] = \frac{2 \cdot \sin\pi D}{\pi} \quad (1)$$

The conversion gain given by equation (1) may vary from its minimum value of zero (as D approaches zero), to its maximum value of $2/\pi$, or about −4 dB (as D approaches ½). For maximum conversion gain, the duty cycle D of m(t) may be set to its maximum practical value that avoids overlap between the two phases 322 and 324. For example, $D_{max}$ may be set to ½.

When operated in voltage-mode (as shown in FIG. 5, for example), basic passive mixer 302 may process a voltage input signal by periodically connecting the voltage input across a capacitor $C_o$ 303 coupled between its output terminals. A differential amplifier may be used to produce the input voltage $V_i$ from an input RF signal voltage $V_{rf}$, and provide the input voltage to mixer 302. The output voltage signal $V_o$ developed across a capacitor coupled between the output terminals of mixer 302 may be provided to high input-impedance stage 314 in order to prevent attenuating the output signal $V_o$. High-impedance stage 314 can be a voltage buffer or a capacitive feedback amplifier, or any stage having a high input impedance at baseband frequencies.

The frequencies of input signal $V_i$ and LO switching waveforms 322 and 324 can be very close, and considerably greater than the frequency of the downconverted output signal. Similar to the passive switching mixer operated in current-mode, the duty cycle D of the LO waveform may affect the magnitudes of mixing products present in the output signal $V_o$. The same mixing products may also be significantly impacted by the effective circuit time constant $\tau_s$, as a result of the combinations of resistances and capacitances present in the circuit. The effective circuit settling time constant during sampling may therefore be expressed as:

$$\tau_s = R_{eff} C_{eff}$$

where $R_{eff}$ is the effective lumped series resistance for a given mixer structure, typically incorporating the resistance of the source of the RF input signal ($R_S$) and the on-resistance ($R_{SW}$) of one or more switches in the circuit, and $C_{eff}$ is the effective lumped shunt capacitance loading the input signal when a given switch is asserted. Unless specified otherwise in the descriptions of embodiments that follow, the settling time constant ($\tau_S$) may be assumed to be large enough such that the settling of the input voltage(s) onto storage capacitor(s) during one sampling window is incomplete. This condition will be referred to as "incomplete settling" throughout. Thus, $\tau_S$ can be related to the conduction duty cycle D and the LO frequency ($f_m$) by the expression provided in the following equation (2.1):

$$\tau_S = R_{eff} \cdot C_{eff} \gg \frac{D}{f_m} \tag{2.1}$$

One significant difference between voltage-mode operation and current-mode operation is that the output signal is not characterized as the product of m(t) and the input signal $V_i$. Hence, the relationship between D and any conversion gain during voltage-mode operation is different from the relationship between D and conversion gain obtained during current-mode operation. The conversion gain $G_C$ of a voltage-mode passive mixer at zero Hertz (0Hz) frequency offset may be derived for 0<D<0.5, assuming incomplete settling, as described above, as provided in the following equation (3):

$$G_c = \frac{\sin(\pi D)}{\pi D}. \tag{3}$$

As seen from equation (3), $G_C$ may have a maximum value of 1 as D approaches zero, and a minimum value of 2/π as D approaches 0.5. It should be noted that passive mixer 302, operated in voltage-mode as shown in FIG. 4, features a differential input $V_i$.

A passive mixer may be designed to have a singled-ended input and a differential-ended output, referred to herein as a single-balanced mixer. When operating a single-balanced mixer, both polarities of the single-ended input waveform may be processed on opposite phases of the LO waveforms, resulting in the differential output exhibiting an effective conversion voltage gain greater than unity, but not greater than a factor of two. The effective doubling of the conversion gain with respect to the conversion gain of a differential-input differential-output mixer is a direct result of converting a single-ended input to a differential-ended output. There is no voltage amplification from the input to any one side of the output signal and thus, there is no positive net voltage gain (in dB). However, the gain could be effectively doubled by taking the output as the combination of both anti-phase single-ended outputs, such that $V_o = V_{o1} - V_{o2}$, where $V_{o1}$ and $V_{o2}$ represent the single-ended outputs corresponding to phase1 (φ1) and phase2 (φ2), respectively. However, as mentioned above, this does not represent a net voltage gain between any single input and any single output.

Therefore, the conversion gain of a single-balanced mixer distinguishes from the conversion gain $G_c$ of a fully differential voltage-mode operated mixer defined in equation (3). For a single-balanced passive mixer, assuming incomplete settling, the single-ended input to differential-ended output voltage conversion gain, $G_{c,se-de}$ may be given by the following equation (4):

$$G_{c,se-de} = 2 \cdot \frac{\sin(\pi D)}{\pi D} \tag{4}$$

For a voltage-mode operated passive mixer, for example mixer 302 in FIG. 5, one might expect the output noise density in the band of interest to be more directly related to the integrated output noise kT/C. However, in the context herein, the value(s) of sampling capacitor(s) may be chosen to ensure that only incomplete settling of the input signal on the sampling capacitor(s) 303 occurs during a single sampling window. As a result of incomplete settling of the input signals, the frequency spectrum of the output noise density may be shaped, and may have considerably higher content at low frequencies, dominated by the thermal noise contributions of the source resistance and switch resistance(s). This is a desirable trait that the low frequency output noise may be dominated by the source resistance Rs, such that a low noise factor (F) may be attained, as described below. Hence, assuming incomplete settling, the noise factor (F) may be given by the following equation (5):

$$F = \frac{R_S + 2R_{SW}}{R_S} \cdot \frac{1}{2D} \cdot \left(\frac{\pi D}{\sin \pi D}\right)^2 \quad 0 \leq D \leq \frac{1}{2}, \tag{5}$$

where $R_S$ represents the source resistance of the voltage source, e.g. impedance 318 in the circuit shown in FIG. 5, and $R_{SW}$ represents the effective series resistance included in each switch of mixer circuit 302, modeling the "on-resistance" of each switch (i.e. the resistance exhibited by the switch when it is turned on). As seen from equation (5), the noise factor F may be improved by ensuring that switch resistance $R_{SW}$ is very small in comparison to the source resistance $R_S$. Furthermore, there may be an optimal duty-cycle $D_{opt}$ (in this case a value of 0.375) that may minimize the noise factor by balancing conversion gain and noise folding from harmonics of the LO frequency $f_m$. The noise factor may therefore be minimized by an appropriate choice of the duty-cycle D of the LO, and by making $R_{SW}$ much smaller than $R_S$. Hence, a combination of a high source-resistance and a low switch-resistance may facilitate reducing the noise factor.

Figure 8A:
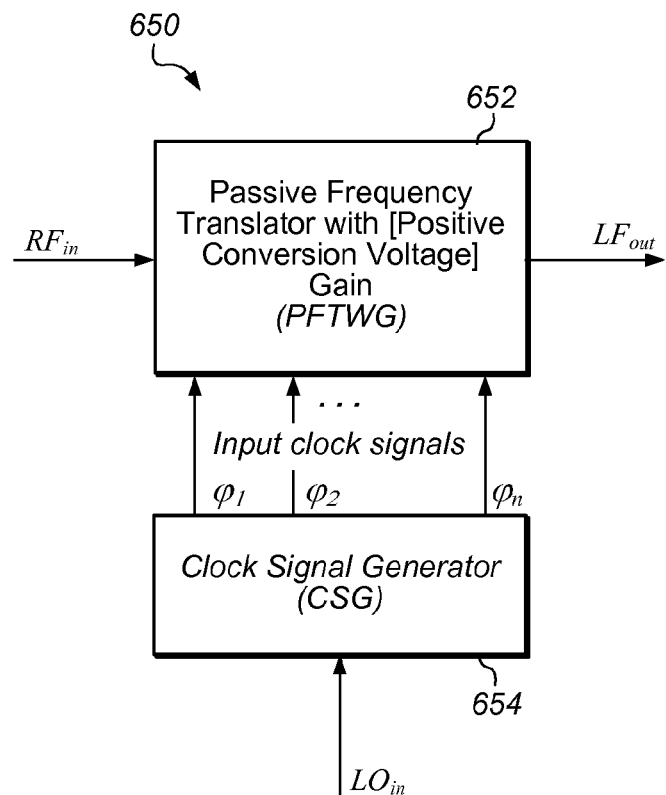
FIG. 8a shows a conceptual block diagram of one embodiment of a PFTWG that uses capacitors and switches, and is activated by periodic clock signals.

Turning now to FIG. 8a, a conceptual high-level block diagram of a mixer 650 based on a PFTWG 652 is shown. Mixer 650 represents one embodiment of mixer 102 shown in FIG. 2, and may be integrated into IC 680 shown in FIG. 1. PFTWG 652 may be implemented using capacitors and switches. The switches within PFTWG 652 may be activated by periodic input clock signals ($\phi_1$-$\phi_n$) provided from clock signal generator (CSG) circuit 654, which receives a local oscillator input signal ($LO_{in}$) providing the base clock signal based on which the periodic input clock signals to PFTWG 652 are generated. The frequency of the base clock signal is referred to as the base frequency. The switches may be arranged to connect the input RF port receiving the input signal $RF_{in}$ to one or more capacitors, and charge the capacitors using the RF input source according to the input clock signals. The clock signals, in combination with the circuit topology of PFTWG 652, may effect a periodic mixing function m(t) with a fundamental frequency $f_m$. The switches and capacitors may therefore be arranged to produce a downconverted lower frequency (sometimes a baseband (BB)) output signal $LF_{out}$, constructing the voltage of the BB output signal by combining the charges from the capacitors in a variety of different ways. The PFTWG may therefore perform frequency translation while achieving a positive (in dB) voltage conversion gain. By relying on passive signal processing, the energy of the output signal of the PFTWG is obtained primarily from the energy from the RF input signal.

Figure 8B:
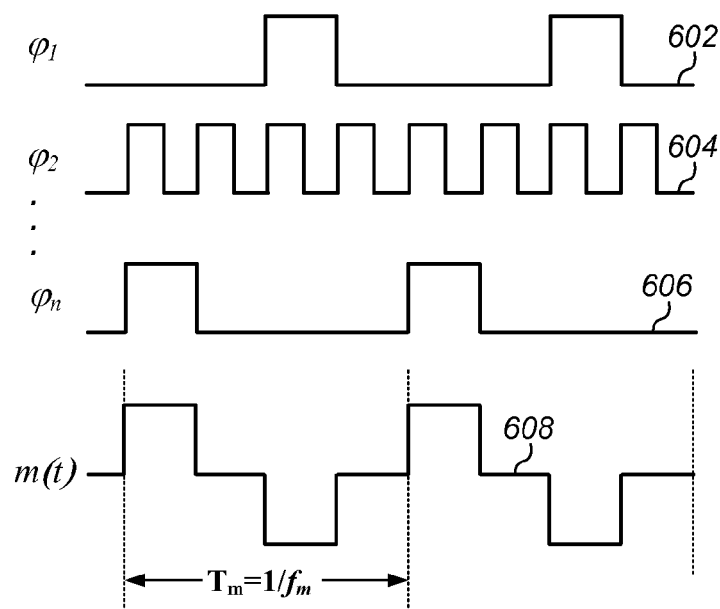

CSG circuit 654 shown in FIG. 8a is configured to generate all signals for operating (i.e. enabling or turning on, and disabling or turning off) the switches within PFTWG 652. Therefore, CSG circuit 654 may include several components, such as dividers, buffers, circuitry to shape the respective waveforms of the input clock signals, circuitry to control the relative phases of the waveforms, circuitry to control the respective duty-cycles of the input clock signals, and other similar components used for generating the input clock signals with specific frequencies, waveform shapes, relative phases of the waveforms, and duty cycles, to achieve the desired mixer characteristics, performance, and power consumption. FIG. 8b shows timing diagrams of example waveforms for the input clock signals $\phi_1$-$\phi_n$, (602, 604, 606) generated by CSG circuit 654, and the effective resulting periodic mixing function m(t) (608) according to which input signal $RF_{in}$ may be downconverted to lower frequency (e.g. baseband) output signal $LF_{out}$. PFTWG 654 may be implemented according to various different circuit configurations. While the functionality of the various circuits may be most easily illustrated and understood by way of ideal switches, in typical embodiments the switches may be implemented using N-channel MOS (NMOS) transistors, P-channel MOS (PMOS) transistors, complementary NMOS and PMOS (CMOS) transistors, or other similar types of electrical switching elements.

Figure 9A:
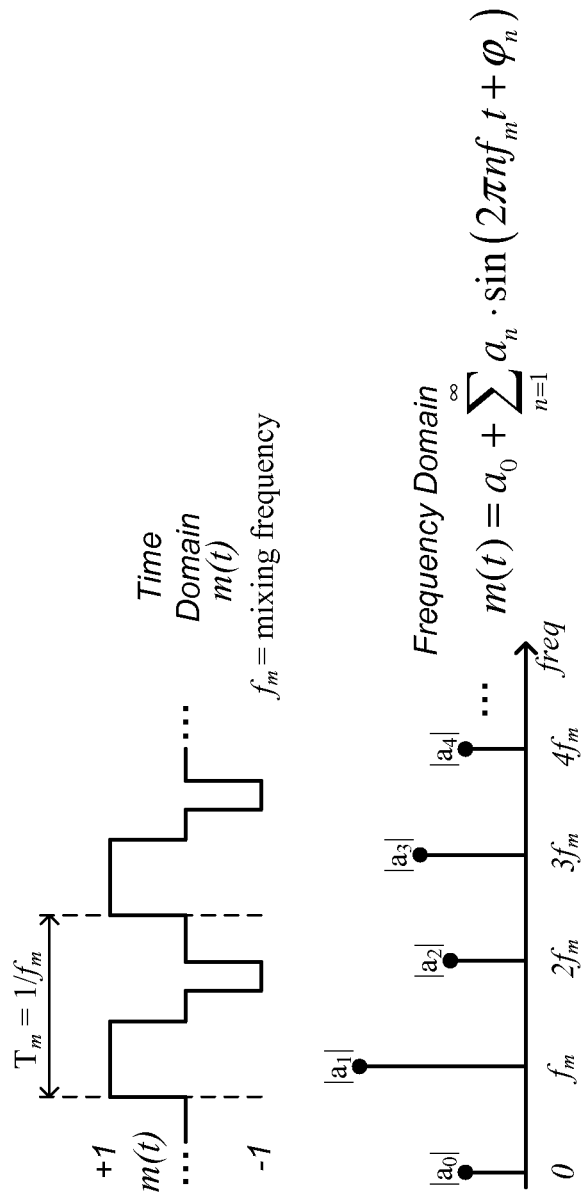
FIG. 9a shows a frequency domain representation of the simplified version of the waveform of the effective resultant mixing function from FIG. 8b.
Figure 9B:
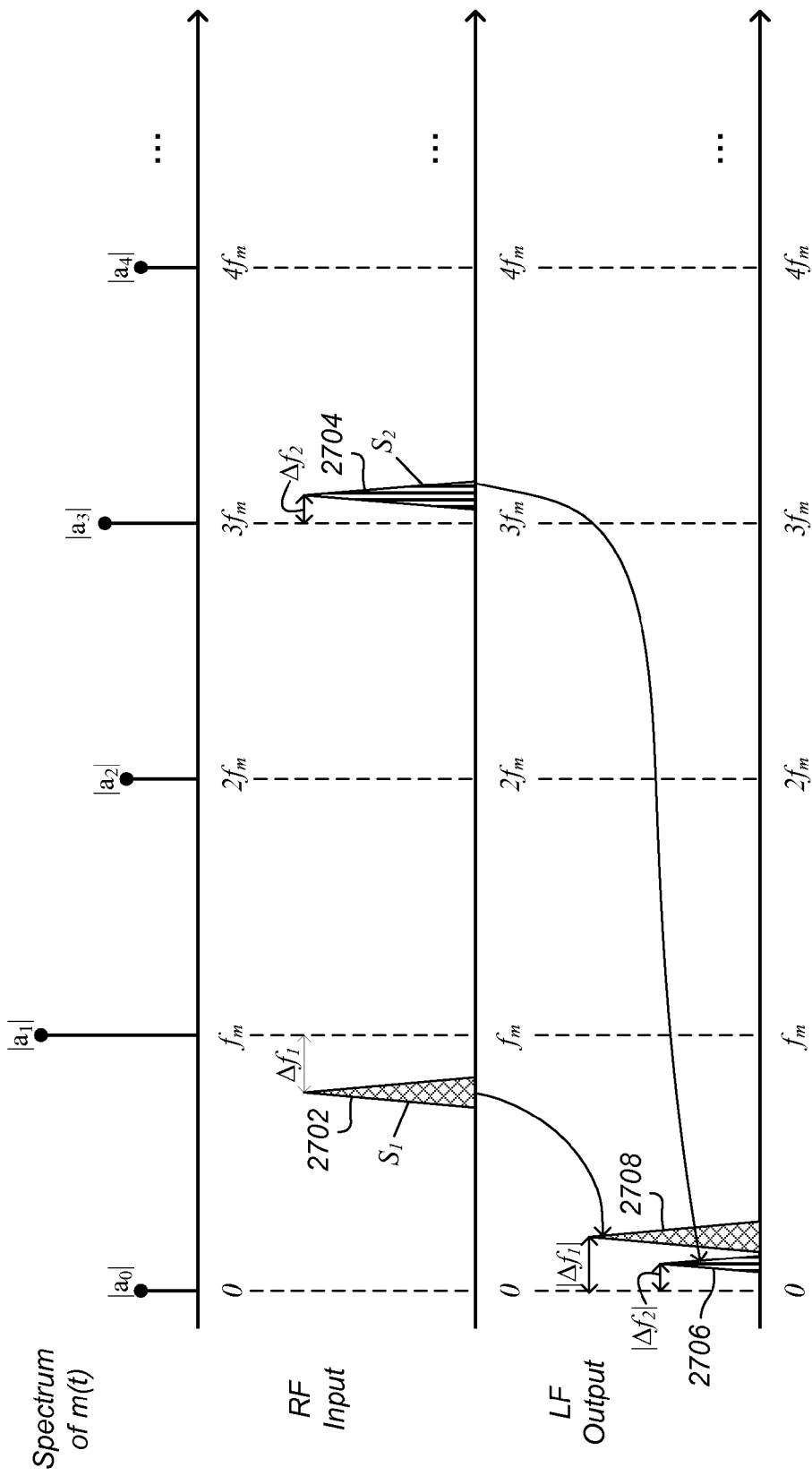
FIG. 9b shows a frequency domain representation of the RF input signal and the LF output signal for a PFTWG, illustrating sub sampling operation, during which RF input signals near harmonics of m(t) are downconverted.

FIG. 9a shows a frequency domain representation of the simplified version of the waveform of the effective resultant mixing function that is shown in FIG. 8b. The LO mixing frequency $f_m$ is clearly indicated, with various harmonic frequencies shown with absolute values of $a_1$, $a_2$, $a_3$, $a_4$, etc., at frequencies that represent integer multiples of LO mixing frequency $f_m$, at $2f_m$, $3f_m$, $4f_m$, etc, respectively. Thus, various embodiments of PFTWG may also be operated to perform sub sampling mixing. This is further illustrated in FIG. 9b, which shows a frequency domain representation of the RF input signal and the LF output signal for a PFTWG, during which RF input signals near harmonics of m(t), that is, harmonics of fundamental LO frequency $f_m$ are also downconverted. Thus, in case of a sub sampling mixing/downconversion operation, depending on near which harmonic the RF input is downconverted, the gain depends on the given magnitude corresponding to the harmonic frequency to which the downconverted signal corresponds. For example, as shown in FIG. 9b, a lower frequency output $LF_{out}$ 2706 may be the result of the RF input 2704 near the third harmonic ($3f_m$) of the LO $f_m$ frequency being downconverted. Similarly, a lower frequency output $LF_{out}$ 2708 may be the result of the RF input 2702 near the first harmonic, or near the fundamental mixing frequency ($f_m$) of the LO, being downconverted.

Figure 33:
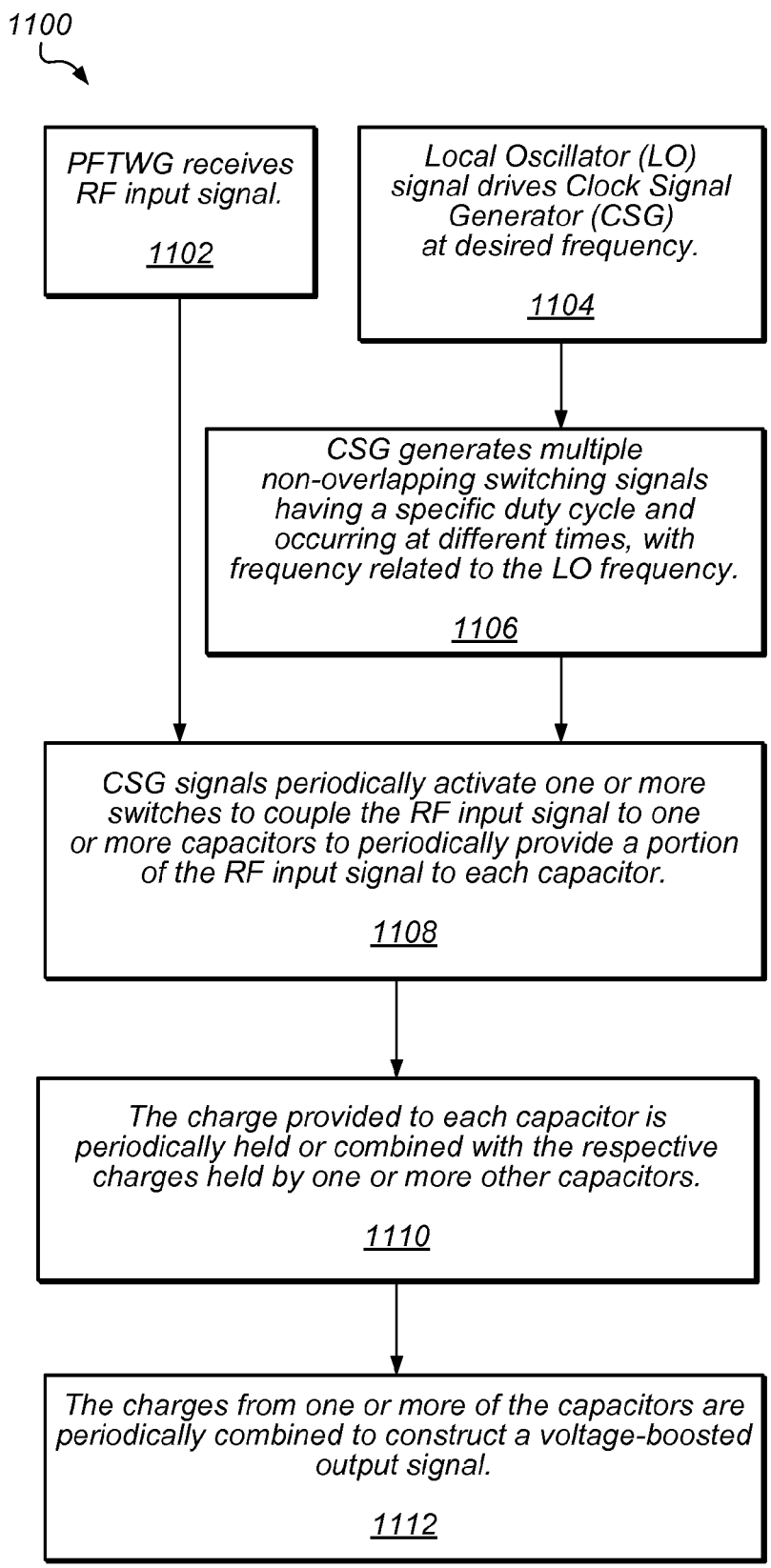
FIG. 33 shows a flow diagram illustrating the fundamental operation of a PFTWG according to one set of embodiments.

The overall operation of PFTWG 652 is highlighted in FIG. 33. Flow diagram 1100 in FIG. 33 shows the fundamental operating steps of a PFTWG according to one set of embodiments. In the operation detailed in FIG. 33, a PFTWG receives an RF input signal (1102) that may be converted to a voltage signal having frequency f1, which may be sampled by the PFTWG at a sampling frequency (f0) determined by a local oscillator (LO). While embodiments disclosed herein specify a LO as the source of a base periodic signal having a base frequency (as previously described), those with ordinary skill in the art will appreciate that such periodic signals may be obtained from a variety of different sources, and the LO mentioned herein is meant to encompass all such sources.

Thus, according to flow diagram 1100, sampling performed by the PFTWG is facilitated by a LO signal driving a CSG circuit (e.g. CSG 654) at desired frequency (1104), which in turn generates multiple non-overlapping switching signals having a specific duty cycle and occurring at different times, having respective frequencies related to the LO frequency (1106). The CSG signals periodically activate one or more switches to couple the RF input signal to one or more capacitors, to periodically provide a portion of the RF input signal to each capacitor (1108).

The charge thereby derived from the RF input signal and provided to each capacitor is periodically held or combined with the respective charges held by one or more other capacitors, to effectively store voltage samples on the capacitors (1110). The charges from one or more of the capacitors are periodically combined construct a voltage-boosted baseband signal (1112). In other words, an output signal may be constructed using the stored voltages on the capacitors, such that the output signal has a different frequency (f2) than the LO frequency (f0) and the frequency of the RF input signal (f1). The absolute value of the frequency of the generated output signal (f2) may be the absolute value of the difference between the LO frequency and the frequency of the RF input signal (i.e. |f2|=|f1−f0|. As previously mentioned, the output signal obtained by combining charge or transferring charge between the storage capacitors may have a positive net voltage gain (in dB) relative to the RF input signal, with the energy in the output signal derived predominantly from the energy of the input signal. In various embodiments, a bandpass filter may be connected to the input of the PFTWG to improve performance. Some embodiments may incorporate two PFTWGs, a first PFTWG operated as In-phase mixer, and a second PFTWG operated as Quadrature (I&Q) mixer, with both PFTWGs driven from a single RF input source. It should be noted that as used herein, (polar) capacitors are said to be coupled or connected in anti-series when the respective terminals of the capacitors that are coupled to each other have identical polarities, whereas (polar) capacitors are said be coupled or connected in series when the respective terminals of the capacitors that are coupled to each other have opposite polarities.

Figure 10:
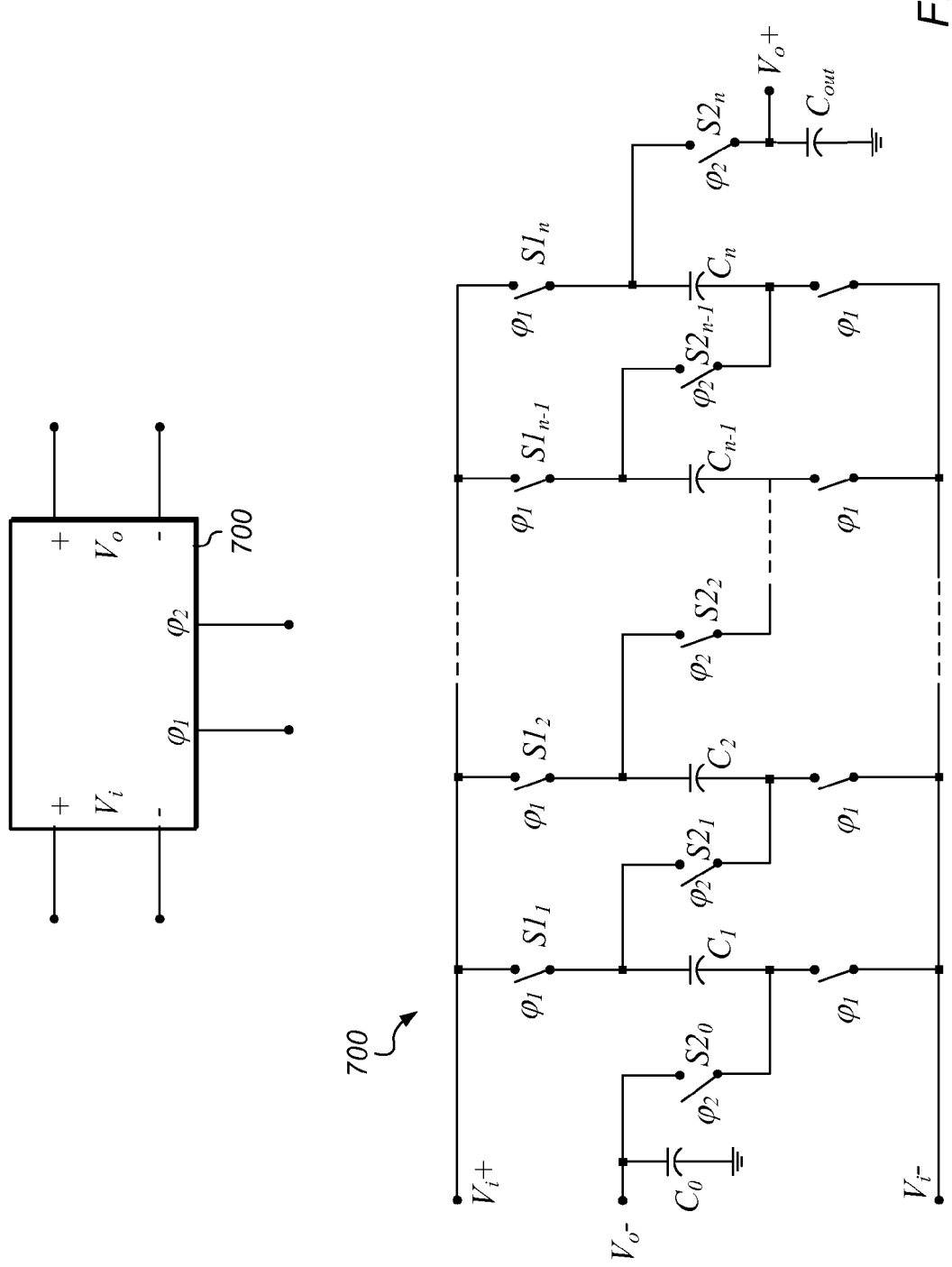
FIG. 10 shows block and circuit diagrams for one embodiment of a switching circuit having differential input and differential output, and used as a building block for constructing embodiments of a PFTWG.
Figure 11:
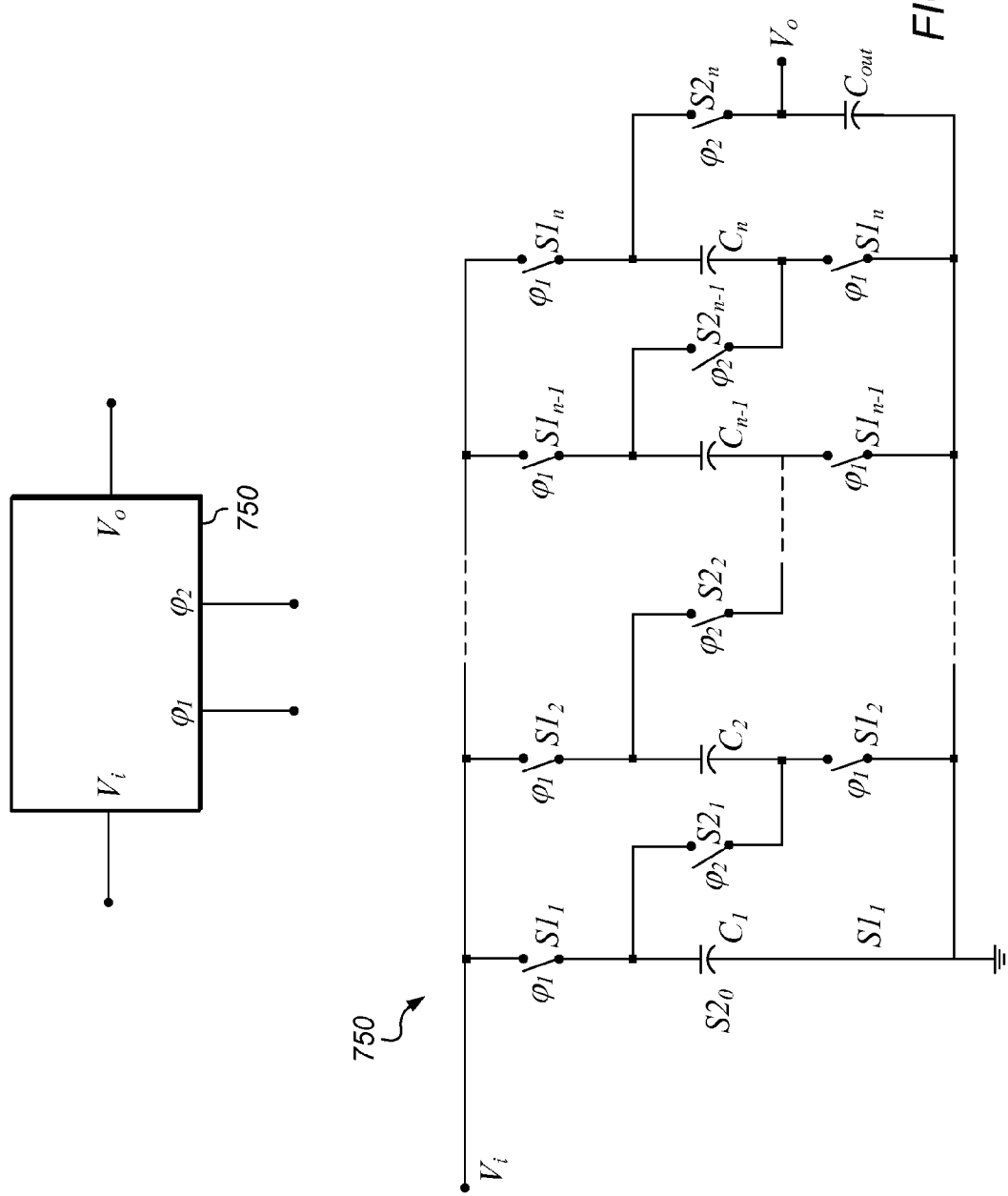
FIG. 11 shows block and circuit diagrams for one embodiment of a switching circuit having single-ended input and differential output, and used as a building block for constructing embodiments of a PFTWG.

FIG. 10 shows the circuit diagram of one embodiment of a differential input/differential output switching circuit 700, and FIG. 11 shows the circuit diagram of one embodiment of a single-ended input/single-ended output switching circuit 750, both of which may be used in implementing various embodiments of a PFTWG, as will be further shown below. Circuits 700 and 750 may both be operated to receive an input signal having a first frequency f1 and produce a desired output signal having the same frequency, i.e. f1. However, circuits 700 and 750 may also be operated to achieve frequency translation via aliasing, and may be used in constructing various embodiments of a downconverting frequency translator circuit, shown as circuits 800, 820, and 840 in FIGS. 13-15. Frequency translators 800, 820, and 840 may all feature similar characteristics, including, but not limited to:

receiving input clock signals and an input RF signal (having frequency $f_{RF}$), the frequency of the input clock signals determining the fundamental mixing frequency $f_m$ of the frequency translator circuit, and the frequency translator circuit producing a desired baseband output signal with a frequency $f_{BB}$, where $|f_{BB}|=|n \cdot f_m - f_{RF}|$ and n is a positive integer.

Figure 15:
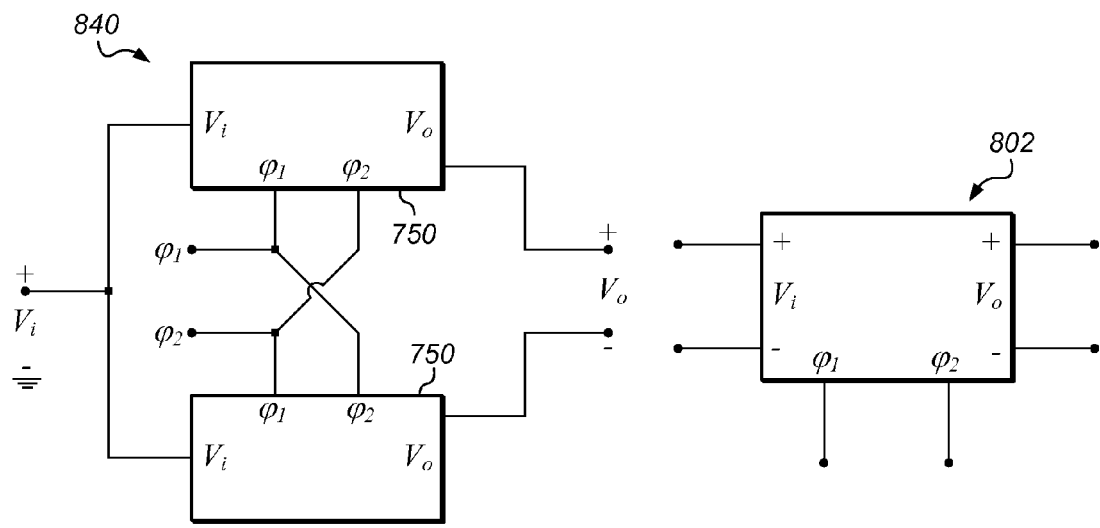
FIG. 15 shows block diagrams of one embodiment of a fully symmetric n-stage PFTWG with DC balanced mixing function, constructed using the circuit shown in FIG. 11 and having a single-ended input and differential output configuration.

As shown in FIGS. 13-15, circuits 800, 820, and 840 combine two instances of circuit 700 and/or circuit 750 as subcircuits to sample the same input signal on two different phases of the input clock, with one sub-circuit having a positive gain to the output and the other sub-circuit having a negative gain to the output. Accordingly, the mixing function of circuits 800, 820, and 840 may have a strong correlation with frequencies near $f_m$ and its harmonics, and low correlation with low frequency signals near DC, and even near harmonics of the LO frequency, as will be further shown below.

Figure 12:
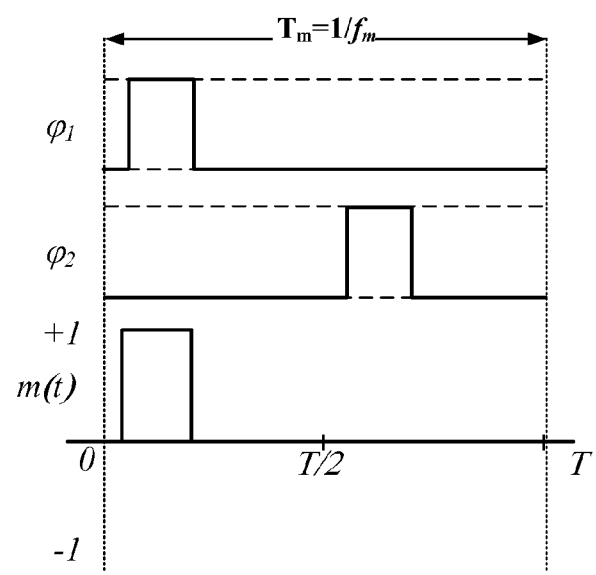
FIG. 12 shows examples of the sampling waveforms and an approximated version of the effective resultant mixing function, associated with the circuits shown in FIG. 10 and FIG. 11.

Referring again to FIGS. 10 and 11, circuits 700 and 750 provide a conceptually straightforward example of how passive voltage gain may be generated using switches and capacitors. As previously mentioned, the switches shown in FIGS. 10 and 11 may be implemented as NMOS transistors and/or PMOS transistors in at least one set of embodiments. For example, in some embodiments, each designated switch (labeled $S_{ij}$, where i is a number indicating the row in which the switch is situated, and j is a number indicating the relative position of the switch within a given row) may be a transistor device, with the channel terminals of the transistor device corresponding to the switch terminals, and the gate terminal of the transistor device controlled by one of the clock signals. In other words, the input clock signals $\phi_1$ and $\phi_2$ may be provided to the respective gate terminals of the transistor devices to control, that is, enable and disable the transistor devices. On $\phi_1$, that is when input clock signal $\phi_1$ is asserted, the input voltage ($V_i$ in case of circuit 700 and $V_i+$–$V_i$– in case of circuit 750) may be sampled onto parallel capacitors $C_i$ (i.e. capacitors $C_0$-$C_n$). On $\phi_2$, that is when input clock signal $\phi_2$ is asserted, switches $S2_j$ may be enabled, reorganizing all capacitors into a series configuration and sampling the resulting voltage sum to the output holding capacitor $C_{out}$. Examples of the input clock signals for operating circuits 700 and 750, and the resultant effective mixing function m(t) is shown in FIG. 12.

Circuits 700 and 750 achieve a voltage gain of up to n (V/V) without performing frequency translation, if the input signal frequency $f_{in}$ is below $f_m/2$. However, if the input signal frequency exceeds $f_m/2$, then circuits 700 and 750 may be operated to downconvert the input signal via aliasing about $f_m$. Even though circuits 700 and 750 may be operated to perform frequency translation via aliasing, during such operation the input noise and other interference at low frequencies reach the baseband output without being translated. Therefore, it may be preferable to use circuits 700 and 750 as building blocks to construct a dedicated frequency translator circuit, as shown in FIGS. 13-15. As previously mentioned, circuits 800, 820 and 840 may sample the RF input twice per cycle of $f_m$, toggling between positive and negative polarity at each sample. Due to the alternating sampling polarity, circuits 800, 820 and 840 each effect frequency translation with a DC-balanced mixing function m(t). The mixing function of circuits 800, 820 and 840 may be designed to have increased correlation with sinusoidal input signals near $f_m$, and have zero correlation with inputs near DC and even near harmonics of $f_m$.

Figure 16:
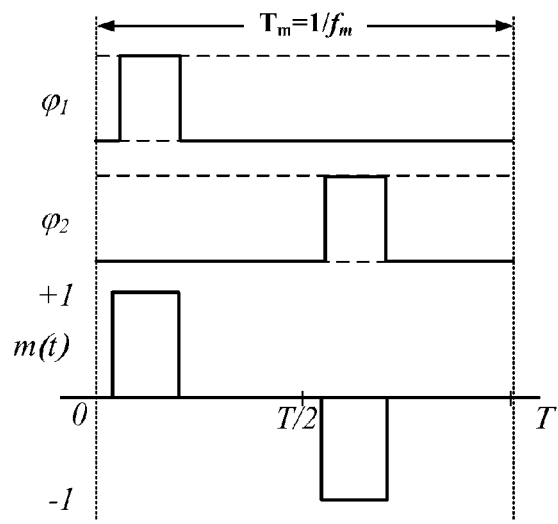
FIG. 16 shows examples of the sampling waveforms and an approximated version of the effective resultant mixing function, associated with the circuits shown in FIGS. 8A, 8B, and 8C.

PFTWG circuits constructed using circuits 700 and/or 750 as building blocks may be operated to generate a single-ended output from a single-ended input, or provide single-ended to differential, and differential to single-ended conversion. Overall, circuits 800, 820 and 840 are all illustrative of embodiments of fully symmetric n-stage passive frequency translators with DC balanced mixing function m(t). Circuit 800 is representative of an embodiment featuring a differential input/output configuration with parallel output connection, circuit 820 is representative of an embodiment featuring a differential input/output with series output connection, and circuit 840 is representative of an embodiment featuring a single-ended input/differential output. One example of the sampling waveforms or clock signals $\phi_1$ and $\phi_2$ used to operate circuits 800, 820, and 840 is shown in FIG. 16, also illustrating the resultant mixing function m(t). The conversion gain of circuit 840 is higher than the conversion gain of either circuit 800 or circuit 820 by a factor of two, as a result of a single-ended input being converted to a differential output. Assuming incomplete signal settling, as discussed previously, the effective circuit time constant ($\tau_S$) may be assumed to be substantially greater than the ratio of the duty-cycle and the LO frequency, as expressed in the following equation (6):

$$\tau_S = (R_S + 2R_{SW}) \cdot C_{o} \gg \frac{D}{f_m}, \tag{6}$$

where $C_o$ is the output capacitance $C_{out}$. For the relationship shown in equation (6), the conversion gain of circuits 800, 820, and 840 near the m-th harmonic of $f_m$ may be expressed as shown in the following equations (7), (8) and (9):

$$G_c |_{f_{in} \approx m \cdot f_m} = 2n \cdot \frac{\sin(m \cdot \pi D)}{m \cdot \pi D} \tag{7}$$

for circuit 820, when m is an odd integer $$G_c |_{f_{in} \approx m \cdot f_m} = n \cdot \frac{\sin(m \cdot \pi D)}{m \cdot \pi D} \tag{8}$$

for circuits 800 and 840, when m is an odd integer $$G_c |_{f_{in} \approx m \cdot f_m} = 0 \tag{9}$$

for circuits 800, 820 and 840, when m is an even integer.

In contrast to circuits 700 and 750, circuits 800, 820, and 840 have maximum conversion gain for input frequencies near $f_m$ and zero gain at DC and for even harmonics of $f_m$. Hence, circuits 800, 820, and 840 have the potential for significantly lower noise factor than circuits 700 and 750 used singly, due to reduced noise folding from the undesired harmonics of the sampling frequency.

The conversion gain of circuits 800, 820, and 840 has been described above with the assumption of incomplete settling at each phase of the local oscillator LO. For the purpose of illustration and derivation, it is useful to examine the behavior of circuits 800, 820, and 840 when equation 6 is not satisfied and the input signal does settle completely in a single sampling window as provided in the following equation (6.1):

$$\tau_S = (R_S + 2R_{SW}) \cdot C_o \ll D/f_m \tag{6.1}$$

With the assumption that equation (6.1) above is satisfied and complete settling is achieved, it is possible to obtain a compact difference equation relating the output voltage to the input voltage. Note that complete settling is typically impractical for the preferred embodiments described herein, but permits derivation of the difference equation which expresses certain intrinsic behaviors of circuits 800, 820, and 840, such as frequency translation about $f_m$, and the reduction in baseband bandwidth resulting from charge sharing between $C_i$ and the output holding capacitor $C_{out}$, which hold true for the incomplete settling case as well. Assuming that capacitors $C_1$-$C_{2n}$, all have an equal capacitance value of $C_S$, and that equation (6.1) is satisfied, the difference equation for circuit 800 may be given according to the following equation (10):

$$V_o[k] = \frac{(-1)^k \cdot V_i[k-1] \cdot \frac{C_s}{n} + V_o[k-1] \cdot 2C_{out}}{\frac{C_s}{n} + 2C_{out}}, \qquad (10)$$

where the effective sampling rate is $2f_m$.

The term $(-1)^k$ in equation (10) accounts for the two switching circuits within circuit 800 being connected to the input with opposite polarity and complementary LO phasing, which results in circuit 800 performing frequency translation with a DC balanced m(t). Hence, circuit 800 exhibits a maximum conversion gain for input frequencies near $f_m$, and has substantially zero conversion gain at DC and at all even harmonics of $f_m$. Furthermore, because the current value of the output voltage ($V_o[k]$) depends on the input voltage as well as the previous value of the output voltage ($V_o[k-1]$), the baseband frequency response of circuit 800 exhibits infinite impulse response (IIR) characteristics. The IIR effect may be the result of charge sharing between $C_i$ and the output capacitor $C_{out}$, and may cause the bandwidth of circuit 800 to decrease as $C_{out}$ increases, even if the source resistance ($R_S$) and switch resistances ($R_{SW}$) are negligibly small, (i.e. equation (6.1) is satisfied). Although not included herein, using the same assumptions as above, similar expressions may be derived for circuits 820 and 840.

Figure 35:
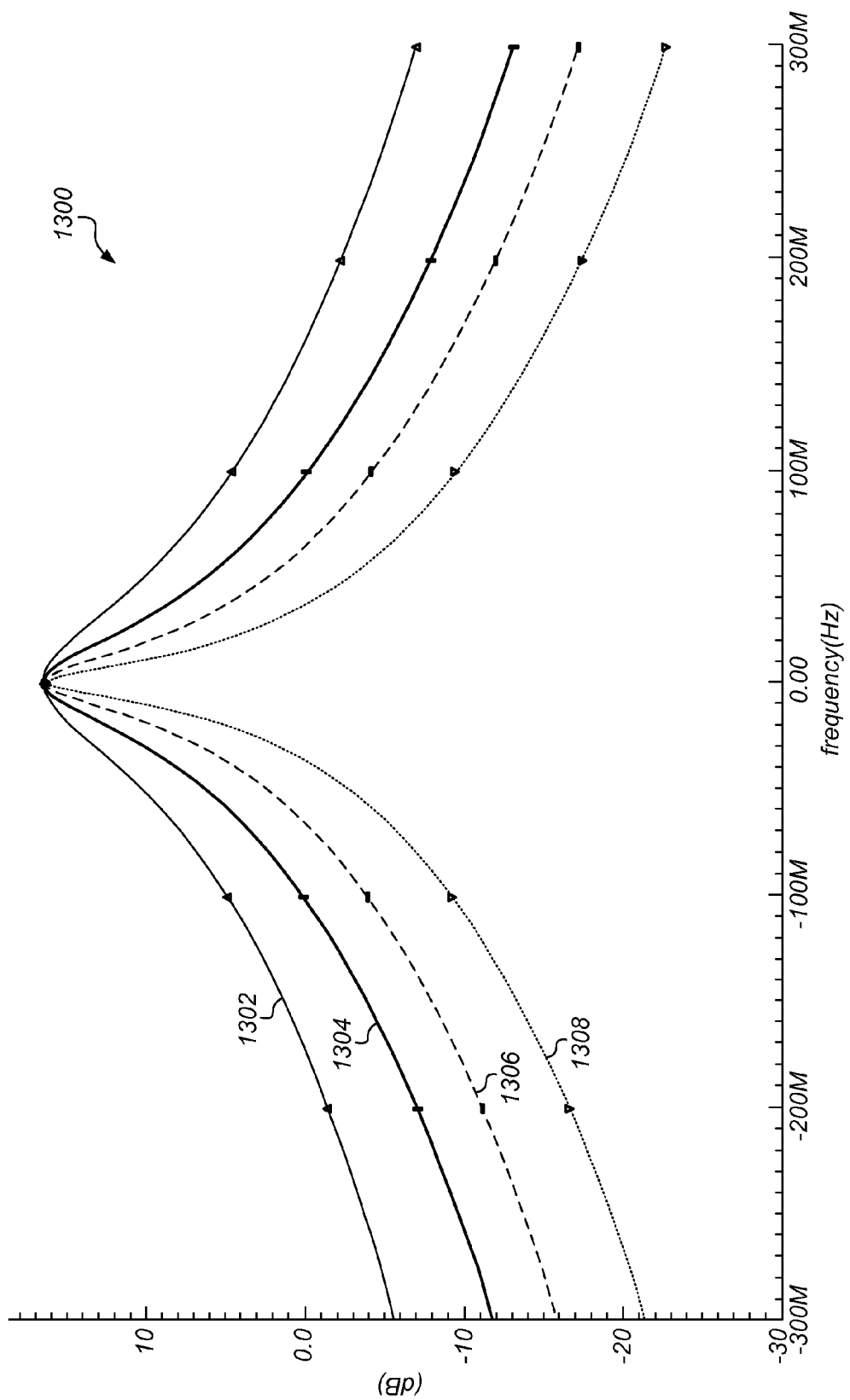
FIG. 35 shows period AC response waveforms obtained from simulation of the embodiment of the switching circuit shown in FIG. 14 configured using NMOS transistors for the switches, and operated according to the waveforms shown in FIG. 34.

In one set of embodiments, circuit 820 may be implemented using NMOS transistor for the switches, with five switches ($S_{ij}$) and five capacitors ($C_i$), i.e. with n=4. The NMOS transistors, which may be fabricated using a 65 nanometer (nm) process, may be sized to achieve an on-resistance (i.e. the value of $R_{SW}$ when the transistor turns on) of about 80 Ohms ($\Omega$) each. FIG. 34 shows the transient voltage waveforms $\phi_1$ (1202) and $\phi_2$ (1200) used to enable and disable the NMOS switches within circuit 820. FIG. 35 shows a plot of the simulated periodic AC (PAC) response of the implementation of circuit 820 described above. The Y axis represents the voltage gain in dB and the X axis represents the output frequency in Hz. The input frequency was swept from 700 MHz to 1.3 GHz, with the LO frequency ($f_m$) set to 1 GHz. The simulation was performed using Cadence Design Systems' Spectre Circuit Simulator with the SpectreRF option, with BSIM4 device models (Version 4 of the Berkeley Short-channel insulated-gate FET (IGFET) device models), a source resistance $R_S$ value of 50$\Omega$, and source capacitance $C_S$ value of 2 pico-Farads (pF). The output capacitor $C_{out}$ was swept from 400 femto-Farads (fF) up to 3.2 pF, to illustrate the bandwidth reduction due to charge sharing. Accordingly, curve 1302 represents the periodic AC response for $C_{out}$=400fF, curve 1304 represents the periodic AC response for $C_{out}$=800 fF, curve 1306 represents the periodic AC response for $C_{out}$=1.6 pF, and curve 1308 represents the periodic AC response for $C_{out}$=3.2 pF.

The practical limits on the magnitude of the conversion gain achievable with circuits 800, 820, and 840 depend upon the bandwidth for a given application, as well as the quality of the circuit's constituent components. For example, the bottom-plate parasitic of each capacitor and the parasitic capacitances associated with each switch may reduce the bandwidth and/or conversion gain below their ideal values. For embodiments of circuits 800, 820, and 840 implemented using CMOS transistors, these limitations may be partially overcome through the use of finer geometries, which may reduce the parasitic capacitances associated with the switches, and the use of capacitors having low bottom-plate parasitics, such as metal-insulator-metal (MIM) capacitors.

Figure 18:
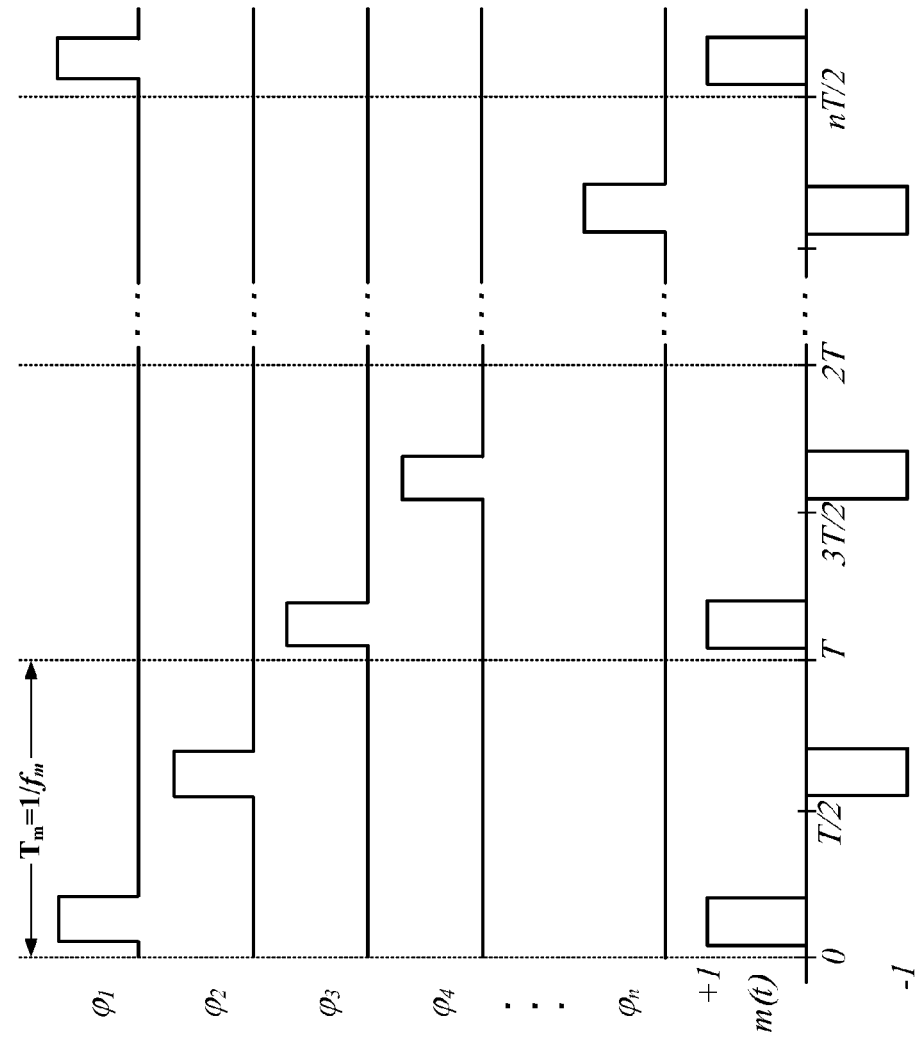
FIG. 18 shows examples of the sampling waveforms and an approximated version of the effective resultant mixing function, associated with the circuit shown in FIG. 17.
Figure 17:
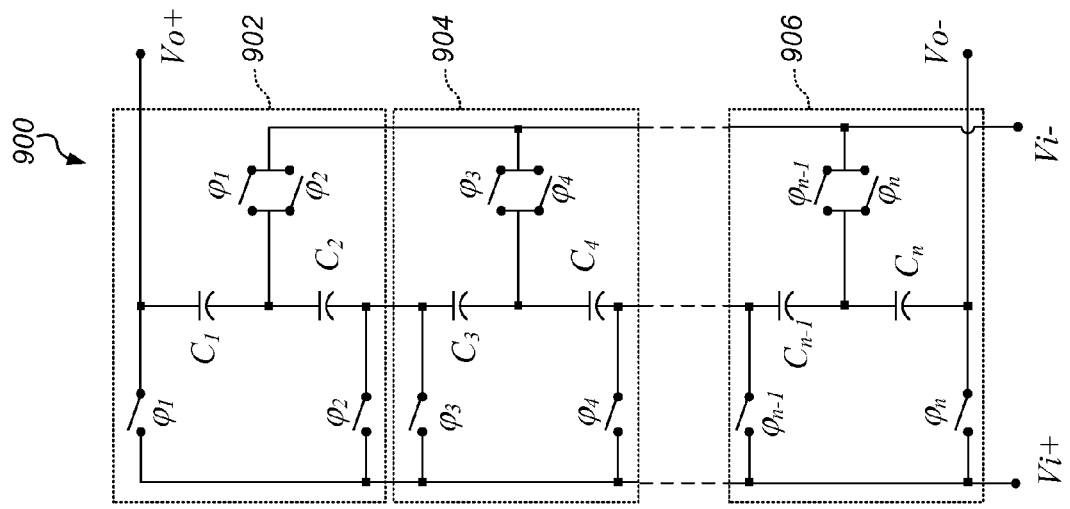
FIG. 17 shows a circuit diagram of one embodiment of an (n/2)-stage PFTWG with multi-phase sequential switching.

FIG. 17 shows one embodiment of a PFTWG circuit 900 that uses multi-phase sequential switching. Circuit 900 performs passive frequency translation with voltage gain using a different structure than circuits 800, 820, and 840. Circuit 900 may also be combined with a bandpass filter tuned near the LO frequency, to obtain performance improvements. As seen in FIG. 17, circuit 900 is constructed from n/2 (where n is an even integer) number of stages (902-906), the output of each stage coupled to the input of a subsequent stage, with the exception of the last stage, the output of which is used to provide the output of PFTWG circuit 900. Circuit 900 may be capable of achieving superior noise performance to circuits 700, 750, 800, 820, and 840 by performing only a single sampling operation on the signal from input to output. The overall structure of circuit 900 features a fixed stack of capacitors $C_i$ arranged such that voltage samples collected on each individual capacitor $C_i$ are summed at the output ($V_o$+ and $V_o$-). As shown in the timing diagram of FIG. 18, the RF input is sampled onto just one of the n capacitors on every half-cycle of the LO. Hence, the number of sampling phases delivered from the LO circuitry (e.g. from CSG circuit 654 shown in FIG. 7) is equal to n, and each sample is stored and held on a capacitor for n−1 half-cycles of the LO before the voltage on the capacitor is refreshed. Similar to circuits 800, 820, and 840, the polarity of the RF input signal may be flipped every half-cycle of LO in order to implement a DC balanced mixing function m(t) (as also shown in FIG. 18).

The maximum voltage gain of circuit 900 is n (V/V), and assuming incomplete settling, the gain has a sampling duty-cycle dependence approximated by the following equation (11):

$$G_c = n \cdot \frac{\sin(\pi D)}{m \cdot \pi D}, \qquad (11)$$

where n is an even integer. While the general operating principle of circuit 900 is applicable to any integer value of n, even-values of n may result in a much simpler and more practical implementation. For the purpose of illustration and derivation, it is useful to examine the behavior of circuit 900 when the input signal does settle completely in a single sampling window (equation (12) below). When the source resistance ($R_S$) and switch resistances ($R_{SW}$) are sufficiently small for the signals to completely settle during each sampling window, the effective circuit time constant ($\tau_S$) may be related to the duty-cycle and frequency of the LO as shown in the following equation (12):

$$\tau_S = (R_S + 2R_{SW}) \cdot C_S \ll \frac{D}{f_m}, \qquad (12)$$

where $C_1 = C_2 = \ldots = C_n = C_S$.

In this case, the voltage on each capacitor $C_i$ within circuit 900 tracks the input during clock phase $\phi_i$, and this voltage is held on $C_i$ until it is refreshed on $\phi_{i+n}$. If equation (12) is satisfied, the output voltage may be approximated as a function of the input voltage using the following discrete-time difference equation (13):

$$V_o[k] = (-1)^{k*}(V_i[k] - V_i[k-1] + V_i[k-2] \ldots - V_i[k-(n-1)]), \qquad (13)$$

where the sampling frequency is $2*f_m$. The term $(-1)^k$ in equation (13) accounts for the toggling polarity of the input voltage, resulting in circuit 900 performing frequency translation with a DC balanced m(t). As a result, circuit 900 may achieve a maximum conversion gain for input frequencies near $f_m$, and may have zero conversion gain at DC, and at all even harmonics of $f_m$.

Because the output of circuit 900 depends on the last n collected samples, with each sample having equal weight (or weighted equally), the frequency response exhibits zero-amplitude notches occurring at the input frequencies given by the following equation (14):

$$f_{in} = f_m \cdot \left(1 \pm \frac{2}{n}\right). \tag{14}$$

However, if equation (12) is not satisfied, as will typically be the case in the context of the present disclosure, that is, when the signals do not completely settle during each sampling window, the bandwidth of circuit 900 may decrease as $\tau_S$ increases. In this case, the relationship between the input signal and output signal may become significantly more complex than what is provided in equation (13), but the maximum achievable gain, the balanced mixing function, and the zero-amplitude notches may still be preserved.

Figure 36:
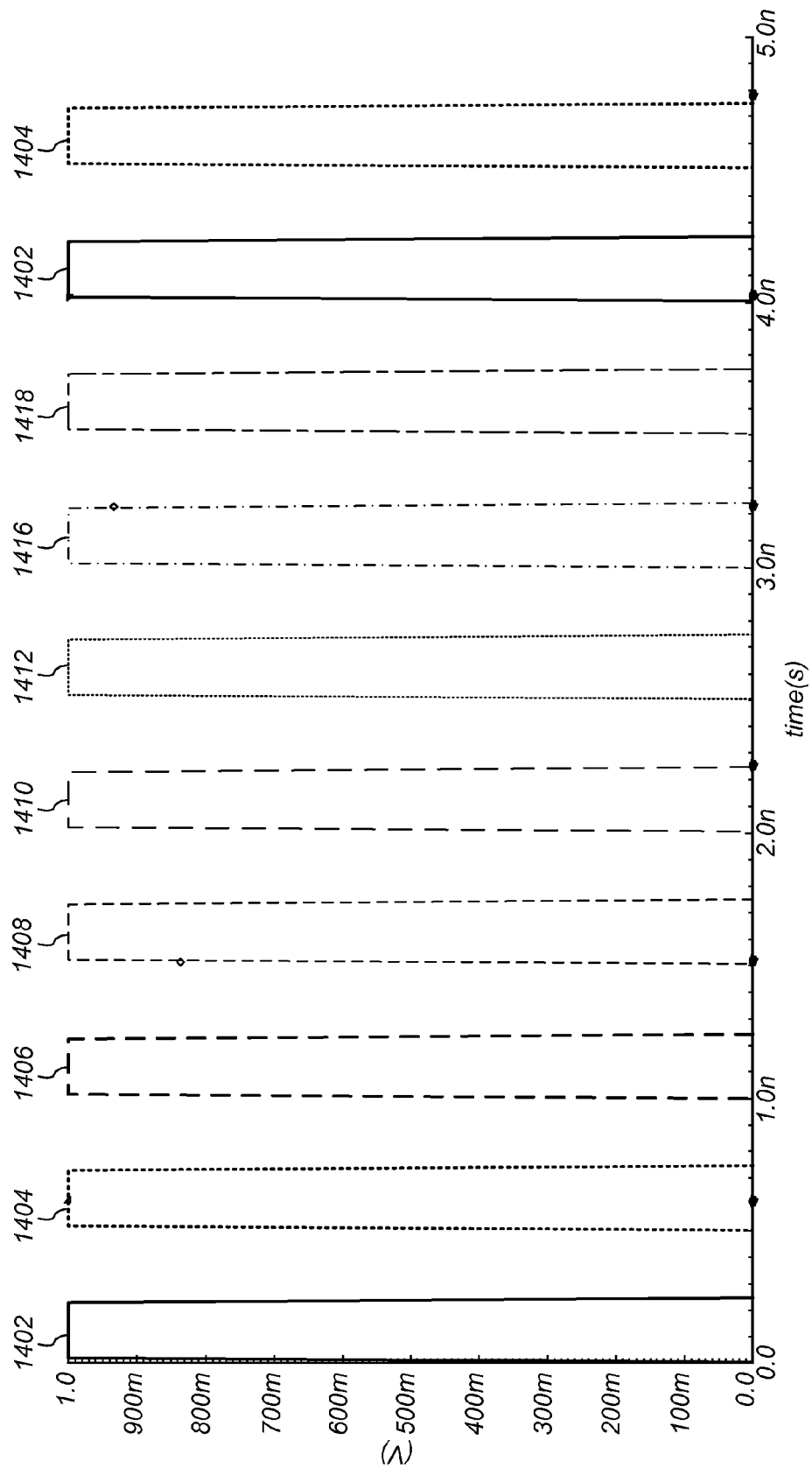
FIG. 36 shows transient periodic voltage waveforms of the clock signals (phase1-phase8) used for operating one embodiment of the switching circuit shown in FIG. 17 configured using NMOS transistors for the switches with a value of n=8.
Figure 37:
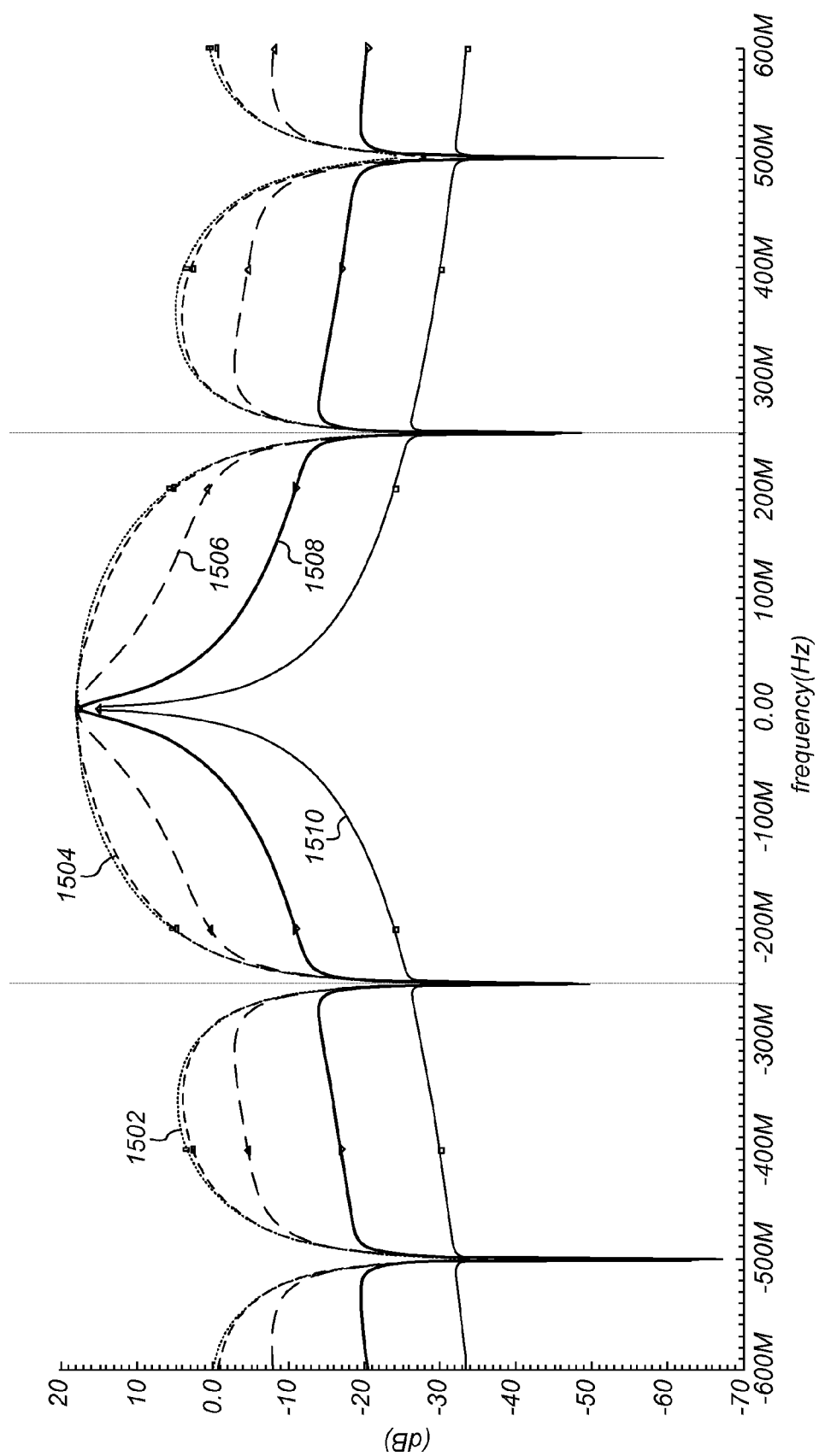
FIG. 37 shows period AC response waveforms obtained from simulation of the embodiment of the switching circuit shown in FIG. 17 configured using NMOS transistors for the switches with a value of n=8, and operated according to the waveforms shown in FIG. 36.

The impact of increasing $\tau_S$ (i.e. effecting incomplete signal settling) on the frequency response of circuit 900 is illustrated in FIG. 37, which shows the simulation results of the periodic AC (PAC) response of one embodiment of circuit 900 implemented using NMOS transistors, with n=8. More specifically, the switches in circuit 900 may be implemented with NMOS transistors having 65 nm gate length, and controlled by the eight input clock signals $\phi_1$-$\phi_8$ whose voltage waveforms are shown in FIG. 36, in which waveforms 1402-1408 respectively represent clock signals $\phi_1$-$\phi_8$. The simulation was again performed using SpectreRF with BSIM4 device models. The X-axis in FIG. 37 represents the output frequency of the circuit, ranging from −600 MHz to +600 MHz, corresponding to an input frequency sweep from 400 MHz to 1600 MHz, where $f_m$=1000 MHz. The Y-axis in FIG. 37 represents the voltage gain in dB. The value of the source resistor $R_S$ was swept from 1Ω to 500Ω, to demonstrate the impact of increasing $\tau_S$ on the overall transfer function of the circuit. As predicted by equation (14), the magnitude of the transfer function exhibits sharp dips for input frequencies of 750 MHz and 1250 MHz, corresponding to output frequencies of +/−250 MHz. PAC response curve 1502 corresponds to an $R_S$ value of 1Ω, PAC response curve 1504 corresponds to an $R_S$ value of 4.729Ω, PAC response curve 1506 corresponds to an $R_S$ value of 22.36Ω, PAC response curve 1508 corresponds to an $R_S$ value of 105.7Ω, and PAC response curve 1510 corresponds to an $R_S$ value of 500Ω.

One undesired effect of circuit 900 is the transfer function of the differential RF signal input to the common-mode level of the output signal. To minimize common-mode swing at the output, the input of circuit 900 may be driven from a differential source having very high common-mode impedance to ground, while the output of circuit 900 may be configured to have low common-mode impedance to ground at high frequencies. As a result, circuit 900 may be particularly sensitive to common-mode input capacitance, especially as n becomes large. However, various embodiments of circuit 900 may still operate as low-power, low-noise PFTWGs.

Figure 19:
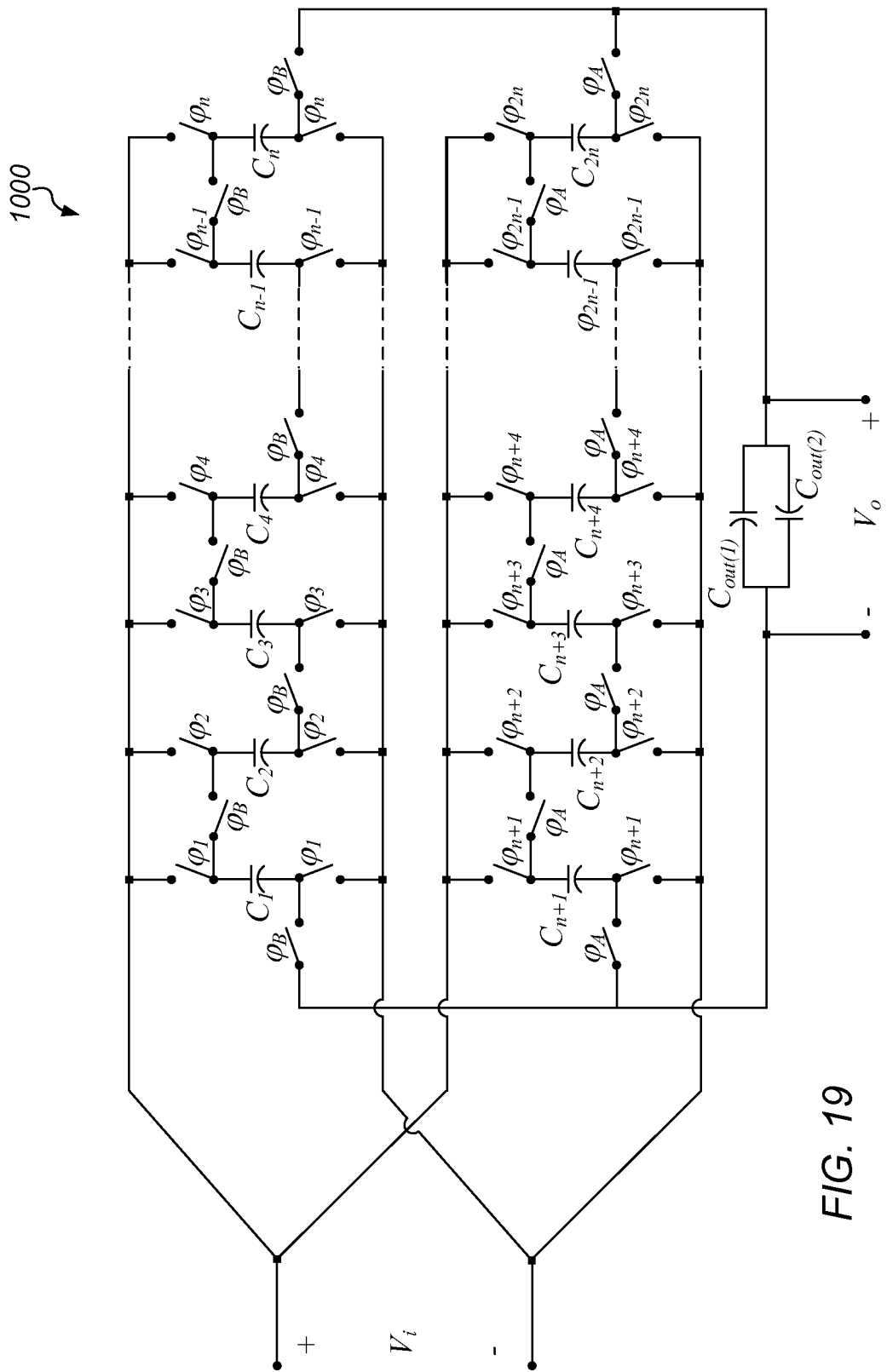
FIG. 19 shows a circuit diagram of one embodiment of an n-stage PFTWG with multi-phase sequential switching and reduced output refresh rate, having a parallel output connection.
Figure 20:
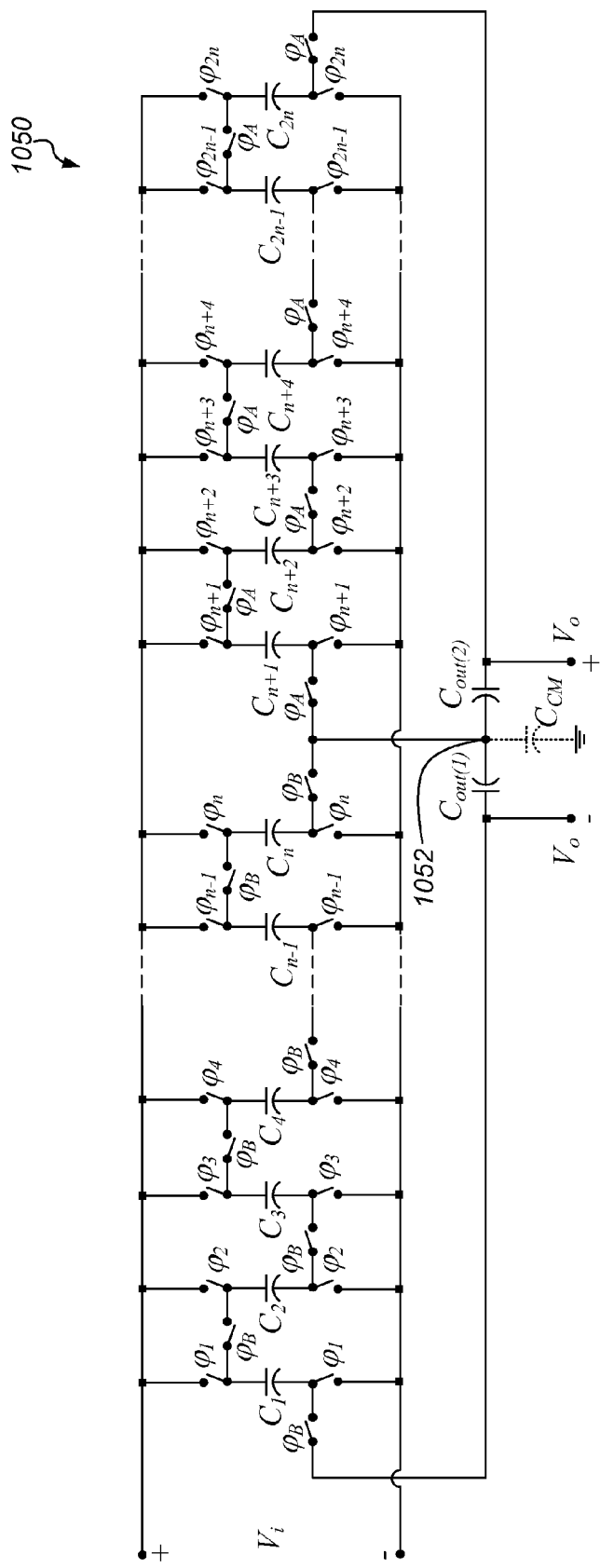
FIG. 20 shows a circuit diagram of one embodiment of an n-stage PFTWG with multi-phase sequential switching and reduced output refresh rate, having a series output connection.
Figure 21:
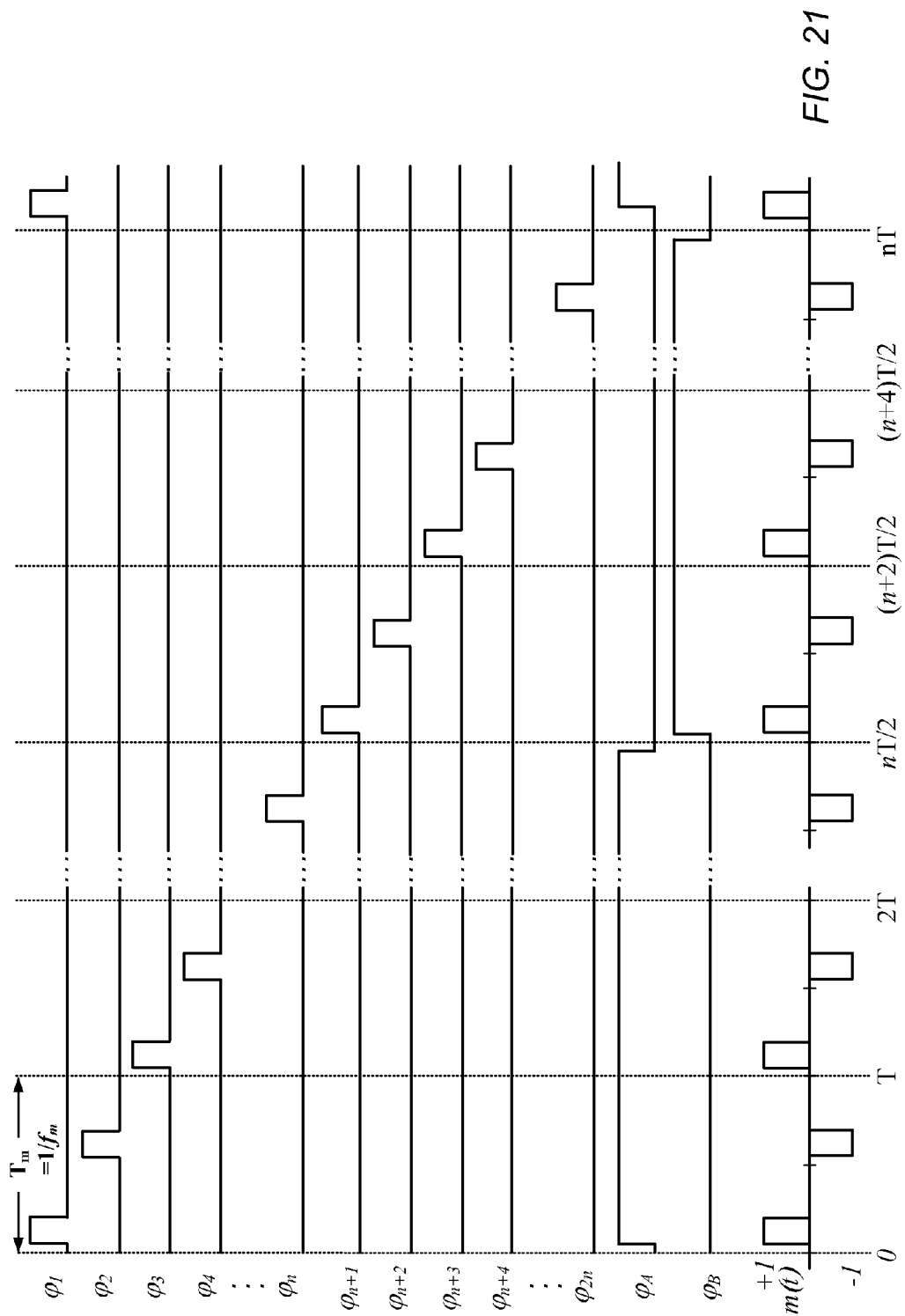
FIG. 21 shows examples of the sampling waveforms and an approximated version of the effective resultant mixing function associated with the circuits shown in FIGS. 19 and 20.

FIG. 19 shows one embodiment of a PFTWG circuit 1000 that uses multi-phase sequential switching with a reduced output refresh rate, configured with a parallel output connection. FIG. 20 shows another embodiment of a PFTWG circuit 1050 that uses multi-phase sequential switching with a reduced output refresh rate, but is configured with a series output connection. Circuits 1000 and 1050 perform passive frequency translation with voltage gain using a different structure than circuits 800, 820, 840, and 900. In circuits 1000 and 1050, the input voltage is captured at a rate of $2*f_m$, and the output voltage is refreshed at a frequency that is n times lower (i.e. $2f_m/n$). Circuits 1000 and 1050 may also be combined with a bandpass filter tuned near the LO frequency, to obtain performance improvements. FIG. 21 shows the timing waveforms for one embodiment of the clock signals (which may be generated by CSG circuit 654, for example) used to control circuits 1000 and 1050, and also shows the waveform of the resultant mixing function m(t).

Once again, assuming the signals do not completely settle during each sampling window, the relationship between 0 Hz (zero Hz) offset conversion gain and the duty-cycle of the LO may expressed as the following equation (15):

$$G_c = n \cdot \frac{\sin(\pi D)}{m \cdot \pi D}, \tag{15}$$

or circuit 1000 (producing a parallel output), and as the following equation (16):

$$G_c = 2n \cdot \frac{\sin(\pi D)}{m \cdot \pi D}, \tag{16}$$

for circuit 1050 (producing a series output).

Circuit 1000 is configured with 6n+2 switches 2n+1 capacitors for producing parallel output, and circuit 1050 is configured with 6n+2 switches and 2n+2 capacitors to produce a series output. As shown in the timing diagram of FIG. 21, the RF input voltage is captured and stored onto just a single capacitor $C_i$ at every half-cycle of LO. Circuits 1000 and 1050 are each operated with a total of 2n sampling phases ($\phi_1$-$\phi_{2n}$), and two evaluate phases ($\phi_A$ and $\phi_B$), each having a fundamental frequency of $f_m/n$. During sampling phases $\phi_1$-$\phi_n$, capacitors $C_1$-$C_n$ remain disconnected from the output holding capacitor $C_{out}$, as each capacitor captures the input voltage during its respective sampling phase. At the end of the n-th phase, the switches driven by $\phi_B$ operate to couple capacitors $C_1$-$C_n$ to $C_{out}$ in an anti-series configuration as shown in FIGS. 19 and 20. The same procedure is then applied to capacitors $C_{n+1}$-$C_{2n}$ on sampling phases $\phi_{n+1}$-$\phi_{2n}$, and evaluate phase $\phi_A$ with complementary timing, as shown in FIG. 21.

As a result of the anti-series connection described above, circuits 1000 and 1050 affect frequency translation with a DC balanced mixing function m(t). In addition, because circuit 1000 combines the last n captured input samples, and circuit 1050 combines the last 2n captured input samples before refreshing the output voltage, the output refresh rate is reduced to $2f_m/n$ for circuit 1000, and $f_m/n$ for circuit 1050. For the purpose of illustration and derivation, it is useful to examine the behavior of circuits 1000 and 1050 when the input signal does settle completely in a single sampling window. Although in practice the values of the LO frequency, source resistance ($R_S$), and switch resistance ($R_{SW}$) typically prevent the input voltage from completely settling onto $C_i$ during a given LO phase $\phi_i$, a compact difference equation relating the output voltage to the input voltage may also be obtained for the case of complete settling, because even with the simplifying assumption of complete settling, the difference equation still adequately characterizes certain fundamental behaviors of circuits 1000 and 1050, such as frequency translation about $f_m$, and the appearance of nulls in the baseband output transfer function.

Assuming that each switch in circuits 1000 and 1050 has an on-resistance $R_{SW}$ (i.e., the effective resistance of the switch when it turns on is $R_{SW}$), capacitors $C_1$-$C_{2n}$ in circuits 1000 and 1050 all have an equal capacitance value of $C_S$, and equation (12) is satisfied, the difference equation for circuit 1000 may be given as the following equation (17):

$$V_o[k] = \frac{\frac{C_S}{n} \sum_{j=0}^{n-1} ((-1)^j \cdot V_i[nk-j]) + C_{out} \cdot V_o[k-1]}{\frac{C_S}{n} + C_{out}}. \quad (17)$$

The term $(-1)^j$ in equation (17) reflects the anti-series configuration of the capacitors $C_i$ as they are connected to $C_{out}$, and may affect frequency translation from the input to the output about the LO frequency $f_m$. Equation (17) also captures the IIR response of circuit 1000 resulting from charge sharing between $C_i$ and $C_{out}$. Therefore, as the value of $C_{out}$ is increased relative to $C_i$ (i.e. relative to $C_S$), the output bandwidth of circuit 1000 may decrease. The summation term in equation (17) captures the dependence of the output voltage on the last n voltages that were captured from the input source and stored on the respective capacitors. As a result, a first null in the baseband output transfer function coinciding with the input frequencies $f_{in}$ may be expressed by the following equation (18):

$$f_{in} = f_m \cdot \left(1 \pm \frac{2}{n}\right). \quad (18)$$

Under the same set of assumptions as given above, an approximate difference equation for circuit 1050 may be obtained according to the following equation (19):

$$V_o[k] = \frac{\frac{C_S}{2n} \sum_{j=0}^{2n-1} ((-1)^j \cdot V_i[2nk-j]) + \frac{C_{out}}{2} \cdot V_o[k-1]}{\frac{C_S}{2n} + \frac{C_{out}}{2}}. \quad (19)$$

Equation (19) essentially models the same behaviors as equation (17), such as frequency translation, output refresh rate reduction, and IIR effects due to charge sharing. The difference between equations (17) and (19) results from the fact that the output voltage of circuit 1050 depends on the last 2n voltages captured from the input, whereas the output voltage of circuit 1000 depends on the last n voltages captured from the input. Therefore, the first nulls in the baseband output transfer function for circuit 1050 occur at lower offset frequencies, and circuit 1050 also achieves twice the conversion gain of circuit 1000. The first null in the baseband output transfer function for circuit 1050 may be expressed as the following equation (20):

$$f_{in} = f_m \cdot \left(1 \pm \frac{1}{n}\right). \quad (20)$$

Figure 38:
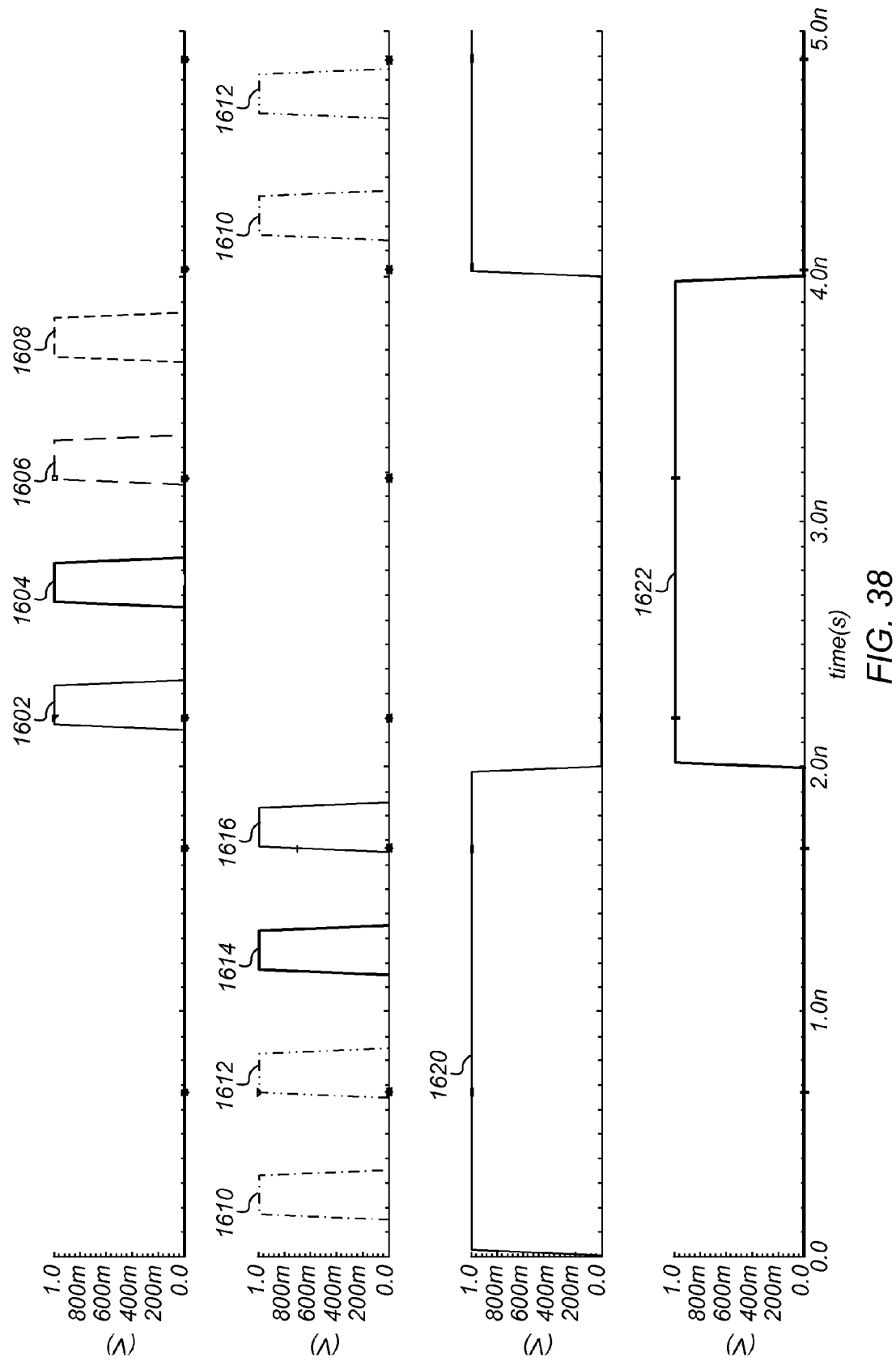
FIG. 38 shows transient periodic voltage waveforms of the clock signals for the sampling and evaluation phases used for operating one embodiment of the switching circuit shown in FIG. 20 configured using NMOS transistors for the switches with a value of n=4.
Figure 39:
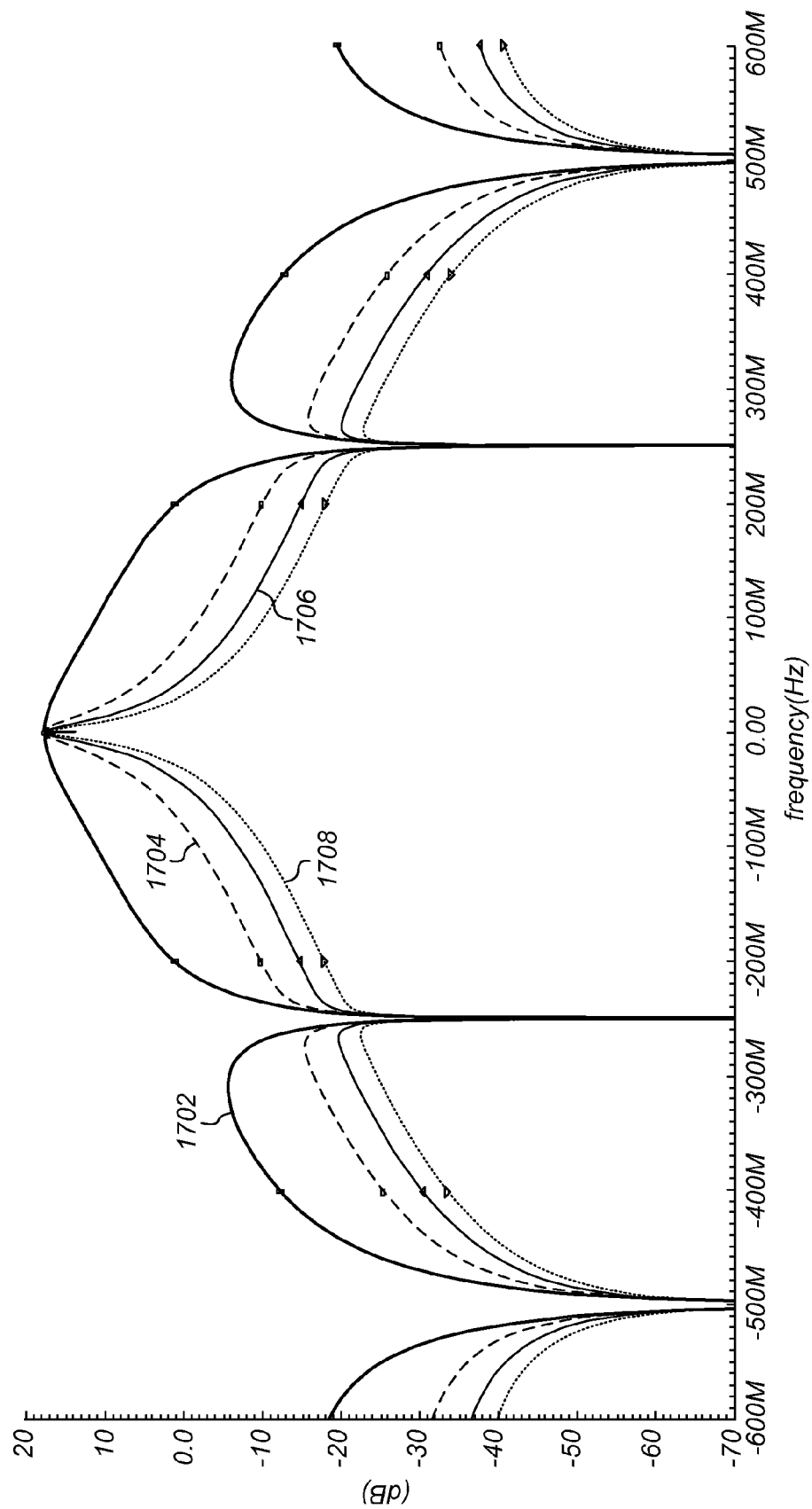
FIG. 39 shows period AC response waveforms obtained from simulation of the embodiment of the switching circuit shown in FIG. 20 configured using NMOS transistors for the switches with a value of n=4, and operated according to the waveforms shown in FIG. 38.

Similar to circuits 800, 820, 840, and 900, embodiments of circuits 1000 and 1050 may include switches implemented with NMOS transistors. To illustrate operation of circuits 1000 and 1050, circuit 1050 may be specified with NMOS transistors for the switches, with n=4. The value source resistor $R_S$ may be set to 50Ω, and the gate width of the 65 nm NMOS transistors may be chosen to achieve an on-resistance ($R_{SW}$) value of approximately 10Ω. FIG. 38 shows example sampling waveforms that may be used in simulating this implementation of circuit 1050. As shown in FIG. 38, waveforms 1602-1616 represent input clock signals 1-8, that is $\phi_1$ through $\phi_8$, respectively, waveform 1620 represents evaluation phase $\phi_A$, and waveform 1622 represents evaluation phase $\phi_B$. FIG. 39 shows a plot of the periodic AC (PAC) response of the circuit, again computed using SpectreRF and BSIM4 device models. The X-axis represents the output frequency of the circuit, ranging from −600 MHz to +600 MHz, corresponding to an input frequency sweep from 400 MHz to 1600 MHz, with $f_m$=1000 MHz (1 GHz).

The value of the two output capacitors $C_{out}$ (shown as $C_{out(1)}$ and $C_{out(2)}$ in FIG. 20) were swept from 50fF to 2 pF, to demonstrate the reduction of bandwidth due to increased charge sharing between capacitors $C_1$-$C_8$ and the output capacitors ($C_{out}$). As predicted by equation (20), the magnitude of the transfer function has sharp nulls, or dips, for input frequencies of 750 MHz and 1250 MHz, corresponding to output frequencies of +/−250 MHz. As shown in FIG. 39, waveform 1702 represents the PAC response of the circuit for an output capacitor value of 50 fF, waveform 1704 represents the PAC response of the circuit for an output capacitor value of 700 fF, waveform 1706 represents the PAC response of the circuit for an output capacitor value of 1.35 pF, and waveform 1702 represents the PAC response of the circuit for an output capacitor value of 2 pF. Since the connection of capacitors $C_1$-$C_{2n}$ to $C_{out}$ has no common-mode reference point, the common-mode output voltage of circuit 1050 may not be well defined. To minimize common-mode swing at the output, circuit 1050 may be modified by connecting a single capacitor from node 1052 connecting the two output capacitors $C_{out(1)}$ and $C_{out(2)}$ to ground (or to another reference potential), shown as capacitor $C_{CM}$ in FIG. 20.

Practical limits on the magnitude of the conversion gain achievable with circuits 1000 and 1050 largely depends on the bandwidth for a given application, in addition to the quality of the actual circuit components. For example, the bottom-plate parasitic of each capacitor and the various parasitic capacitors associated with each switch generally reduces bandwidth and/or conversion gain below the ideal, or nominal (calculated and/or expected) values. In the case of embodiments in which the switches are implemented using CMOS transistors, these limitations may be somewhat relaxed by using finer geometries to reduce switch parasitics, and by using capacitors with low bottom-plate parasitics, such as metal-insulator-metal (MIM) capacitors.

FIG. 22a shows another n-stage embodiment of a PFTWG. More specifically, FIG. 22a shows a circuit 950 depicting an n-stage zigzag PFTWG having a single-ended input. Circuit 950 has a single-ended input and may have either a single-ended or differential output. The single-ended input/output circuit comprises 2n switches and 2n capacitors. The circuit symbol for circuit 950 is shown in FIG. 22b, and FIG. 22c shows one embodiment of a single-ended input/differential output circuit implementation 951, using two instances of circuit 950 as shown. Because two instances of circuit 950 are used in constructing single-ended input/differential output circuit 951, it may comprise 4n switches and 4n capacitors. Both circuits 950 and 951 may operate with a 2-phase input clock.

As previously discussed for conventional voltage-mode passive mixers, single-ended to differential conversion allows an effective doubling of voltage gain by generating two output signals with an anti-phase relationship and using them as positive and negative inputs to a differential circuit (note again that this does not represent a net voltage gain, however). Hence, the maximum voltage gain of circuit 950 will be 2n for the single-ended output circuit and 4n for the differential output circuit. The input labeled $V_{ref}$ is a DC bias voltage provided as a reference potential for the output signal $V_o$. Signal ground (GND) may be used for biasing $V_{ref}$, but other voltages may equally be used, provided they do not prevent proper operation of the switches within circuit 950. Furthermore, because the input $V_i$ is only connected to circuit 950 through capacitors, the DC level of $V_i$ and $V_o$ may remain independent. This DC biasing flexibility is one distinct advantage of circuit 950 and any variants incorporating circuit 950, or versions thereof. FIG. 22d shows examples of the sampling waveforms and an approximated version of the effective resultant mixing function associated with the circuits shown in FIGS. 22a-22c.

Assuming incomplete settling, as expressed in the following equation (21), $$\tau_S = \left(R_S + \frac{R_{SW}}{n}\right) \cdot \frac{n \cdot C_S}{2} \gg D \cdot f_m, \quad (21)$$

the conversion gain $G_c$ at small frequency offsets may be approximated as a function of the duty-cycle D of the sampling signal, as shown in equations (22) for a single-ended output as shown in the following equation (22), $$G_c = 2n \cdot \frac{\sin(\pi D)}{\pi D}, \quad (22)$$

and in the following equation (23) for a differential output:

$$G_c = 4n \cdot \frac{\sin(\pi D)}{\pi D}. \quad (23)$$

The conversion gain of an NMOS implementation of circuit 950 may be tracked versus frequency offset from $f_m$, for various values n and $\tau_S$. The NMOS switches may be configured with equal dimensions (hence, equal resistance $R_{SW}$) and the capacitors may be configured with equal $C_S$ values. The bandwidth of circuit 950 decreases as n, and thus voltage gain, is increased. This reduction occurs even for small values of $\tau_S$, due to charge sharing between stages within the circuit. Higher order (e.g. n>1) variations of circuit 950 may rely upon multiple charge sharing stages to generate voltage gain, resulting in slower settling and thus, reduced bandwidth as gain increases. This gain-bandwidth tradeoff is also consistent with the effects of power conservation, which predicts passive voltage gain being accompanied by an increase in impedance.

Figure 23:
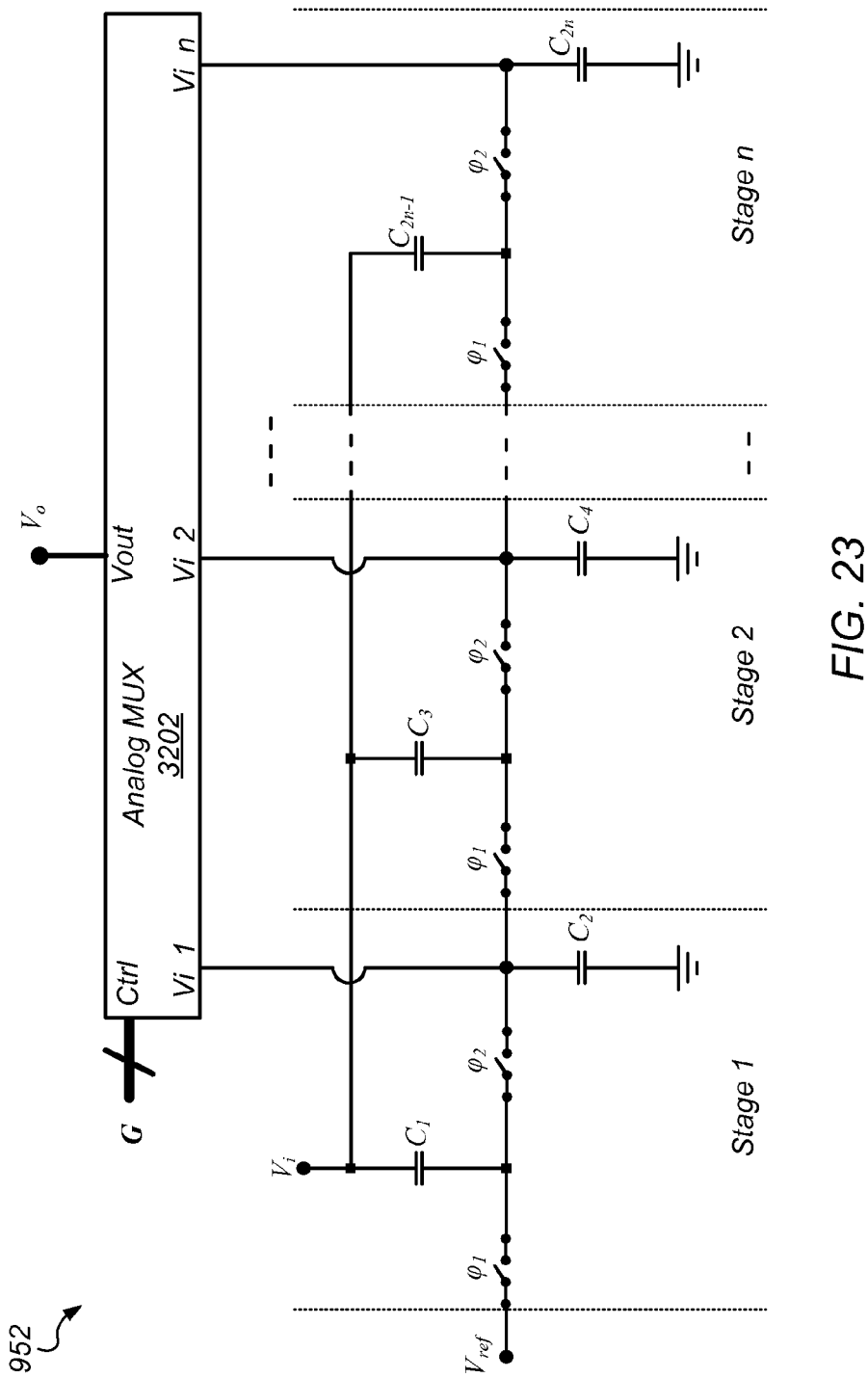
FIG. 23 shows one embodiment of a single-ended input/output zigzag PFTWG, with programmable gain implemented with an analog multiplexer.

The variation of bandwidth as a function of voltage gain in circuit 950 may need to be addressed when programmable gain is desired. For example, some embodiments may be directed to designs in which the bandwidth is held constant and independent of voltage gain. There may be at least two methods for dealing with bandwidth variation. A first, simpler method may build upon the fact that the voltage at the internal nodes of circuit 950 may remain in phase with the output node, but having lower amplitude. Furthermore, since each even numbered node $V_n$ carries a baseband signal with substantially zero RF content, the effective voltage gain may be varied by using an analog multiplexer, for example, to select the node $V_n$ with the appropriate signal amplitude. This is illustrated in FIG. 23, which shows one embodiment of a single-ended input/output zigzag PFTWG, with programmable gain implemented with an analog multiplexer, where the input labeled G may be a multi-bit digital control signal used to select the desired node within circuit 950. Using this method, all nodes in the circuit may remain active, independent of gain setting. Thus, nonlinear compression may occur, for example, at node $V_8$ and, due to interstage loading, and may introduce distortion products at node $V_2$, even if $V_2$ is far from its own compression point.

In one set of embodiments, to prevent premature distortion in low gain modes, the portion of the circuit dedicated to generating a higher gain than the desired value may be disabled. This may be accomplished using distributed LO drive circuitry with separate branches that may be independently disabled. The bandwidth in various gain modes may be equalized by adding output load capacitance as gain is decreased. This programmable gain method is illustrated by way of circuit 960 in FIG. 28b, and will be further discussed below. In some implementations, the effect of parasitic bottom-plate capacitance and switch parasitics on circuit performance may also become a factor. Both the switch parasitics and bottom-plate parasitics of each odd-numbered sampling capacitor appears in parallel with the RF signal input, resulting in an RC low-pass at the input. If this low pass corner is comparable to, or lower than the frequency of the input signal, performance of the circuit may be degraded significantly by the signal attenuation. One effective way to decrease sensitivity to this parasitic is to incorporate the capacitance into a resonant LC network tuned to $f_m$ at the input of the mixer circuit. Aside from reducing parasitic sensitivity, the LC network may bring an added performance benefit by filtering out noise and interfering signals/entities near harmonics of $f_m$ that would otherwise be downconverted to baseband, and therefore contributes additional output noise.

Figure 24B:
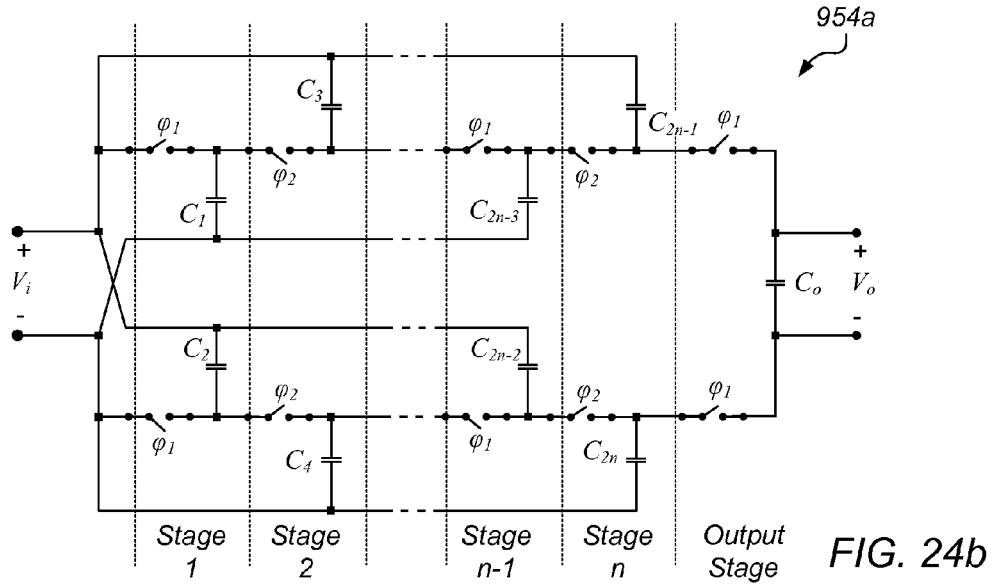
FIG. 24b shows the circuit diagram of one embodiment of a fully differential n-stage zigzag PFTWG when n is an even number.
Figure 24C:
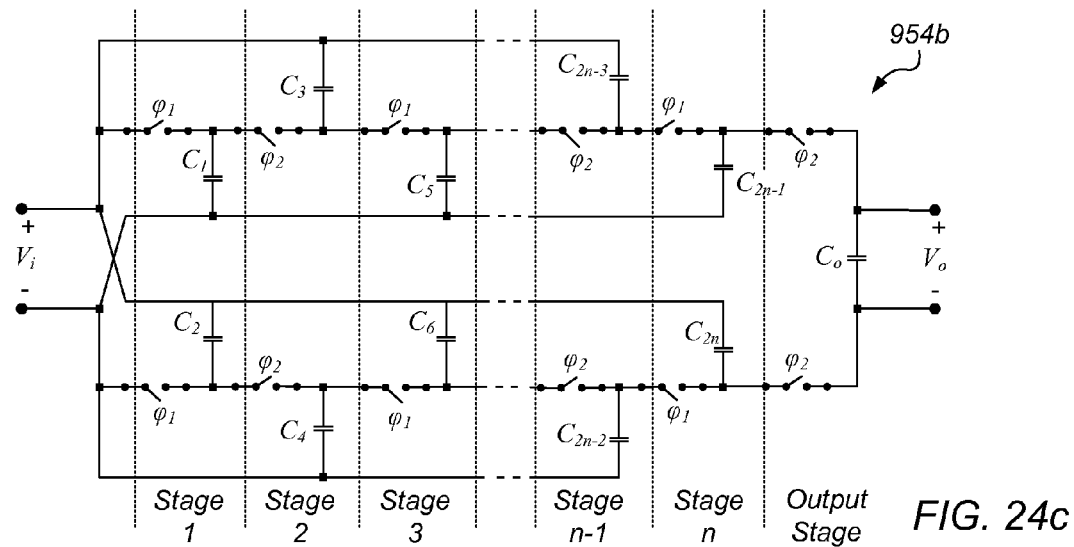
FIG. 24c shows the circuit diagram of one embodiment of a fully differential n-stage zigzag PFTWG when n is an odd number.
Figure 24A:
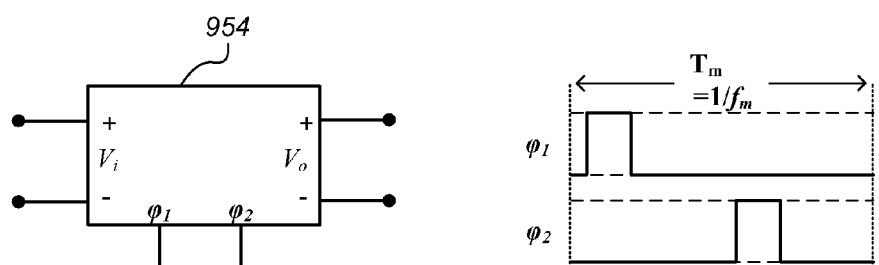
FIG. 24a shows the circuit symbol of one embodiment of a fully differential n-stage zigzag PFTWG.
Figure 24D:
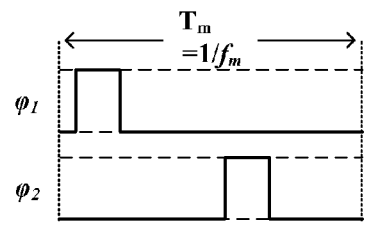
FIG. 24d shows examples of the sampling waveforms for the n-stage zigzag PFTWGs from FIGS. 24a-24c.

Single-ended input/output and single-ended input to differential output versions of circuit 950 have been discussed in some detail above. A differential input may also be obtained through minor modifications, resulting in a slightly different voltage gain for a given number of stages. The primary difference in circuit topology may be seen in the output stage. The modifications may be motivated by the fact that due to the differential RF input, all nodes within the circuit are exposed to the RF signal. In order to extract a low frequency, or baseband signal with substantially zero RF content, the output capacitor may be referenced to a non-RF node, such as ground, or driven differentially, as illustrated by circuit 954 in FIGS. 24a-24c. Specifically, FIG. 24a shows the circuit symbol collectively referencing embodiments 954 of a fully differential n-stage zigzag PFTWG, with FIG. 24b showing one embodiment 954a of circuit 954 when n is an even number, and FIG. 24c showing one embodiment 954a of circuit 954 when n is an odd number. Examples of the sampling waveforms that may be used for the n-stage zigzag PFTWGs 954 are shown in FIG. 24d. Each numbered stage of circuit 954 may contribute a gain of up to 2 V/V, while the output stage may add a gain up to 1 V/V. Hence, the fully differential circuit 954 may achieve a maximum voltage gain of 2n+1.

Though circuit 954 is shown having differential inputs and outputs, and appears symmetric statically with respect to the input and output, it is not fully symmetric dynamically with respect to the two sampling phases $\phi_1$ and $\phi_2$. For example, for a 1-stage implementation of circuit 954, the maximum conversion gain is 2n+1=3. Stage 1 samples on $\phi_1$, storing the downconverted baseband signal on $C_1$ and $C_2$ with a gain of up to 2 V/V. The output stage captures both the baseband signal and the differential RF signal on $\phi_2$, and store the result on $C_o$. The output stage, sampling on $\phi_2$, further increases the conversion gain by up to 1 V/V, while producing a baseband output signal with substantially zero RF content. Hence, voltage samples collected on $\phi_1$ have twice the gain with respect to the output than the voltage samples collected on $\phi_2$, creating, in effect, an unbalanced mixing function m(t). This imbalance may result in nonzero conversion gain for inputs near DC, and even for harmonics of $f_{12}$.

Figure 25B:
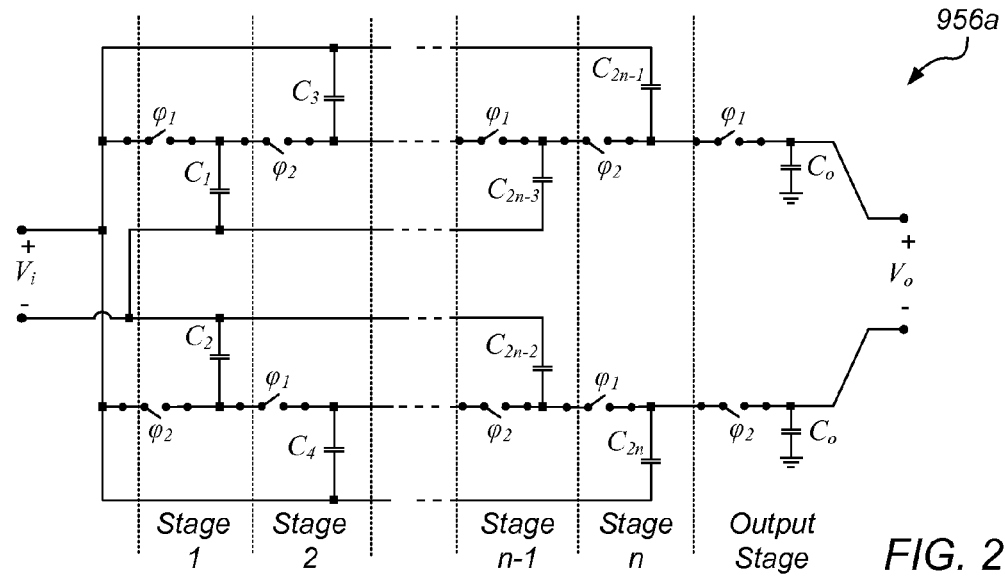
FIG. 25b shows the circuit diagram of one embodiment of a fully differential n-stage zigzag PFTWG with DC balanced m(t) when n is an even number.
Figure 25C:
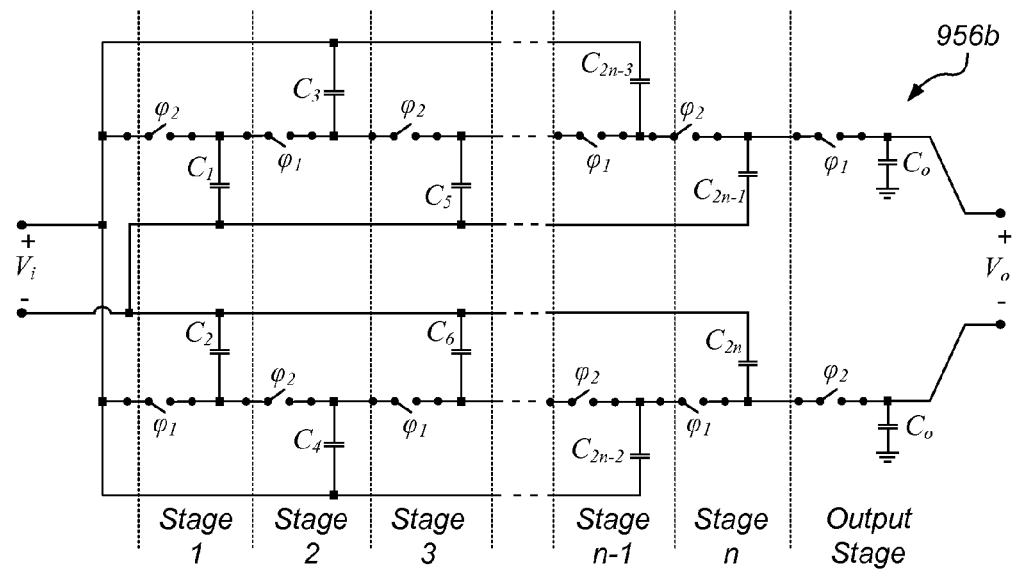
FIG. 25c shows the circuit diagram of one embodiment of a fully differential n-stage zigzag PFTWG with DC balanced m(t) when n is an odd number.
Figure 25A:
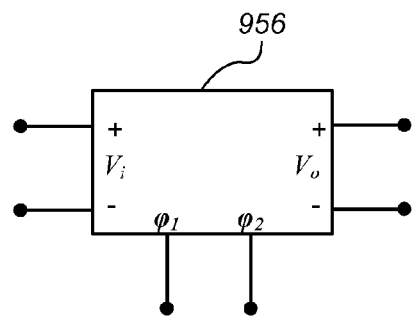
FIG. 25a shows the circuit symbol of one embodiment of a fully differential n-stage zigzag PFTWG with DC balanced m(t)
Figure 25D:
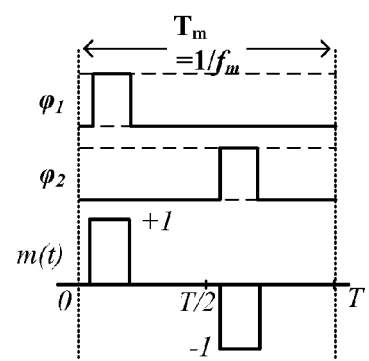
FIG. 25d shows examples of the sampling waveforms and an approximated version of the waveform of the effective resultant mixing function associated with the n-stage zigzag PFTWGs from FIGS. 25a-25c.
Figure 26A:
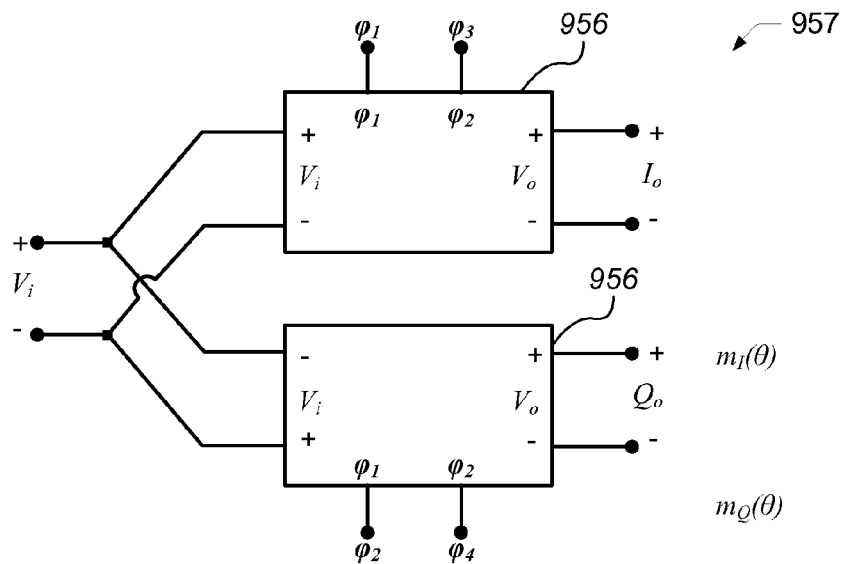
FIG. 26a shows a block diagram of one embodiment of a quasi-symmetric implementation using the circuit from FIG. 25a, with complex (I&Q) baseband outputs.
Figure 26B:
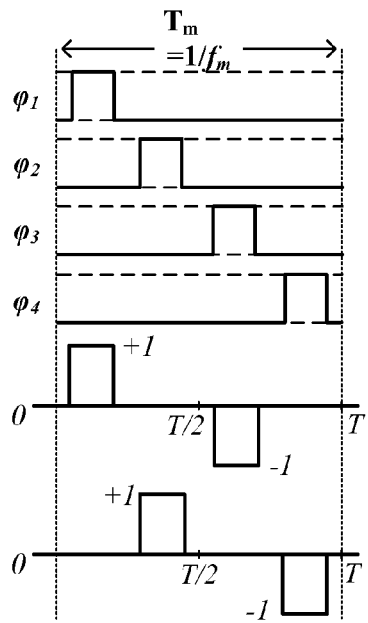

Circuit 954 may be modified in order to create a balanced function m(t), as illustrated by circuit 956 in FIGS. 25a-25c. Specifically, FIG. 25a shows the circuit symbol collectively referencing embodiments 956 of a fully differential n-stage zigzag PFTWG with balanced function m(t). FIG. 25b shows one embodiment 956a of circuit 956 when n is an even number, and FIG. 25c shows one embodiment 956a of circuit 956 when n is an odd number. Examples of the sampling waveforms and an approximated version of the waveform of the effective resultant mixing function associated with the n-stage zigzag PFTWGs for FIGS. 25a-25c are shown in FIG. 25d. Although circuit 956 is balanced dynamically with respect to $\phi_1$ and $\phi_2$, it is not symmetric statically with respect to the input terminals. This asymmetry is not an issue if the switches and capacitors had no parasitic capacitance. However, in most actual implementations, the parasitics associated with the switches and capacitors may result in circuit 956 presenting an unbalanced load to the RF input. Two instances of circuit 956 may be arranged to present a quasi-symmetric load to the input, if both circuits are driven from a single RF input in order to generate both, In-Phase and Quadrature (I&Q) baseband output signals, as shown in FIG. 26a. FIG. 26b shows examples of the sampling waveforms and approximated versions of the waveforms of the effective resultant mixing functions associated with the circuit from FIG. 26a.

Figure 27B:
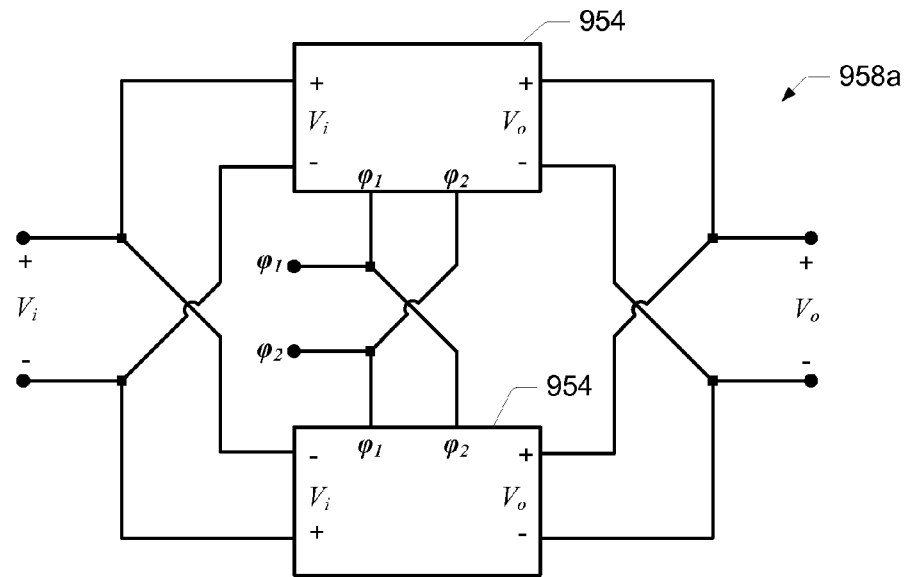
FIG. 27b shows the block diagram of one embodiment of a fully symmetric zigzag PFTWG with a parallel output connection.
Figure 27C:
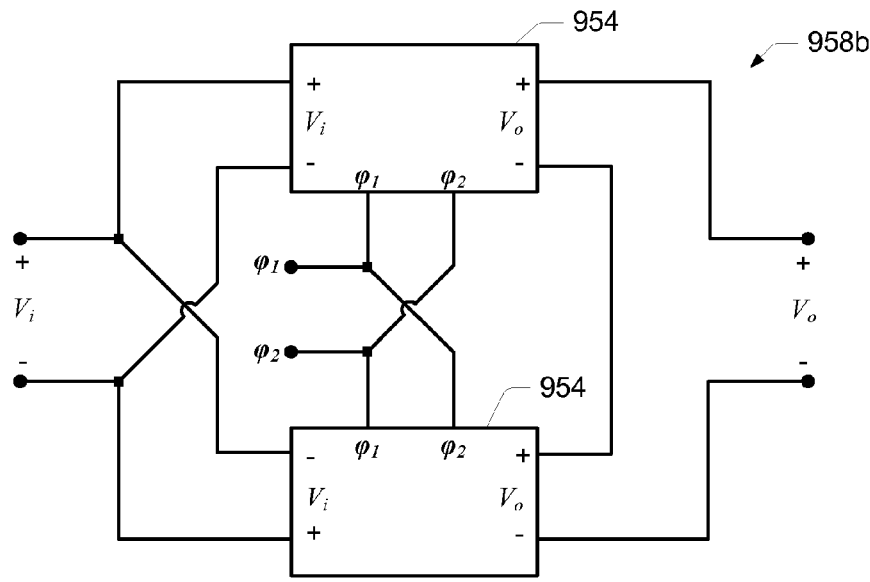
FIG. 27c shows the block diagram of one embodiment of a fully symmetric zigzag PFTWG with a series output connection.
Figure 27A:
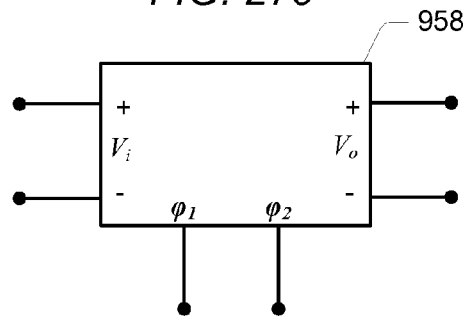
FIG. 27a shows the circuit symbol of one embodiment of a fully symmetric zigzag PFTWG.

Circuit 956 is symmetric in a dynamic sense, providing a balanced m(t), but may remain slightly asymmetric statically. A truly symmetric implementation may be obtained by constructing a circuit using two copies of circuit 954 with complementary LO drive. A circuit symbol for such a circuit 958 is shown in FIG. 27a. The two complementary-clocked copies of circuit 954 may have inputs connected in parallel, while the outputs may be connected in parallel or in series. With a parallel output connection (shown as circuit 958a in FIG. 27b), the maximum conversion gain of circuit 958 will be equivalent to the conversion gain of circuit 954. However, with a series output connection (shown as circuit 958b in FIG. 27c), the gain of circuit 958 may increase by a factor of two. Hence, with the assumption of incomplete settling, as previously discussed above, the conversion gain of circuit 958 for inputs near $f_m$ may be expressed as a function of the duty-cycle D, as shown in the following equation (24) for a parallel output connection:

$$G_c = (2n+1) \cdot \frac{\sin(\pi D)}{\pi D} \tag{24}$$

and in the following equation (25) for a series output connection:

$$G_c = (4n+2) \cdot \frac{\sin(\pi D)}{\pi D}. \tag{25}$$

Figure 28B:
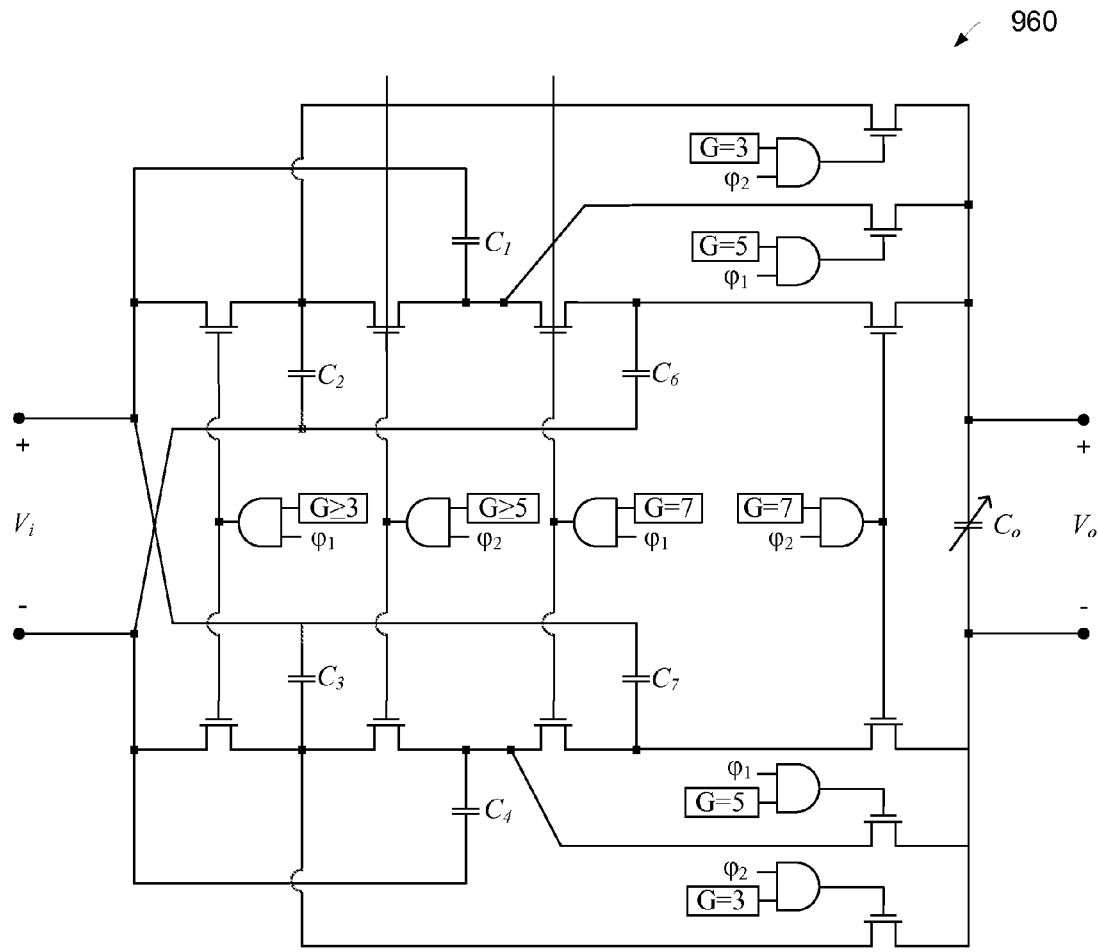
FIG. 28b shows the circuit diagram of one embodiment of a differential input/output zigzag PFTWG with programmable gain and distributed local oscillator drive.
Figure 28A:
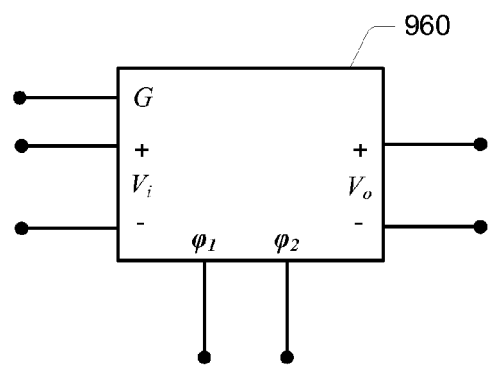
FIG. 28a shows the circuit symbol of one embodiment of a differential input/output zigzag PFTWG with programmable gain and distributed local oscillator drive.

Circuit 960 in FIG. 28b illustrates a 3-stage version of circuit 954 with programmable gain and distributed local oscillator (LO) drive (with the circuit symbol represented in FIG. 28a). The same techniques shown here may be applied to the fully symmetric circuit 958 or the quasi-symmetric circuit 956 to achieve programmable gain. Circuit 958 may provide maximum 0 Hz offset conversion gain values of 3, 5, and 7 V/V. The actual gain achieved in each setting may depend upon the duty cycle of the LO waveforms and other factors, as previously described above. The terminal labeled G in FIG. 28b (and FIG. 28a) may represent a digital input used to select the desired gain setting. The AND logic gates that appear in circuit 960 are used to decode the G input and enable the appropriate portions of circuit 960. Capacitor $C_o$ may be varied in accordance with the selected gain input G in order to equalize the bandwidth of circuit 960 with respect to gain settings, as also previously discussed.

Figure 29:
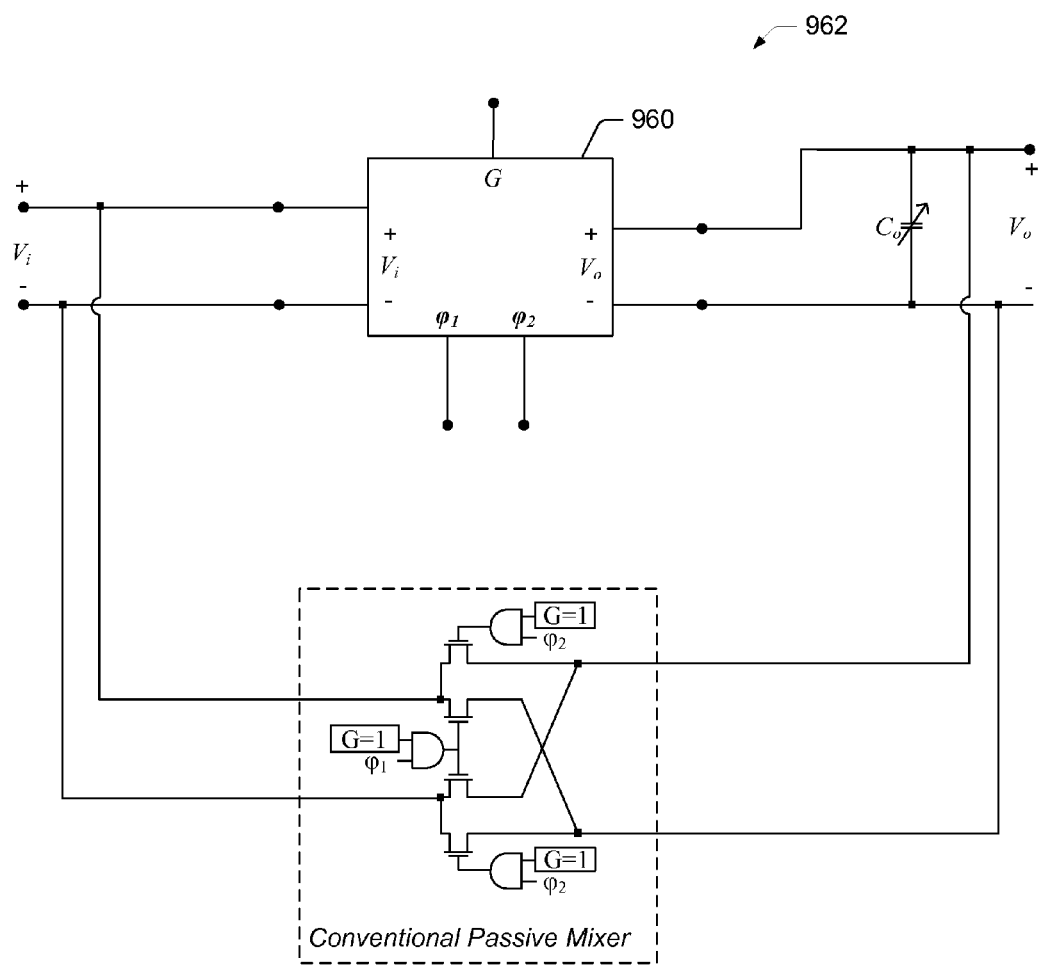
FIG. 29 shows the circuit diagram of one embodiment of the differential input/output zigzag PFTWG from FIG. 28b, with a conventional passive mixer added in parallel to extend the gain range down to 1V/V.

An additional set of switches may be incorporated to extend the range of programmable voltage gain down to 1 V/V, as illustrated by circuit 962 in FIG. 29. As shown in FIG. 29, circuit 960 may be expanded with a conventional passive mixer coupled in parallel to extend the gain range down to 1V/V. When G=1, circuit 960 may be effectively disabled, and the remaining circuitry is equivalent to a conventional differential passive mixer. For all G>1, the conventional differential mixer is disabled, and circuit 960 is enabled. It should also be noted at this point, that for more effective illustration of the operation of circuit 960 and 962, FIGS. 28b and 29 show NMOS transistors as switching elements, and AND gates used in implementing the logic selection/setting functionality for the gain. However, as also previously noted, the switching elements—and in this case the gain selection/setting functionality as well—may be implemented in a variety of different ways, all well within the scope of the embodiments disclosed herein. While such embodiments are not specifically shown, they are possible and are contemplated.

Figure 30A:
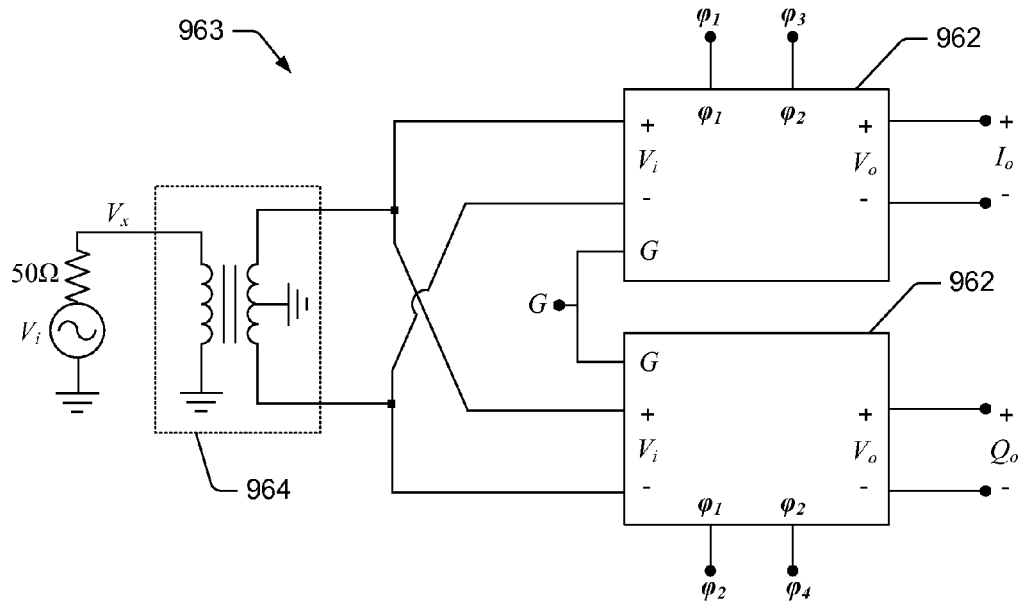
FIG. 30a shows the block/circuit diagram of one embodiment using the PFTWG-based circuit from FIG. 29 to obtain complex (I&Q) baseband outputs.
Figure 30B:
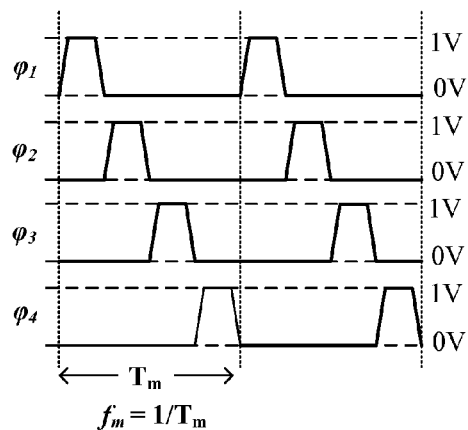
Figure 30C:
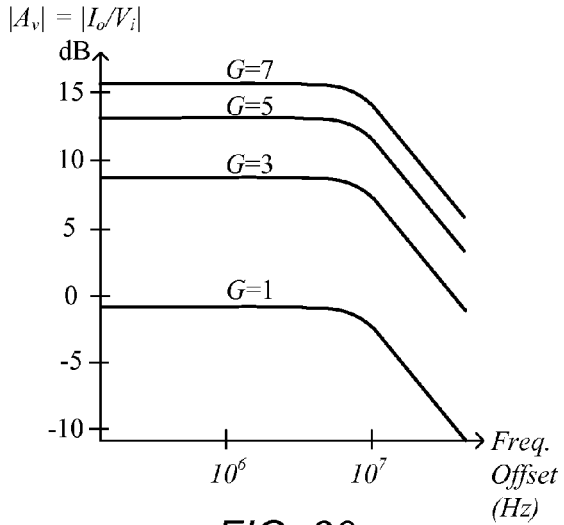
FIG. 30c shows voltage gain simulation results for the circuit from FIG. 30a using BSIM4 models of 65 nm NMOS transistors as switching elements.

FIG. 30a shows the circuit diagram of one embodiment of a circuit 963 using two instances of circuit 962 to obtain complex (I&Q) baseband outputs. In the embodiment shown, an ideal Balun transformer 964 is used to convert an unbalanced (single-ended) input signal voltage $V_x$ into a pair of differential inputs signals balanced about ground, which are then provided as input signals to the respective inputs of the instances of circuit 962. The plots in FIGS. 30b and 30c show BSIM4 simulation results for the baseband transfer function and circuit 963 across a variety of gain settings. Specifically, the waveforms in FIG. 30b show the sampling waveforms used for performing the simulations, while the waveforms in FIG. 30c show the voltage gain simulation results. In these simulations, the RF input to circuit 962 was a 50Ω port source and there were four non-overlapping sampling phases ($\phi_1$-$\phi_4$) used to generate the complex I/Q outputs. Capacitors $C_1$-$C_{10}$ were each 3 pF and the output capacitor $C_o$ had a variable, gain (G) dependent capacitance as annotated in the plotted results. $C_o$ was varied in accordance with the gain in order to equalize the circuit's bandwidth across gain settings. The LO frequency in these simulations was 2 GHz and the duty cycle was 0.2.

Figure 31D:
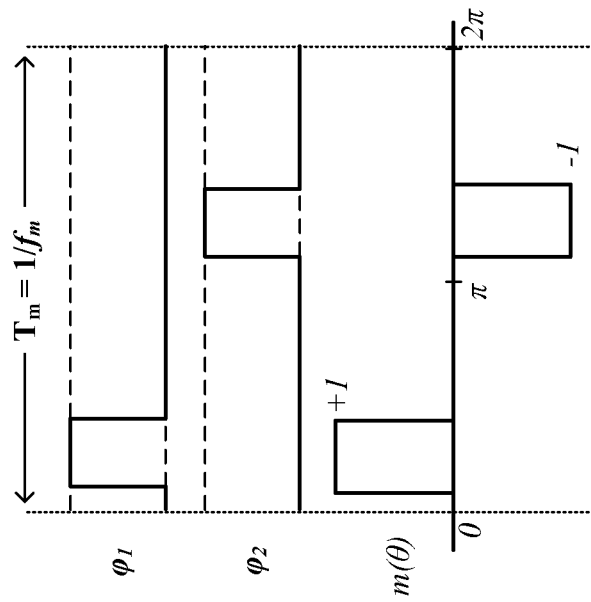
FIG. 31d shows examples of the sampling waveforms and an approximated version of the waveform of the effective resultant mixing function associated with the n PFTWG from FIGS. 31a-31c.
Figure 31A:
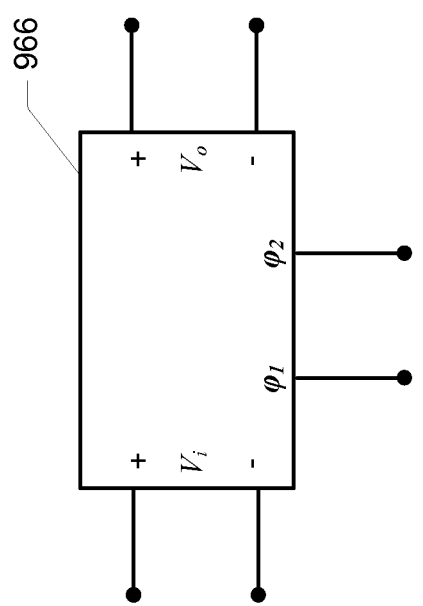
FIG. 31a shows the circuit symbol of one embodiment of an n-stage differential input/output high gain PFTWG.
Figure 31B:
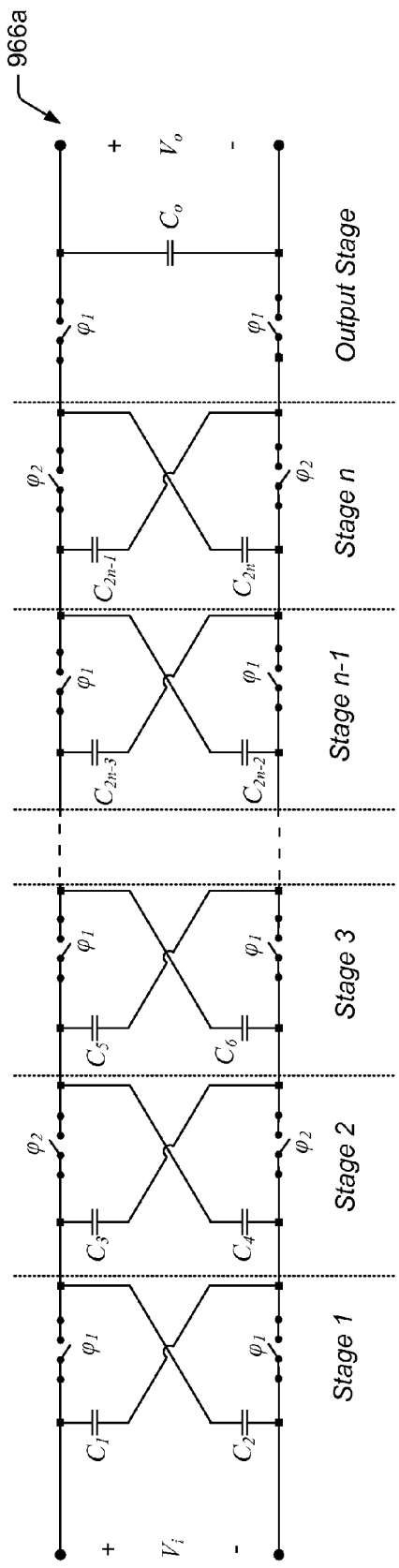
FIG. 31b shows the circuit diagram of one embodiment of an n-stage differential input/output high gain PFTWG when n is an even integer.
Figure 31C:
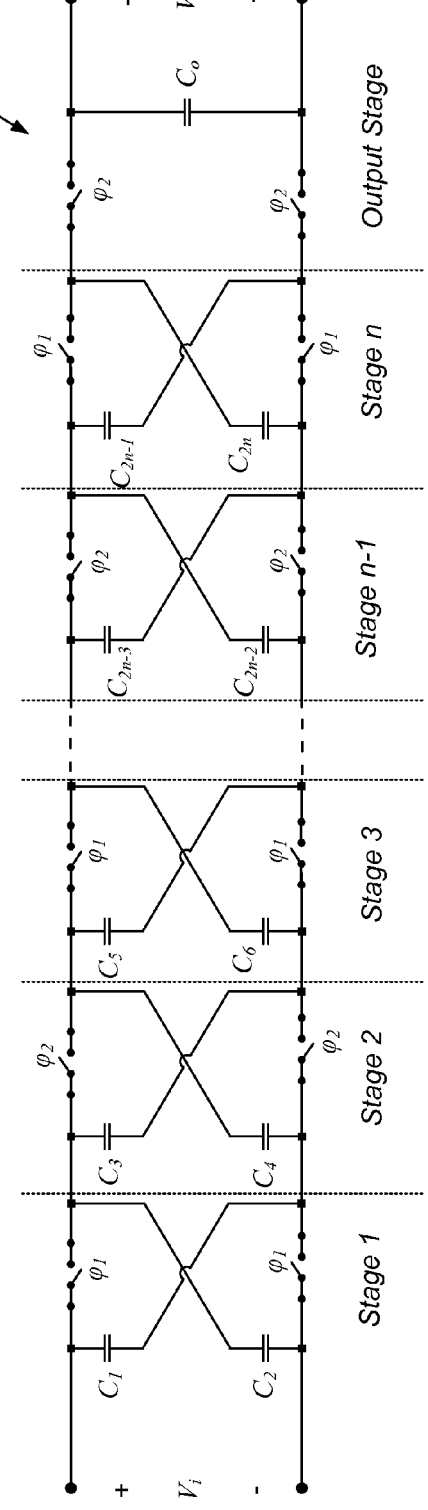
FIG. 31c shows the circuit diagram of one embodiment of an n-stage differential input/output high gain PFTWG when n is an odd integer.

In various implementations of circuits 954-960, the parasitic capacitance associated with the constituent switches and capacitors may affect circuit performance. The effect of these parasitics is analogous to those considered for circuits 1000 and 1050. The switch parasitics and bottom plates of capacitors $C_1$-$C_{2n}$ may effectively appear in parallel with the RF input, potentially reducing conversion gain and degrading noise performance. One effective way to substantially decrease this parasitic sensitivity is by incorporating the capacitance into a resonant LC network tuned to $f_m$ at the input to the mixer as also mentioned for the single-ended input zigzag mixer (circuit 950). Circuit 966 in FIGS. 31b-31c (with corresponding circuit symbol shown in FIG. 31a) represents other embodiments of an n-stage differential input/output high gain PFTWG with differential inputs and outputs. Specifically, FIG. 31b shows an embodiment 966a of circuit 966 in which n an even integer, and FIG. 31c shows an embodiment 966b of circuit 966 in which n is an odd integer. FIG. 31d shows examples of the sampling waveforms and an approximated version of the waveform of the effective resultant mixing function associated with circuit 966. Though the circuit topology is quite different from the previous example, circuit 966 may achieve the same maximum voltage gain per number of stages. Circuit 966, which generally represents either circuit 966a or 966b, comprises 2n+2 switches and 2n+1 capacitors, and is capable of achieving a voltage gain approaching 2n+1 for small values of (the duty-cycle) D. Similar to circuit 954, circuit 966 is not fully symmetric with respect to the two sampling phases $\phi_1$ and $\phi_2$, hence m(t) is not perfectly balanced.

Figure 32B:
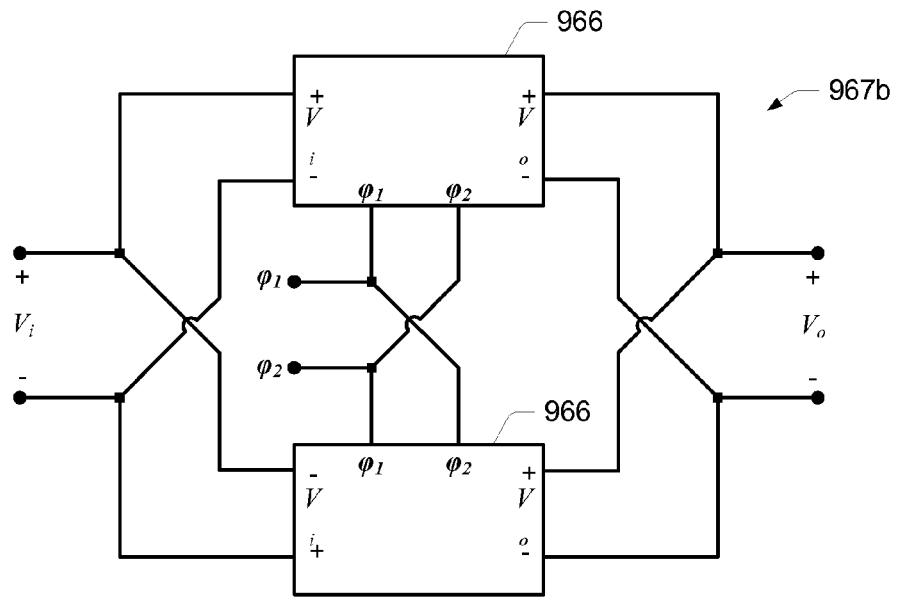
FIG. 32b shows the block diagram of one embodiment the circuit of FIG. 32a featuring a parallel output connection.
Figure 32C:
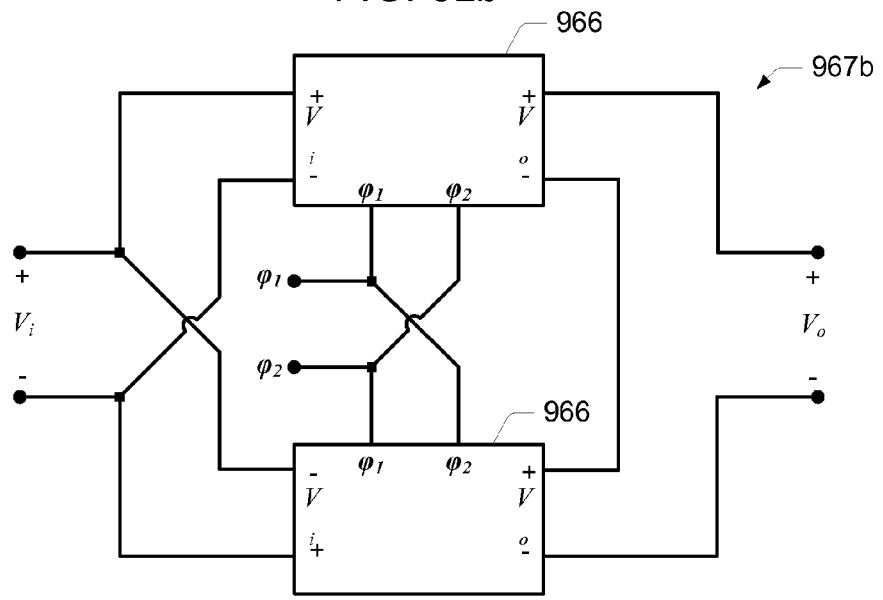
FIG. 32c shows the block diagram of one embodiment the circuit of FIG. 32a featuring a series output connection.
Figure 32A:
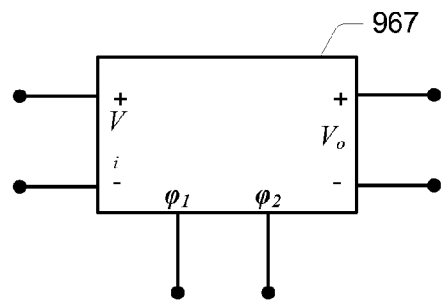
FIG. 32a shows the circuit symbol of one embodiment of a fully symmetric differential high gain PFTWG based on the circuit from FIGS. 31-31c.

In order to achieve a truly symmetric implementation, a circuit may be constructed using two instances of circuit 966, with complementary LO drives applied to the two instances of circuit 966. FIG. 32a shows the circuit symbol for a fully symmetric differential, high-gain PFTWG 967 based on two instances of circuit 966 (in which both circuits 966 in each case are identical to each other, both being either 966a or 996b). Specifically, FIG. 32b shows the block diagram of embodiments 967a featuring a parallel output connection, and FIG. 32c shows the block diagram of embodiments 967b featuring a series output connection. To form the symmetric circuit 967 (collectively referring to embodiments 967a and 967b), the two complementary-clocked copies of circuit 966 may have inputs connected in parallel, while the outputs may be connected in parallel or in series. With a parallel output connection (FIG. 32b), the conversion gain of circuit 967 may be equivalent to the conversion gain of circuit 966. However, with a series output connection (FIG. 32c), the gain of circuit 967 may increase by a factor of two. Hence, with the assumption of incomplete settling, as previously discussed, the conversion gain of circuit 967 may be approximated as a function of the duty-cycle in equation (24) for parallel output connection, and in equation (25) for series output connection. A programmable gain version of circuit 967 may be constructed in a manner similar to what was previously shown for circuit2 960 and 962. Also, as noted with respect to previous embodiments, the effects of the parasitic capacitance associated with the constituent switches and capacitors may be substantially decreased by incorporating the capacitance into a resonant LC network tuned to f, at the input to the mixer.

As also previously noted, the noise performance of various embodiments of PFTWGs disclosed herein may be enhanced by incorporating a bandpass filter tuned to $f_m$ and coupled to the input of the PFTWG, due to reduction of input noise folding from harmonics of $f_m$. It should be noted that any improvement sought by coupling a bandpass filter to the input of the PFTWG as mentioned above may greatly depend on the loss of the bandpass filter used. In addition, the bandpass filter may incorporate passive voltage gain, which may boost the impedance of the input source and permit a reduction in the size of the switches and capacitors of the PFTWG while still achieving the desired noise reduction. Finally, achieving substantial voltage gain while using a passive frequency translator facilitates the use of more unconventional low-power RF receiver front-ends, e.g. RF receiver front ends that do not feature a low-noise amplifier (LNA—for example, alternate embodiments to the RF front-end shown in FIG. 3 may not have a need for LNA 206), since a PFTWG may provide the same functionality as a conventional design while dissipating less power.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A passive frequency translator with positive conversion voltage gain, comprising:
   at least one input node for receiving an input signal and at least one output node for providing an output signal;
   a network coupled to said at least one input node and to said at least one output node, wherein said network comprises a plurality of capacitors and a plurality of switches operatively coupled to said plurality of capacitors;
   wherein said plurality of switches are controlled by a corresponding plurality of clock signals to capture charge of said input signal onto said plurality of capacitors and to develop said output signal by performing frequency translation of said input signal by a mixing frequency;
   wherein said output signal has a net voltage gain relative to said input signal in which energy of said output signal is predominantly derived from energy of said input signal; and
   wherein each of at least three of said plurality of capacitors are configured to capture charge from said input signal and to add constructively to deliver charge to at least one other capacitor coupled to said output node.

2. The passive frequency translator of claim 1, wherein said plurality of switches are controlled by a corresponding plurality of clock signals in such a manner that DC energy of said input signal is substantially blocked from said output signal.

3. The passive frequency translator of claim 1, wherein said plurality of clock signals control said plurality of switches to store voltage samples of said input signal on said plurality of capacitors, and to develop said output signal by combining respective ones of said stored voltage samples on said plurality of capacitors.

4. The passive frequency translator of claim 1, wherein said plurality of clock signals control said plurality of switches to store voltage samples of said input signal on said plurality of capacitors, and to develop said output signal by transferring respective ones of said stored voltage samples on said plurality of capacitors.

5. The passive frequency translator of claim 1, wherein a settling time constant associated with capturing charge from said input signal onto said plurality of capacitors is sufficiently large with respect to a reciprocal of said mixing frequency so that settling of voltage samples of said input signal are incomplete.

6. The passive frequency translator of claim 1, further comprising a gain control circuit coupled to said network and receiving a gain control signal, wherein said gain control circuit adjusts a level of said net voltage gain based on said gain control signal.

7. The passive frequency translator of claim 1, wherein said plurality of switches are controlled to perform frequency translation which comprises sub sampling by an effective mixing frequency determined by at least one harmonic of said mixing frequency.

8. A method of performing passive frequency translation, comprising:
receiving an input signal;
providing a plurality of switches operatively coupled to a plurality of capacitors;
controlling the plurality of switches by a corresponding plurality of clock signals to capture charge of the input signal onto the plurality of capacitors and to develop the output signal with a net voltage gain relative to the input signal including performing frequency translation of the input signal by a mixing frequency; and
wherein said controlling the plurality of switches includes capturing charge from the input signal onto each of at least three of the plurality of capacitors in which charge on each of the at least three of the plurality of capacitors add constructively to deliver charge to at least one other capacitor coupled to the output node.

9. The method of claim 8, wherein said controlling the plurality of switches by a corresponding plurality of clock signals to capture charge of the input signal onto the plurality of capacitors and to develop the output signal includes substantially blocking DC energy of the input signal from the output signal.

10. The method of claim 8, wherein said providing a plurality of capacitors and said controlling the plurality of switches comprises providing a settling time constant associated with capturing charge from said input signal onto said plurality of capacitors which is sufficiently large with respect to a reciprocal of the mixing frequency so that settling of voltage samples of the input signal are incomplete.

11. The method of claim 8, wherein said performing frequency translation of the input signal by a mixing frequency comprises sub sampling by an effective mixing frequency determined by at least one harmonic of the mixing frequency.

12. The method of claim 8, wherein:
said receiving an input signal comprises receiving an input signal having a first frequency; and
wherein said controlling the plurality of switches comprises:
receiving a plurality of non-overlapping switching signals each having a predetermined duty cycle a respective frequency related to a predetermined base frequency; and
using the non-overlapping switching signals to control at least one switch to periodically charge at least two capacitors via the input signal, combine a respective charge held by each of the at least two capacitors with respective charges held by other ones of the at least two capacitors, and combine respective charges held by at least two of the at least two capacitors to construct the output signal having a second frequency.

13. The method of claim 12, further comprising:
generating at least one local oscillator signal having the base frequency; and
generating the plurality of non-overlapping switching signals from the at least one local oscillator signal.

14. The method of claim 13, wherein the second frequency is determined by the base frequency and harmonics of the first frequency.

15. A method of downconverting an input signal having a first frequency to an output signal having a lower second frequency, the method comprising:
periodically charging a plurality of capacitors with respective charges derived from the input signal;
periodically updating the respective charge held by each of the plurality of capacitors by combining with the respective charge held by at least one other one of the plurality of capacitors;
periodically combining the updated charges held by one or more of the plurality of capacitors to provide an output signal having a net voltage gain relative to the input signal and having an energy which is derived predominantly from energy of the input signal;
wherein said periodically combining includes capturing charge from the input signal onto at each of least three of the plurality of capacitors in which charge on each of the at least three of the plurality of capacitors add constructively to deliver charge to at least one other capacitor coupled to the output node; and
wherein said periodically charging, updating and combining comprises performing frequency translation of the input signal by a mixing frequency.

16. The method of claim 15, wherein said periodically charging, said periodically updating, and said periodically combining are collectively performed according to an effective third frequency in which the second frequency is determined by the effective third frequency and the first frequency and wherein the effective third frequency is determined by a harmonic of the mixing frequency.

17. The method of claim 15, wherein said periodically charging a plurality of capacitors with respective charges derived from the input signal comprises periodically coupling the input signal to the plurality of capacitors.

18. The method of claim 17, wherein said periodically coupling the input signal to the plurality of capacitors comprises periodically activating a plurality of switches with a corresponding plurality of switching signals.

19. The method of claim 18, wherein said periodically activating a plurality of switches with a corresponding plurality of switching signals comprises periodically activating a plurality of switches with a plurality of non-overlapping clock signals.

20. The method of claim 19, further comprising determining the second frequency using respective frequencies of the non-overlapping clock signals and the first frequency.

21. The method of claim 15, wherein said periodically combining the updated charges at least one of:
periodically combining the updated charges held by one or more of the plurality of capacitors coupled in series; and
periodically combining the updated charges held by one or more of the plurality of capacitors coupled in anti-series.

22. An electronic device, comprising:
a radio system, comprising:
an input circuit configured to receive a radio signal and to convert said radio signal into an input signal;
a passive frequency translator with positive conversion voltage gain, comprising:
at least one input node for receiving said input signal and at least one output node for providing an output signal;
a network coupled to said at least one input node and to said at least one output node, wherein said network comprises a plurality of capacitors and a plurality of switches operatively coupled to said plurality of capacitors;

wherein said plurality of switches are controlled by a corresponding plurality of clock signals to capture charge of said input signal onto said plurality of capacitors and to develop said output signal by performing frequency translation of said input signal by a mixing frequency;

wherein said output signal has a net voltage gain relative to said input signal in which energy of said output signal is predominantly derived from energy of said input signal; and wherein each of at least three of said plurality of capacitors are configured to capture charge from said input signal and to add constructively to deliver charge to at least one other capacitor coupled to said output node; and an output circuit for converting said output signal into a data signal; and a host system coupled to said radio system for receiving and processing said data signal.

23. The electronic device of claim 22, wherein said input circuit comprises only passive components.

24. The electronic device of claim 23, wherein said passive components include a resonant circuit.

25. The electronic device of claim 24, wherein said output circuit comprises an analog to digital converter, a digital physical device, and a link layer processing module.

26. The electronic device of claim 22, wherein said radio system is a portion of a transceiver system comprising a transmitter, and wherein said host system is configured to transmit data via said transmitter.

27. The electronic device of claim 22, wherein said host system comprises a host interface, a memory, and a processor.

28. The electronic device of claim 22, wherein said radio system is incorporated within an integrated circuit.

29. The electronic device of claim 22, wherein energy of said output signal is substantially composed of energy received from said radio signal.

* * * * *